US006993314B2

(12) United States Patent
Lim et al.

(10) Patent No.: US 6,993,314 B2
(45) Date of Patent: Jan. 31, 2006

(54) APPARATUS FOR GENERATING MULTIPLE RADIO FREQUENCIES IN COMMUNICATION CIRCUITRY AND ASSOCIATED METHODS

(75) Inventors: Lysander Lim, Austin, TX (US); Caiyi Wang, Austin, TX (US); David R. Welland, Austin, TX (US); Donald A. Kerth, Austin, TX (US); Richard T. Behrens, Lafayette, CO (US); Jeffrey W. Scott, Austin, TX (US); G. Diwakar Vishakhadatta, Austin, TX (US); G. Tyson Tuttle, Austin, TX (US); Vishnu S. Srinivasan, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 528 days.

(21) Appl. No.: 10/074,591

(22) Filed: Feb. 13, 2002

(65) Prior Publication Data

US 2002/0193084 A1 Dec. 19, 2002

Related U.S. Application Data

(63) Continuation-in-part of application No. 10/075,122, filed on Feb. 12, 2002, and a continuation-in-part of application No. 10/075,099, filed on Feb. 12, 2002, and a continuation-in-part of application No. 10/074,676, filed on Feb. 12, 2002, and a continuation-in-part of application No. 09/821,342, filed on Mar. 29, 2001, now Pat. No. 6,804,497, and a continuation-in-part of application No. 09/708,339, filed on Nov. 8, 2000, now Pat. No. 6,741,846, which is a continuation of application No. 09/087,017, filed on May 29, 1998, now Pat. No. 6,167,245.

(60) Provisional application No. 60/339,819, filed on Dec. 13, 2001, provisional application No. 60/333,940, filed on Nov. 28, 2001, provisional application No. 60/273,119, filed on Mar. 2, 2001, provisional application No. 60/261,506, filed on Jan. 12, 2001.

(51) Int. Cl.
*H04N 1/28* (2006.01)

(52) U.S. Cl. .................. 455/333; 455/260; 455/552.1; 327/156

(58) Field of Classification Search ............... 455/260, 455/183.1, 183.2, 552.1, 553.1, 86, 88, 333; 327/156–159
See application file for complete search history.

(56) References Cited

U.S. PATENT DOCUMENTS 3,538,450 A 11/1970 Andrea et al.

(Continued)

FOREIGN PATENT DOCUMENTS

EP 0643477 A2 3/1995

(Continued)

OTHER PUBLICATIONS

Stephen Jantzi et al., "Quadrature Bandpass ΔΣ Modulation for Digital Radio," IEEE Journal of Solid-State Circuits, vol. 32, No. 12, Dec. 1997, pp. 1935-1950.

(Continued)

*Primary Examiner*—Sonny Trinh
*Assistant Examiner*—Un C Cho
(74) *Attorney, Agent, or Firm*—O'Keefe, Egan & Peterman, LLP

(57) ABSTRACT

A radio-frequency (RF) apparatus capable of transmitting RF signals includes transmitter path circuitry. The transmitter path circuitry includes a voltage-controlled oscillator (VCO) circuitry. The VCO circuitry generates a first signal that has a first frequency. A divider circuitry couples to the VCO circuitry and, in response to the first signal, the divider circuitry generates a second signal that has a second frequency. The frequency of the second signal equals the frequency of the first signal divided by a number.

14 Claims, 39 Drawing Sheets

U.S. PATENT DOCUMENTS

| | | |
|---|---|---|
| 3,571,743 A | 3/1971 | Menkas |
| 3,899,746 A | 8/1975 | Gammel |
| 3,983,485 A | 9/1976 | Stuart |
| 4,009,448 A | 2/1977 | Hopwood et al. |
| 4,057,760 A | 11/1977 | Koch |
| 4,070,632 A | 1/1978 | Tuttle |
| 4,099,137 A | 7/1978 | Alm, Jr. et al. |
| 4,179,670 A | 12/1979 | Kingsbury |
| 4,204,174 A | 5/1980 | King |
| 4,205,272 A | 5/1980 | Kumagai |
| 4,236,252 A | 11/1980 | Kominami et al. |
| 4,255,714 A | 3/1981 | Rosen |
| 4,468,790 A | 8/1984 | Hofelt |
| 4,484,153 A | 11/1984 | Borras et al. |
| 4,562,591 A | 12/1985 | Stikvoort |
| 4,584,659 A | 4/1986 | Stikvoort |
| 4,602,220 A | 7/1986 | Kurihara |
| 4,604,720 A | 8/1986 | Stikvoort |
| 4,623,926 A | 11/1986 | Sakamoto |
| 4,627,021 A | 12/1986 | Persoon et al. |
| 4,680,588 A | 7/1987 | Cantwell |
| 4,686,488 A | 8/1987 | Attenborough |
| 4,692,737 A | 9/1987 | Stikvoort et al. |
| 4,713,563 A | 12/1987 | Marshall et al. |
| 4,713,631 A | 12/1987 | Enderby et al. |
| 4,758,802 A | 7/1988 | Jackson |
| 4,797,845 A | 1/1989 | Stikvoort |
| 4,805,198 A | 2/1989 | Stern et al. |
| 4,857,928 A | 8/1989 | Gailus et al. |
| 4,888,560 A | 12/1989 | Ogura |
| 4,888,564 A | 12/1989 | Ishigaki |
| 4,893,087 A | 1/1990 | Davis |
| 4,905,306 A | 2/1990 | Anderson |
| 4,912,729 A | 3/1990 | Van Rens et al. |
| 4,926,140 A | 5/1990 | Schenberg |
| 4,926,144 A | 5/1990 | Bell |
| 4,980,653 A | 12/1990 | Shepherd |
| 4,989,074 A | 1/1991 | Matsumoto |
| 4,998,077 A | 3/1991 | Nanni et al. |
| 5,006,819 A | 4/1991 | Buchan et al. |
| 5,034,703 A | 7/1991 | Schumacher |
| 5,036,295 A | 7/1991 | Kamitani |
| 5,038,117 A | 8/1991 | Miller |
| 5,050,192 A | 9/1991 | Nawata |
| 5,055,802 A | 10/1991 | Hietala et al. |
| 5,079,521 A | 1/1992 | Gaskell et al. |
| 5,083,304 A | 1/1992 | Cahill |
| 5,117,206 A | 5/1992 | Imamura |
| 5,124,705 A | 6/1992 | Voorman |
| 5,142,695 A | 8/1992 | Roberts et al. |
| 5,157,343 A | 10/1992 | Voorman |
| 5,157,358 A | 10/1992 | Benson |
| 5,175,884 A | 12/1992 | Suarez |
| 5,194,826 A | 3/1993 | Huusko |
| 5,224,132 A | 6/1993 | Goldberg |
| 5,235,410 A | 8/1993 | Hurley |
| 5,241,310 A | 8/1993 | Tiemann |
| 5,243,345 A | 9/1993 | Naus et al. |
| 5,258,720 A | 11/1993 | Tanis et al. |
| 5,258,724 A | 11/1993 | Tanis et al. |
| 5,267,272 A | 11/1993 | Cai et al. |
| 5,281,927 A | 1/1994 | Parker |
| 5,283,578 A | 2/1994 | Ribner et al. |
| 5,315,269 A | 5/1994 | Fujii |
| 5,341,135 A | 8/1994 | Pearce |
| 5,345,406 A | 9/1994 | Williams |
| 5,351,014 A | 9/1994 | Ichiyoshi |
| 5,369,376 A | 11/1994 | Leblebicioglu |
| 5,379,003 A | 1/1995 | Bizen |
| 5,418,497 A | 5/1995 | Martin |
| 5,430,890 A | 7/1995 | Vogt et al. |
| 5,442,353 A | 8/1995 | Jackson |
| 5,446,767 A | 8/1995 | Nakagawa et al. |
| 5,451,948 A | 9/1995 | Jekel |
| 5,469,475 A | 11/1995 | Voorman |
| 5,495,205 A | 2/1996 | Parker et al. |
| 5,500,645 A | 3/1996 | Ribner et al. |
| 5,517,534 A | 5/1996 | Knierim |
| 5,534,825 A | 7/1996 | Goma et al. |
| 5,539,359 A | 7/1996 | Goma |
| 5,557,642 A | 9/1996 | Williams |
| 5,561,398 A | 10/1996 | Rasmussen |
| 5,576,667 A | 11/1996 | Goma |
| 5,581,584 A | 12/1996 | Inoue et al. |
| 5,619,148 A | 4/1997 | Guo |
| 5,625,325 A | 4/1997 | Rotzoll et al. |
| 5,644,270 A | 7/1997 | Moyer et al. |
| 5,648,744 A | 7/1997 | Prakash et al. |
| 5,661,269 A | 8/1997 | Fukuzaki et al. |
| 5,686,864 A | 11/1997 | Martin et al. |
| 5,691,669 A | 11/1997 | Tsai et al. |
| 5,698,469 A | 12/1997 | Mohwinkel et al. |
| 5,705,955 A | 1/1998 | Freeburg et al. |
| 5,712,628 A | 1/1998 | Phillips et al. |
| 5,739,730 A | 4/1998 | Rotzoll |
| 5,740,524 A | 4/1998 | Pace et al. |
| 5,742,189 A | 4/1998 | Yoshida et al. |
| 5,748,043 A | 5/1998 | Koslov |
| 5,758,276 A | 5/1998 | Shirakawa et al. |
| 5,764,171 A | 6/1998 | Stikvoort |
| 5,808,531 A | 9/1998 | Nakano |
| 5,828,955 A | 10/1998 | Lipowski et al. |
| 5,831,482 A | 11/1998 | Salvi et al. |
| 5,844,868 A | 12/1998 | Takahashi et al. |
| 5,852,384 A | 12/1998 | Sakakura et al. |
| 5,856,763 A | 1/1999 | Reeser et al. |
| 5,859,878 A | 1/1999 | Phillips et al. |
| 5,862,465 A | 1/1999 | Ou |
| 5,867,069 A | 2/1999 | Kiser |
| 5,898,345 A | 4/1999 | Namura et al. |
| 5,900,785 A * | 5/1999 | Freed ......................... 331/10 |
| 5,909,150 A | 6/1999 | Kostelnik et al. |
| 5,936,474 A | 8/1999 | Rousselin |
| 5,949,291 A | 9/1999 | Newland |
| 5,953,641 A * | 9/1999 | Auvray ....................... 455/74 |
| 5,963,100 A | 10/1999 | Tolson et al. |
| 5,966,666 A * | 10/1999 | Yamaguchi et al. ...... 455/552.1 |
| 5,973,601 A | 10/1999 | Campana |
| 6,002,925 A | 12/1999 | Vu et al. |
| 6,016,332 A | 1/2000 | Smith et al. |
| 6,208,488 B1 | 2/2000 | Landman et al. |
| 6,035,186 A | 3/2000 | Moore et al. |
| 6,075,979 A | 6/2000 | Holtvoeth et al. |
| 6,130,577 A | 10/2000 | Tamba et al. |
| 6,137,372 A | 10/2000 | Welland |
| 6,147,567 A | 11/2000 | Welland et al. |
| 6,148,048 A | 11/2000 | Kerth et al. |
| 6,150,890 A * | 11/2000 | Damgaard et al. ............ 331/14 |
| 6,150,891 A | 11/2000 | Welland et al. |
| 6,167,245 A | 12/2000 | Welland |
| 6,175,746 B1 * | 1/2001 | Nakayama et al. ....... 455/552.1 |
| 6,208,875 B1 * | 3/2001 | Damgaard et al. ........ 455/552.1 |
| 6,215,988 B1 * | 4/2001 | Matero .................... 455/188.1 |
| 6,226,506 B1 | 5/2001 | Welland et al. |
| 6,233,441 B1 | 5/2001 | Welland |
| 6,304,146 B1 | 10/2001 | Welland |
| 6,308,055 B1 | 10/2001 | Welland et al. |
| 6,311,050 B1 | 10/2001 | Welland et al. |
| 6,317,006 B1 | 11/2001 | Welland et al. |
| 6,323,735 B1 | 11/2001 | Welland et al. |
| 6,327,463 B1 | 12/2001 | Welland |
| 6,343,207 B1 | 1/2002 | Hessel et al. |
| 6,388,536 B1 | 5/2002 | Welland |
| 6,539,066 B1 | 3/2003 | Heinen |

2002/0008593 A1 1/2002 Gomez et al.

FOREIGN PATENT DOCUMENTS

| GB | 2233518 A | 1/1991 |
|---|---|---|
| JP | 359127408 A | 7/1984 |
| JP | 402298107 A | 12/1990 |
| JP | 403070202 A | 3/1991 |
| JP | 403258103 A | 11/1991 |
| JP | 04035302 A | 2/1992 |
| WO | WO99/22456 | 5/1999 |
| WO | WO00/01074 | 1/2000 |
| WO | WO00/11794 | 3/2000 |
| WO | WO00/22735 | 4/2000 |

OTHER PUBLICATIONS

Stephen Jantzi et al, "A Complex Bandpass ΔΣ Converter For Digital Radio," ISCAS, May/Jun. 1994, pp. 453-456.

"Analog Device Delivers World's First Open Market GSM Direct Conversion Radio Chipset," Analog Devices Corporate Information Press Release, http:/contentanalog.com/pressrelease/prdisplay/0,1622,102,00.html, Sep. 13, 1999, pp. 1-4.

Data Sheet, CX74017, "RF Transceiver for Single, Dual, or Tri-Band GSM/GPRS Applications," Conexant, Jan. 2, 2001, pp. 1-16.

Jacques C. Rudell et al, "A 1.9-GHz Wide-Band IF Double Conversion CMOS Receiver for Cordless Telephone Applications," IEEE Journal of Solid-State Circuits, vol. 32, No. 12, Dec. 1997, pp. 2071-2088.

Jan Crols et al., "Low-IF Topologies for High-Performance Analog Front Ends of Fully Integrated Receivers," IEEE Transactions on Circuits and Systems-II: Analog and Digital Signal Processing, vol. 45, No. 3, Mar. 1998, pp. 269-282.

Jacques C. Rudell et al., "Recent Developments In High Integration Multi-Standard CMOS Transceiver for Personal Communication Systems," invited paper at the 1998 International Symposium on Low Power Electronics, Monterey, California, 6 pgs.

Asad Abidi, "CMOS Wireless Transceivers: The New Wave," IEEE Communications Magazine, Aug. 1999, pp. 119-124.

Data Sheet, UAA3535HL, "Low Power GSM/DCS/PCS Multi-band Transceiver," Philips Semiconductors, Feb. 17, 2000, pp. 1-24.

Stephen Jantzi et al., "FP 13.5: A Quadrature Bandpass ΔΣ Modulator for Digital Radio," Digest of Technical Papers, 1997 IEEE International Solid-State Circuits Conference, First Edition, Feb. 1997, pp. 216-217, 460.

S. A. Jantzi et al., "The Effects of Mismatch In Complex Bandpass ΔΣ Modulators," IEEE, 1996, pp. 227-230.

Qiuting Huang, "CMOS RF Design-The Low Power Dimension," IEEE 2000 Custom Integrated Circuits Conference, pp. 161-166.

Paolo Orsatti et al., "A 20-mA-Receive, 55-mA-Transmit, Single-Chip GSM Transceiver in 0.25-$\mu$m CMOS," IEEE Journal of Solid-State Circuits, vol. 34, No. 12, Dec. 1999, pp. 1869-1880.

Qiuting Huang et al., "The Impact of Scaling Down to Deep Submicron on CMOS RF Circuits," IEEE Journal of Solid-State Circuits, vol. 33, No. 7, Jul. 1998, pp. 1023-1036.

Behzad Razavi, "Design Considerations for Direct-Conversion Receivers," IEEE Transactions on Circuits and Systems-II: Analog and Digital Signal Processing, vol. 44, No. 6, Jun. 1997, pp. 428-435.

Farbod Behbahani et al., "CMOS Mixers and Polyphase Filters for Large Image Rejection," IEEE Journal of Solid-State Circuits, vol. 36, No. 6, Jun. 2001, pp. 873-887.

Jan Crols et al., "A Single-Chip 900 MHz CMOS Receiver Front-End With A High Performance Low-IF Topolgy," IEEE Journal of Solid-State Circuits, vol. 30, No. 12, Dec. 1995, pp. 1483-1492.

Analog Devices, Single-Chip Direct-Conversion GSM/GPRS/EDGE RFIC, Othello One, www.analog.com, 2 pgs.

Analog Devices, AD6523/AD6524, GSM Direct Conversion Radio Chip Set, www.analog.com, 2 pgs.

Analog, Devices, GSM 3 V Transceiver IF Subsystem, AD6432, www.analog.com, pp. 1-20.

Hitachi, "RF Transceiver IC For GSM And PCN Dual Band Cellular Systems," HD155121F, ADE-207-265(Z), $1^{st}$ Edition, Nov. 1998, pp. 1-56.

Analog Devices, AD7002 Specification, LC2MOS, GSM Baseband I/O Port, Rev. B, 1997, pp. 1-16.

Analog Devices, AD20msp415, GSM/DCS1800/PCS1900, Baseband Processing Chipset, Rev. O, 1997. pp. 1-7.

Kwentus et al., "A Single-Chip Universal Digital Satellite Receiver With 480-MHz IF Input," IEEE Journal of Solid-State Circuits, vol. 34, No. 11, Nov. 1999, pp. 1634-1646.

Minnis et al., "A Low-If Polyphase Receiver For GSM Using Log-Domain Signal Processing," IEEE Radio Frequency Integrated Circuits Symposium, 2000, pp. 83-86.

Atkinson et al., "A Novel Approach To Direct Conversion RF Receivers For TDMA Applications," Analog Devices, 1999, pp. 1-5.

Crochiere et al.., "Optimum FIR Digital Filter Implementations For Decimation, Interpolation, And Narrow-Band Filtering," IEEE Transactions On Acoustics, Speech, And Signal Processing, vol. ASSP-23, No. 5, Oct. 1975, pp. 444-456.

Hogenauer, "An Economical Class Of Digital Filters For Decimation And Interpolation," IEEE, 1981, pp. 155-162.

Brandt et al., "A Low-Power, Area-Efficient Digital Filter For Decimation And Interpolation," IEEE Journal Of Solid-State Circuits, vol. 29, No. 6, Jun. 1994, pp. 679-687.

Philips Semiconductors, "uaa3535-Low-Power GSM GPRS Triple-Band Near-Zero IF Transceiver," Oct. 1999, 4 pgs.

D'Avella et al., "An Adaptive MLSE Receiver For TDMA Digital Mobile Radio," IEEE Journal On Selected Areas In Communications, vol. 7, No. 1, Jan. 1989, pp. 122-129

Razavi, "CMOS RF Receiver Design For Wireless LAN Applications," IEEE, 1999, pp. 275-280.

Lucent Technologies, "W3020 GSM Multiband RF Transceiver," Advance Data Sheet, Dec. 1999, pp. 1-44.

Lucent Technologies, "DSP1620 Digital Signal Processor," Data Sheet, Jun. 1998, pp. 1-178.

Steyaert et al., "A 2-V CMOS Cellular Transceiver Front-End," IEEE Journal of Solid-State Circuits, vol. 35, No. 12, Dec. 2000, pp. 1895-1907.

Paulus et al., "A CMOS IF Transceiver With Reduced Analog Complexity," IEEE Journal Of Solid-State Circuits, vol. 33, No. 12, Dec. 1998, pp. 2154-2159.

Analog Devices, "Analog Devices Delivers World's First Open Market GSM Direct Conversion Radio Chipset," Nov. 1999, 4 pgs.

"Digest Of Technical Papers," 1997 IEEE International Solid-State Circuits Conference, First Edition, Feb. 1997, 5 pgs.

RF Micro Devices, RF2968, Product Description, Blue Tooth Transceiver, Rev A19, pp. 11-199-11-222.

Texas Instruments, TRF6901, "Single Chip RF Transceiver," Mar. 2002, pp. 1-29.
Texas Instruments, TRF6900A, "Single Chip RF Transceiver," Sep. 2001, pp. 1-34.
Texas Instruments, TRF6900, Single Chip RF Transceiver, Oct. 1999, pp. 1-32.
Philips Semiconductor, "Bluetooth RF Transceiver," Data Sheet, UAA3558, Dec. 21, 2000, pp. 1-5.
Philips Semiconductor, "Image Reject 1 800 MHz Transceiver For DECT Applications," Data Sheet, UAA2067G, Oct. 22, 1996, pp. 1-24.
Philips Semiconductor, "Analog Cordless Telephone IC," Data Sheet, UAA2062, Aug. 10, 2000, pp. 1-40.
Philips Semiconductor, "900 MHz Analog Cordless Telephone IC," Data Sheet, UAA3515A, Dec 12, 2001, pp. 1-44.
Philips Semiconductor, "Low Voltage IF I/Q Transceiver," Data Sheet, SA 1638, Sep. 3, 1997, pp. 1-26.
Texas Instruments, "TCS2100 GPRS Chipset Solution," Product Bulletin, 2001, 4 pgs.
Fague, "Othello: A New Direct-Conversion Radio Chip Set Eliminates IF Stages," Analog Dialogue 33-10, 1999, pp. 1-3.
Analog Devices, AD6523/AD6524, "GSM Direct Conversion Radio Chip Set," 1999, 2 pgs.
Lucent Technologies, "Lucent CSP1089 GSM Conversion Signal Processor For Cellular Handset And Modem Applications," Product Brief, Feb. 2001, 2 pgs.
Lucent Technologies, "Lucent CSP1099 GSM Conversion Signal Processor For Cellular Handset And Modem Applications," Product Brief, Feb. 2001, 2 pgs.
Lucent Technologies, "Trident," Product Brief, Feb. 2001, 2 pgs.
Ericsson, "RF Transceiver Circuit For The Digital Enhanced Cordless Telecommunications (DECT) System," PBL40215, Jan. 2001, pp. 1-22.
Micro Linear, "ML2712 2.4GHz Transceiver," Datasheet, Aug. 2001, pp. 1-21.
Analog Devices, "GSM/GPRS/DCS1800.PCS1900 SoftFone Baseband Chipset," AD20msp430, 2000, 2 pgs.
RF Micro Devices, "Polaris Total Radio Solution," Press Release, 2002, 1 pg.
Tuttle, "Introduction To Wireless Receiver Design," Tutorial, 2002, pp. 2-58.
Rael et al., "Design Methodology Used In A Single-Chip CMOS 900 MHz Spread-Spectrum Wireless Transceiver," 35th Design Automation Conference, Jun. 1998, 6 pgs.
Troster et al., "An Interpolative Bandpass Converter On A 1.2-$\mu$m BiCMOS Analog/Digital Array," IEEE Journal of Solid-State Circuits, vol. 28, No. 4, Apr. 1993, pp. 471-477.
Schreier et al., "Decimation For Bandpass Sigma-Delta Analog-To-Digital Conversion," IEEE, 1990, pp. 1801-1804.
Shoaei et al., "Optimal (Bandpass) Continuous-Time $\Delta\Sigma$ Modulator," pp. 489-492.
Schreier et al., "Bandpass Sigma-Delta Modulation," Electronics Letters, vol. 25, No. 23, Nov. 9, 1989, pp. 1560-1561.
Jantzi et al., "Bandpass Sigma-Delta Analog-To-Digital Conversion," IEEE Transactions On Circuits And Systems, vol. 38, No. 11, Nov. 1991, pp. 1406-1409.
Crols et al., "An Analog Integrated Polyphase Filter For A High Performance Low-IF Receiver," Symposium On VLSI Circuits Digest Of Technical Papers, 1995, pp. 87-88.
Aziz et al., "Performance Of Complex Noise Transfer Functions In Bandpass And Multi Band Sigma Delta Systems," IEEE, 1995, pp;. 641-644.
Jantzi, "A Fourth-Order Bandpass Sigma-Delta Modulator," IEEE Journal Of Solid-State Circuits, vol. 28, No. 3, Mar. 1993, pp. 282-291.
Liu et al., "Switched-Capacitor Implementation Of Complex Filters," IEEE International Symposium On Circuits And Systems, vol. 3, 1986, 5 pgs.
Sedra et al., "Complex Analog Bandpass Filters Designed By Linearly Shifting Real Low-Pass Prototypes," IEEE International Symposium On Circuits And Systems, vol. 3, 1985, 5 pgs.
Thurston et al., "Bandpass Implementation Of The Sigma-Delta A-D Conversion Technique," International Conference On Analogue To Digital And Digital To Analogue Conversion, Sep. 1991, 7 pgs.
Rudell, et al., *"Second Generation Multi-Standard Monolithic CMOS RF Transceiver,"* University of California, Berkeley, Slides 1 through 9 (Jun. 1996).
Cho, et al., *"Multi-Standard Monolithic CMOS RF Transceiver,"* University of California, Berkeley, Slides 1 through 26 (Jun. 1996).
Copending U.S. Appl. No. 09/821,342, filed Mar. 29, 2001, "Partitioned Radio-Frequency Apparatus And Associated Method" (SilA:072).
Copending U.S. Appl. No. 09/821,340, filed Mar. 29, 2001, "Digital Interface In Radio-Frequency Apparatus And Associated Methods" (SilA:073).
Copending U.S. Appl. No. 10/075,094, filed Feb. 13, 2002, "Radio-Frequency Communication Apparatus And Associated Methods" (Sila:074).
Copending U.S. Appl. No. 10/075,098, filed Feb. 13, 2002, "Apparatus And Methods For Generating Radio Frequencies In Communication Circuitry" (Sila:075).
Copending U.S. Appl. No. 10/075,122, filed Feb. 12, 2002, "Digital Architecture For Radio-Frequency Apparatus And Associated Methods" (Sila:078).
Copending U.S. Appl. No. 10/083,633, filed Feb. 26, 2002, "Apparatus And Methods For Calibrating Signal-Processing Circuitry" (Sila:080).
Copending U.S. Appl. No. 10/081,121, filed Feb. 22, 2002, "Calibrated Low-Noise Current And Voltage References And Associated Methods" (Sila:095).
Copending U.S. Appl. No. 10/074,591, filed Feb. 13, 2002, "Apparatus For Generating Multiple Radio Frequencies In Communication Circuitry And Associated Methods" (Sila:096).
Copending U.S. Appl. No. 10/075,099, filed Feb. 12, 2002, "Notch Filter For DC Offset Reduction In Radio-Frequency Apparatus And Associated Methods" (Sila:097).
Copending U.S. Appl. No. 10/074,676, filed Feb. 12, 2002, "DC Offset Reduction In Radio-Frequency Apparatus And Associated Methods" (Sila:098).
Copending U.S. Appl. No. 10/079,058, filed Feb. 19, 2002, "Apparatus And Methods For Output Buffer Circuitry With Constant Output Power In Radio-Frequency Circuitry" (Sila:099).
Copending U.S. Appl. No. 10/081,730, filed Feb. 22, 2002, "Method And Apparatus For Synthesizing High-Frequency Signals For Wireless Communications" (Sila:106).
Copending U.S. Appl. No. 10/079,057, filed Feb. 19, 2002, "Apparatus And Method For Front-End Circuitry In Radio-Frequency Apparatus" (Sila:107).

Allen, "Complex Analog Filters Obtained From Shifted Lowpass Prototypes," Sep. 1985, 118 pgs.

Motorola Communications Semiconductor Product Division, "A 1.9 GHz Chipset For PCS Applications," Microwave Journal, No. 6, Jun. 1995, 3 pgs.

Search Report for PCT/US02/00896; Oct. 4, 2002; 7 pgs.

Copending U.S. Appl. No. 09/708,339, filed Nov. 8, 2000, "Method And Apparatus For Operating A PLL With A Phase Detector/Sample Hold Circuit For Synthesizing High-Frequency Signals For Wireless Communications" (Sila; 035C1).

Copending U.S. Appl. No. 09/999,702, filed Oct. 31, 2001, "Method And Apparatus For Synthesizing Dual Band High-Frequency Signals For Wireless Communications" (Sila: 060C1).

Cong et al., "Multigigahertz CMOS Dual-Modulus Prescalar IC", IEEE Journal Of Solid-State Circuits, vol. 23, No. 5, Oct. 1988, pps. 1189-1194.

Duncan et al., "A 1 GHz Quadrature Sinusoidal Osciallator", IEEE Custom Integrated Circuits Conference, 1995, pp. 91-94.

Craninckx et al., "A 1.8-GHz CMOS Low-Phase-Noise Voltage-Controlled Oscillator With Prescaler", IEEE Journal of Solid-State Circuits, vol. 30, No. 12, Dec. 1995, pps. 1474-1482.

Chang et al., "A 1.2 GHz CMOS Dual-Modulus Prescaler Using New Dynamic D-Type Flip-Flops", IEEE Journal of Solid-State Circuits, vol. 31, No. 5, May 1996, pps. 749-752.

Craninckx et al. "A 1.75-GHz/3-V Dual-Modulus Divide-by-128/129 Prescaler In 0.7-$\mu$m CMOS", IEEE Journal of Solid-State Circuits, vol. 31, No. 7, Jul. 1996, pps. 890-897.

National Semiconductor, "LMX2330L/LMX2331L/LMX2332L PLLatinum™ Low Power Dual Frequency Synthesizer For RF Personal Communications", Advance Information, Feb. 1998, 16 pgs.

Kral et al., "RF-CMOS Osciallators With Switched Tuning", Custom IC Conference, Santa Clara, CA, May 1998, pps. 555-558.

Craninckx et al., "FA 15.5: A CMOS 1.8GHz Low-Phase-Noise Voltage-Controlled Oscillator With Prescaler", IEEE International Solid-State Circuits Conference, 1995, 3 pgs.

Silicon Laboratories, "Dual-Band RF Frequency Synthesizer With Integrated VCOs For Wireless Communications", SI 4133, 1999, pps. 1-28.

Craninckx, "Low-Phase-Noise Fully Integrated CMOS Frequency Synthesizers", Dec. 1997, pps. 77-104.

Search Report for PCT/US02/00895; Nov. 7, 2002, 6 pgs.

* cited by examiner

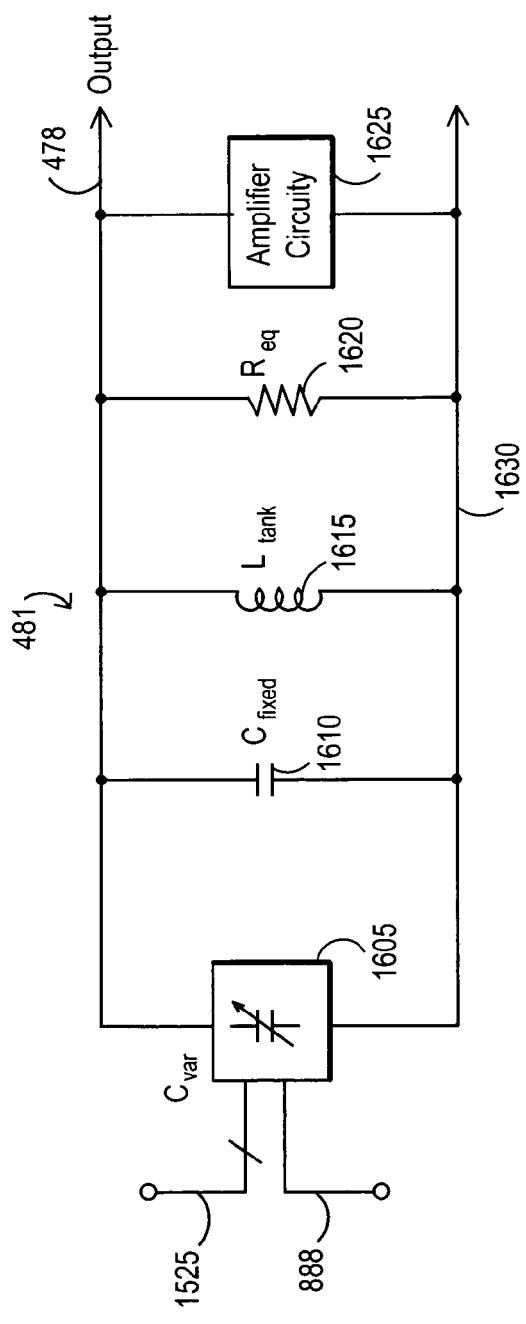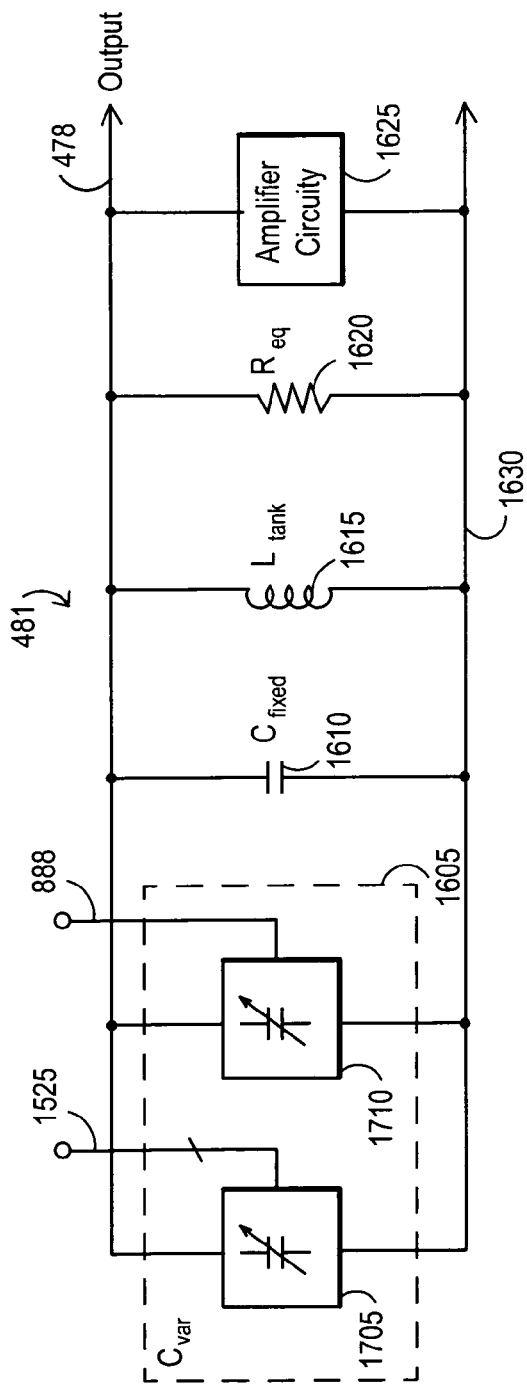
FIG. 16
FIG. 17

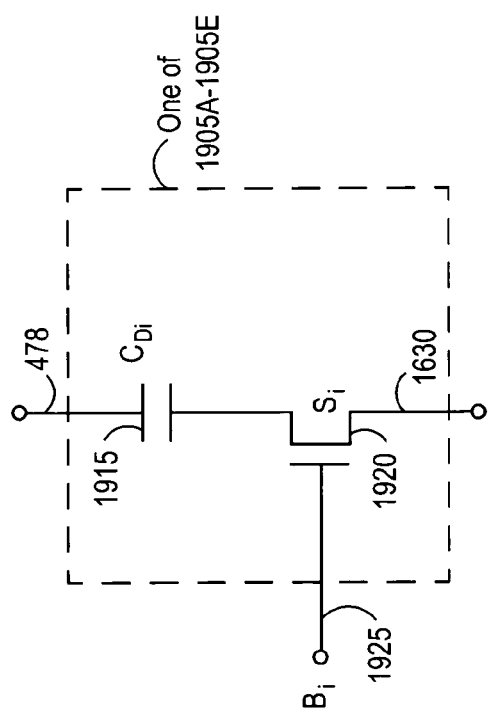

APPARATUS FOR GENERATING MULTIPLE RADIO FREQUENCIES IN COMMUNICATION CIRCUITRY AND ASSOCIATED METHODS

CROSS-REFERENCE TO RELATED APPLICATIONS

This patent application is a continuation-in-part of: U.S. patent application Ser. No. 09/821,342, titled "Partitioned Radio-Frequency Apparatus and Associated Methods," filed on Mar. 29, 2001 now U.S. Pat. No. 6,804,497; and U.S. patent application Ser. No. 09/708,339, titled "Method and Apparatus for Operating a PLL with a Phase Detector/Sample Hold Circuit for Synthesizing High-Frequency Signals for Wireless Communications," filed on Nov. 8, 2000 now U.S. Pat. No. 6,741,846, which is a continuation of U.S. patent application Ser. No. 09/087,017, filed on May 29, 1998, now U.S. Pat. No. 6,167,245.

Furthermore, this patent application claims priority to: Provisional U.S. Patent Application Ser. No. 60/261,506, filed on Jan. 12, 2001; Provisional U.S. Patent Application Ser. No. 60/273,119, titled "Partitioned RF Apparatus with Digital Interface and Associated Methods," filed on Mar. 2, 2001. This patent application also claims priority to, and incorporates by reference: Provisional U.S. Patent Application Ser. No. 60/333,940, titled "Apparatus and Methods for Generating Radio Frequencies in Communication Circuitry," filed on Nov. 28, 2001; Provisional U.S. Patent Application Ser. No. 60/339,819, titled "Radio-Frequency Communication Apparatus and Associated Methods," filed on Dec. 13, 2001. The present patent application is a continuation-in-part of U.S. patent application Ser. No. 10/075,122, titled "Digital Architecture for Radio-Frequency Apparatus and Associated Methods"; and a continuation-in-part of U.S. patent application Ser. No. 10/075,099, titled "Notch Filter for DC Offset Reduction in Radio-Frequency Apparatus and Associated Methods"; and a continuation-in-part of U.S. patent application Ser. No. 10/074,676, all filed on Feb. 12, 2002 titled "DC Offset Reduction in Radio-Frequency Apparatus and Associated Methods."

Furthermore, this patent application incorporates by reference the following concurrently filed patent documents: U.S. patent application Ser. No. 10/075,094, titled "Radio-Frequency Communication Apparatus and Associated Methods"; and U.S. patent application Ser. No. 10/075,098, titled "Apparatus and Methods for Generating Radio Frequencies in Communication Circuitry."

TECHNICAL FIELD OF THE INVENTION

This invention relates to radio-frequency (RF) apparatus, such as receivers, transmitters, and transceivers. More particularly, the invention concerns generation of prescribed frequencies in RF apparatus, frequency calibration in RF apparatus, and multi-band operation in RF apparatus.

BACKGROUND

The proliferation and popularity of mobile radio and telephony applications has led to market demand for communication systems with low cost, low power, and small form-factor radio-frequency (RF) transceivers. As a result, recent research has focused on providing monolithic transceivers using low-cost complementary metal-oxide semiconductor (CMOS) technology. One aspect of research efforts has focused on providing an RF transceiver within a single integrated circuit (IC). The integration of transceiver circuits is not a trivial problem, as it must take into account the requirements of the transceiver's circuitry and the communication standards governing the transceiver's operation.

From the perspective of the transceiver's circuitry, RF transceivers typically include sensitive components susceptible to noise and interference with one another and with external sources. Integrating the transceiver's circuitry into one integrated circuit may exacerbate interference among the various blocks of the transceiver's circuitry. Moreover, communication standards governing RF transceiver operation outline a set of requirements for noise, intermodulation, blocking performance, output power, and spectral emission of the transceiver. Unfortunately, no technique for addressing all of the above issues in high-performance RF receivers or transceivers, for example, RF transceivers used in cellular and telephony applications, has been developed. A need therefore exists for techniques of partitioning and integrating RF receivers or transceivers that would provide low-cost, low form-factor RF transceivers for high-performance applications, for example, in cellular handsets.

A further aspect of RF apparatus, such as RF transceivers and transmitters, relates to the transmitter circuitry or transmit-path circuitry. Typical transmit circuitry includes a feedback loop (often a phase-locked loop, or PLL) that has a voltage-controlled oscillator (VCO) and a loop filter circuitry. In conventional transmitters and transceivers, the VCO circuitry and the loop filter circuitry constitute off-chip, off-the-shelf, discrete components. That arrangement, however, has several disadvantages. The external components require routing on-chip signals to those components and, conversely, routing signals from the discrete components to on-chip integrated circuitry. Consequently, noise sensitivity and susceptibility increases, while the effective operating frequency decreases. Furthermore, discrete components increase the overall system cost, complexity, power consumption, and form factor (e.g., board size, number of package pins). Worse yet, discrete components reduce the system's overall integration level, reliability, and speed or throughput.

In addition, conventional discrete VCOs typically have relatively large gains (i.e., a relatively small change in the VCO's control voltage results in a relatively large change in the frequency of the VCO's output signal). The large gain results in more sensitivity and susceptibility to noise. Thus, noise or spurious signals added to or coupled to the control voltage might corrupt the fidelity of the VCO by causing undesired variations in the frequency of the VCO's output signal or otherwise result in impurity of the output signal. As mentioned above, the conventional discrete VCO circuitry typically requires the user to route signals from the RF integrated circuitry to the discrete VCO circuitry, thus increasing the likelihood of corruption by noise and spurious signals and exacerbating the problems described above. A need therefore exists for integrated VCO circuitry (to reduce cost and/or size) within the transmit-path circuitry of RF apparatus, such as transceivers and transmitters.

Often, the user desires the transmit-path circuitry to operate in more than one band (i.e., it supports multi-band operation). Examples of various bands include GSM 850, GSM 900, DCS 1800, and PCS 1900. In conventional RF apparatus, operation in each additional band typically entails the provision of an additional discrete VCO circuitry. Thus, a multi-band RF apparatus may include several discrete VCO circuitries. Consequently, in conventional RF apparatus, the problems associated with discrete VCO circuitries described above compound as the number of VCO circuitries increases. A further need therefore exists for RF apparatus that provides multi-band operation, yet uses a single integrated VCO circuitry.

SUMMARY OF THE INVENTION

One aspect of the invention relates to generating multiple output signals with various frequencies in RF apparatus, for example, a transmitter circuitry, by using a single VCO circuitry.

In one embodiment, an RF apparatus capable of transmitting RF signals, includes transmitter path circuitry. The transmitter path circuitry includes a VCO circuitry configured to generate a first signal that has a first frequency. The transmitter path circuitry also includes a divider circuitry that, in response to the first signal, generates a second signal that has a second frequency. The second frequency equals the first frequency divided by a number. Generally, rather than using a divider circuitry, one may use a scaling circuitry, whose output frequency may be lower or higher than its input frequency. Consequently, one may provide the second signal so that its frequency (i.e., the second frequency) is lower or higher than the first frequency, as desired.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numerals used in more than one drawing denote the same, similar, or equivalent functionality, components, or blocks.

FIG. 16 illustrates a conceptual or block diagram of an exemplary embodiment of the VCO circuitry according to the invention.

FIG. 17 shows more details at the block diagram or conceptual level of an embodiment of the VCO circuitry according to the invention.

FIG. 19B shows an exemplary embodiment for each stage of a discretely variable capacitor according to the invention.

DETAILED DESCRIPTION

This invention in part contemplates partitioning RF apparatus so as to provide highly integrated, high-performance, low-cost, and low form-factor RF solutions. One may use RF apparatus according to the invention in high-performance communication systems. More particularly, the invention in part relates to partitioning RF receiver or transceiver circuitry in a way that minimizes, reduces, or overcomes interference effects among the various blocks of the RF receiver or transceiver, while simultaneously satisfying the requirements of the standards that govern RF receiver or transceiver performance. Those standards include the Global System for Mobile (GSM) communication, Personal Communication Services (PCS), Digital Cellular System (DCS), Enhanced Data for GSM Evolution (EDGE), and General Packet Radio Services (GPRS). RF receiver or transceiver circuitry partitioned according to the invention therefore overcomes interference effects that would be present in highly integrated RF receivers or transceivers while meeting the requirements of the governing standards at low cost and with a low form-factor. The description of the invention refers to circuit partition and circuit block interchangeably.

Figure 1:
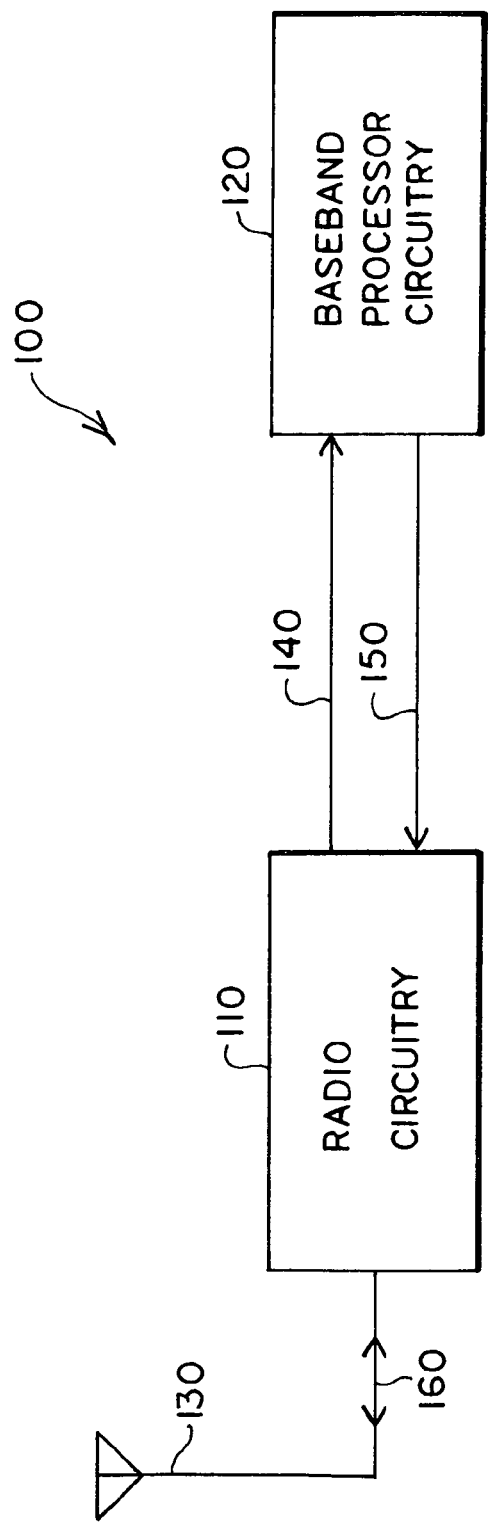
FIG. 1 illustrates the block diagram of an RF transceiver that includes radio circuitry that operates in conjunction with a baseband processor circuitry.

FIG. 1 shows the general block diagram of an RF transceiver circuitry 100 according to the invention. The RF transceiver circuitry 100 includes radio circuitry 110 that couples to an antenna 130 via a bi-directional signal path 160. The radio circuitry 110 provides an RF transmit signal to the antenna 130 via the bi-directional signal path 160 when the transceiver is in transmit mode. When in the receive mode, the radio circuitry 110 receives an RF signal from the antenna 130 via the bi-directional signal path 160.

The radio circuitry 110 also couples to a baseband processor circuitry 120. The baseband processor circuitry 120 may comprise a digital-signal processor (DSP). Alternatively, or in addition to the DSP, the baseband processor circuitry 120 may comprise other types of signal processor, as persons skilled in the art understand. The radio circuitry 110 processes the RF signals received from the antenna 130 and provides receive signals 140 to the baseband processor circuitry 120. In addition, the radio circuitry 110 accepts transmit input signals 150 from the baseband processor 120 and provides the RF transmit signals to the antenna 130.

Figure 2A:
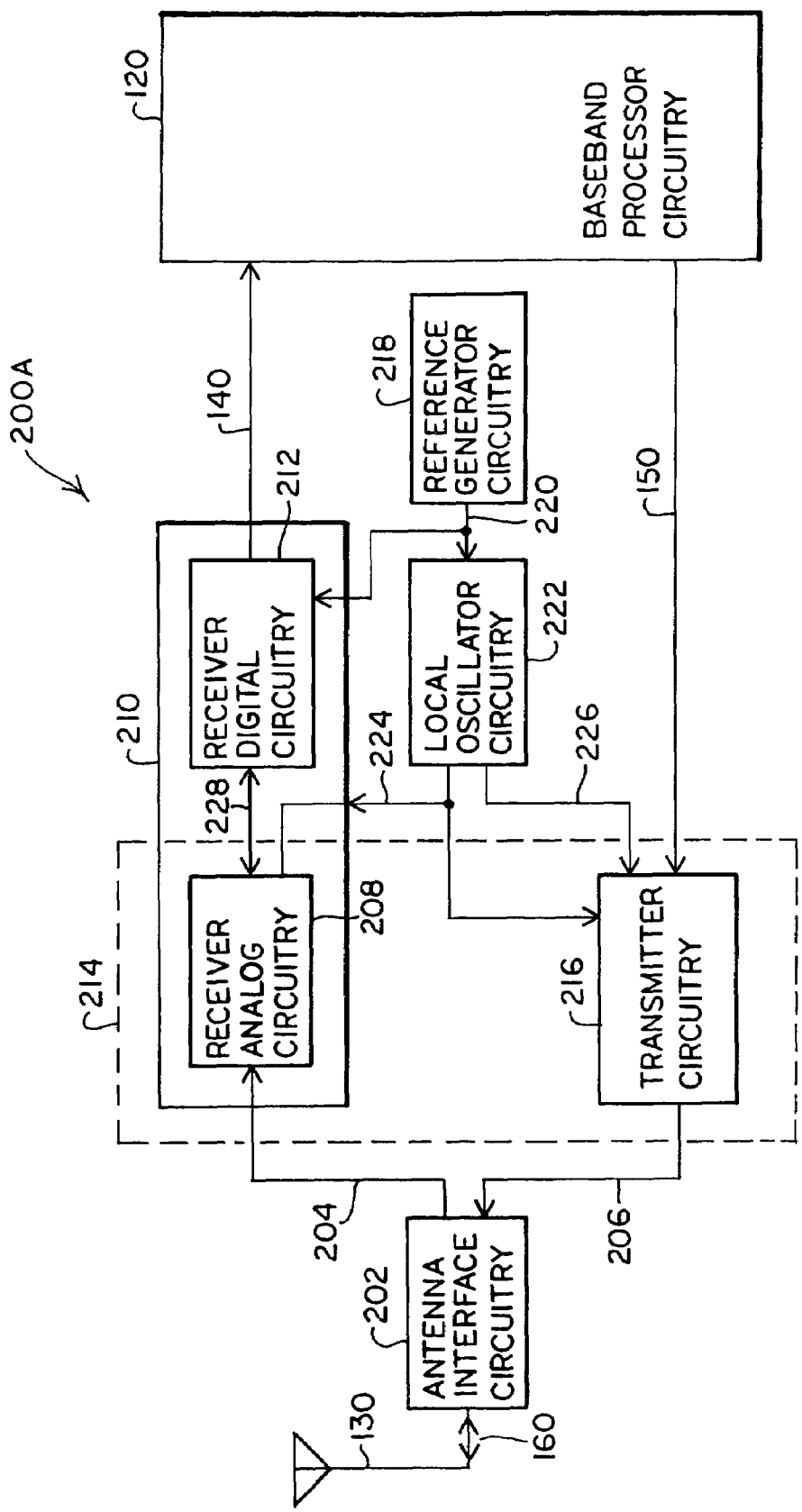
FIG. 2A shows RF transceiver circuitry partitioned according to the invention.

FIGS. 2A–2D show various embodiments of RF transceiver circuitry partitioned according to the invention. FIG. 3 and its accompanying description below make clear the considerations that lead to the partitioning of the RF transceiver circuitry as shown in FIGS. 2A–2D. FIG. 2A illustrates an embodiment 200A of an RF transceiver circuitry partitioned according to the invention. In addition to the elements described in connection with FIG. 1, the RF transceiver 200A includes antenna interface circuitry 202, receiver circuitry 210, transmitter circuitry 216, reference generator circuitry 218, and local oscillator circuitry 222.

The reference generator circuitry 218 produces a reference signal 220 and provides that signal to the local oscillator circuitry 222 and to receiver digital circuitry 212. The reference signal 220 preferably comprises a clock signal, although it may include other signals, as desired. The local oscillator circuitry 222 produces an RF local oscillator signal 224, which it provides to receiver analog circuitry 208 and to the transmitter circuitry 216. The local oscillator circuitry 222 also produces a transmitter intermediate-frequency (IF) local oscillator signal 226 and provides that signal to the transmitter circuitry 216. Note that, in RF transceivers according to the invention, the receiver analog circuitry 208 generally comprises mostly analog circuitry in addition to some digital or mixed-mode circuitry, for example, analog-to-digital converter (ADC) circuitry and circuitry to provide an interface between the receiver analog circuitry and the receiver digital circuitry, as described below.

The antenna interface circuitry 202 facilitates communication between the antenna 130 and the rest of the RF transceiver. Although not shown explicitly, the antenna interface circuitry 202 may include a transmit/receive mode switch, RF filters, and other transceiver front-end circuitry, as persons skilled in the art understand. In the receive mode, the antenna interface circuitry 202 provides RF receive signals 204 to the receiver analog circuitry 208. The receiver analog circuitry 208 uses the RF local oscillator signal 224 to process (e.g., down-convert) the RF receive signals 204 and produce a processed analog signal. The receiver analog circuitry 208 converts the processed analog signal to digital format and supplies the resulting digital receive signals 228 to the receiver digital circuitry 212. The receiver digital circuitry 212 further processes the digital receive signals 228 and provides the resulting receive signals 140 to the baseband processor circuitry 120.

In the transmit mode, the baseband processor circuitry 120 provides transmit input signals 150 to the transmitter circuitry 216. The transmitter circuitry 216 uses the RF local oscillator signal 224 and the transmitter IF local oscillator signal 226 to process the transmit input signals 150 and to provide the resulting transmit RF signal 206 to the antenna interface circuitry 202. The antenna interface circuitry 202 may process the transmit RF signal further, as desired, and provide the resulting signal to the antenna 130 for propagation into a transmission medium.

The embodiment 200A in FIG. 2A comprises a first circuit partition, or circuit block, 214 that includes the receiver analog circuitry 208 and the transmitter circuitry 216. The embodiment 200A also includes a second circuit partition, or circuit block, that includes the receiver digital circuitry 212. The embodiment 200A further includes a third circuit partition, or circuit block, that comprises the local oscillator circuitry 222. The first circuit partition 214, the second circuit partition 212, and the third circuit partition 222 are partitioned from one another so that interference effects among the circuit partitions tend to be reduced. The first, second, and third circuit partitions preferably each reside within an integrated circuit device. In other words, preferably the receiver analog circuitry 208 and the transmitter circuitry 216 reside within an integrated circuit device, the receiver digital circuitry 212 resides within another integrated circuit device, and the local oscillator circuitry 222 resides within a third integrated circuit device.

Figure 2B:
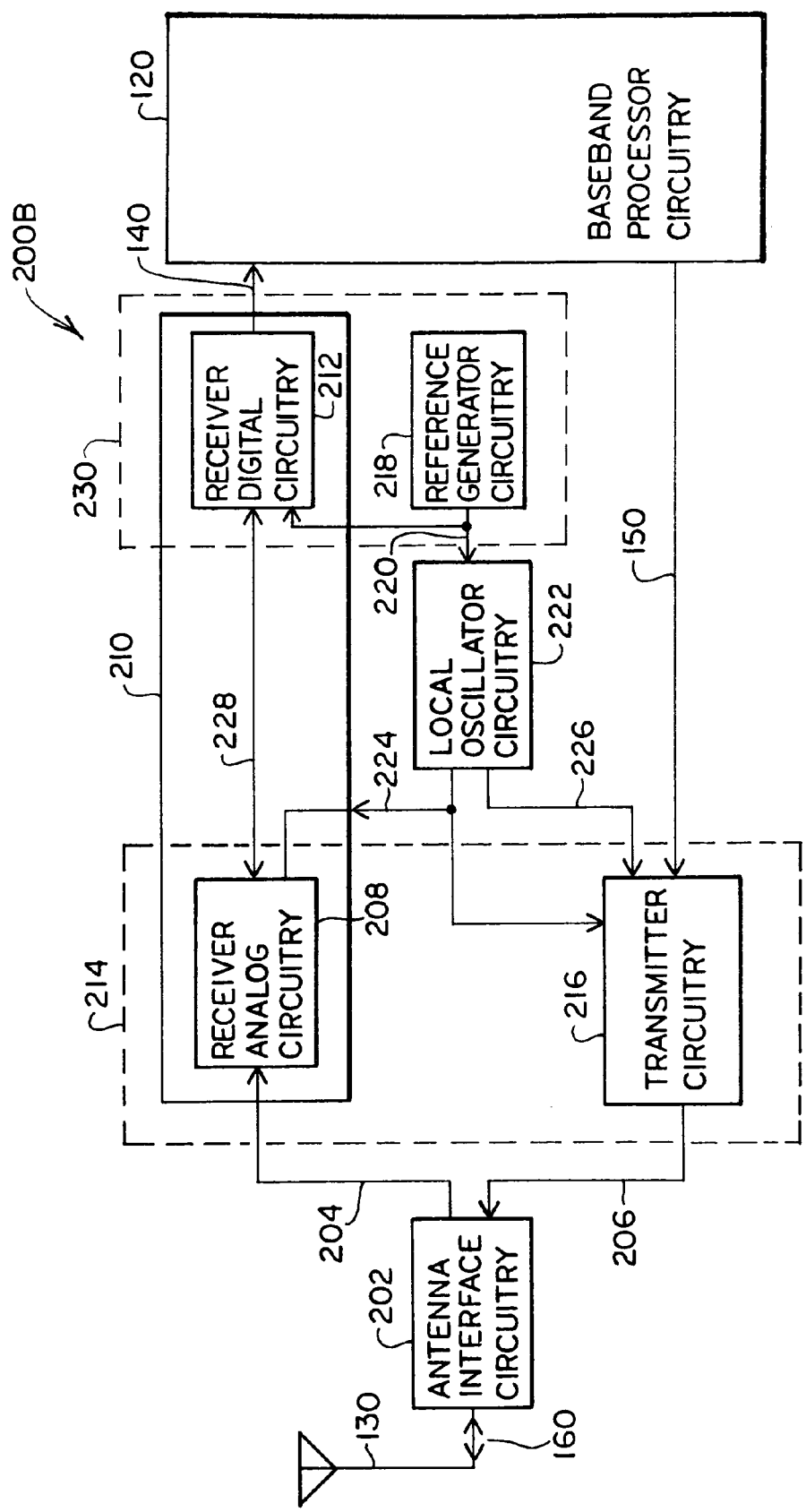
FIG. 2B depicts another embodiment of RF transceiver circuitry partitioned according to the invention, in which the reference generator circuitry resides within the same circuit partition, or circuit block, as does the receiver digital circuitry.
Figure 3:
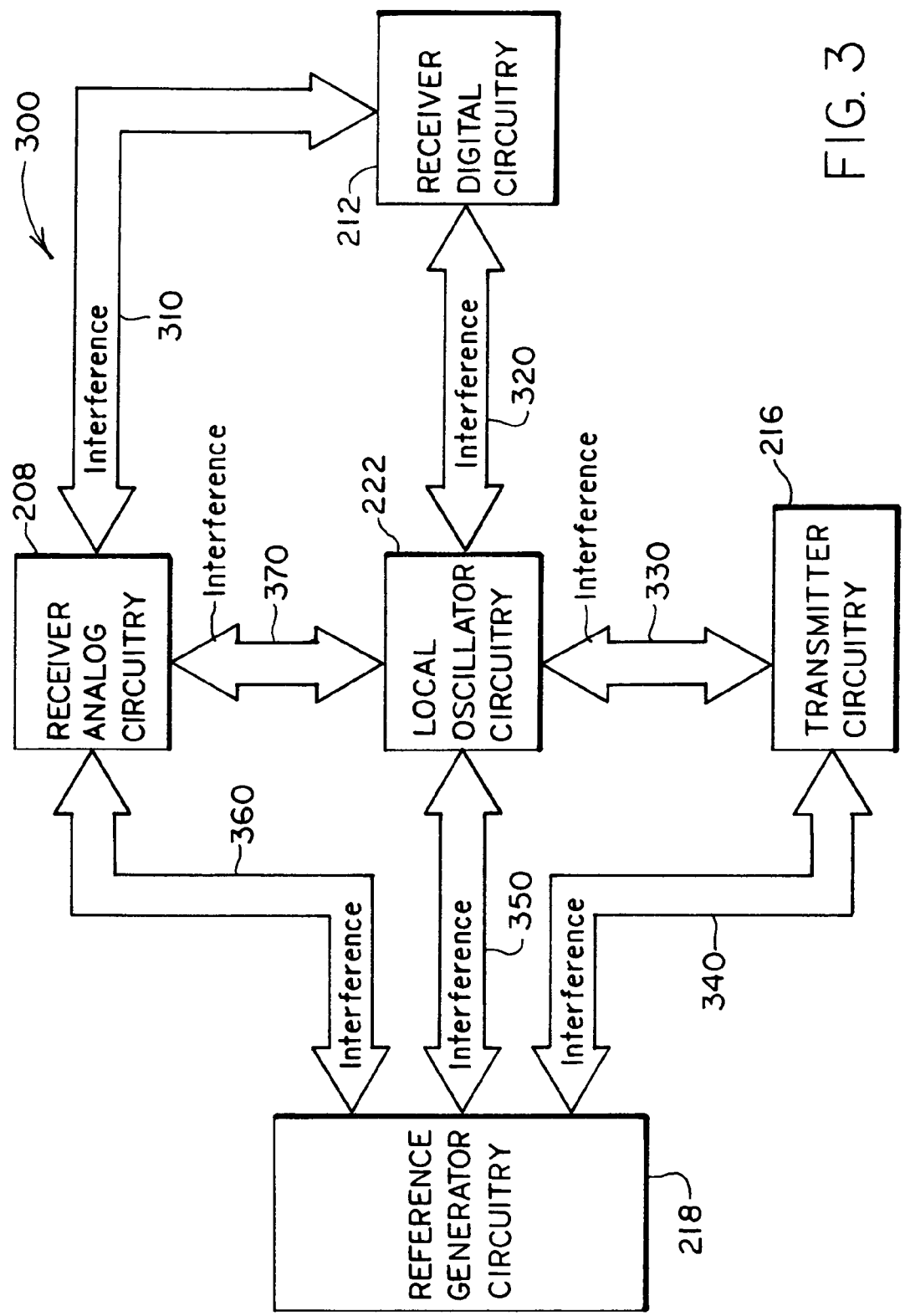
FIG. 3 illustrates interference mechanisms among the various blocks of an RF transceiver, which the embodiments of the invention in FIGS. 2A–2D, depicting RF transceivers partitioned according to the invention, seek to overcome, reduce, or minimize.

FIG. 2B shows an embodiment 200B of an RF transceiver circuitry partitioned according to the invention. The embodiment 200B has the same circuit topology as that of embodiment 200A in FIG. 2A. The partitioning of embodiment 200B, however, differs from the partitioning of embodiment 200A. Like embodiment 200A, embodiment 200B has three circuit partitions, or circuit blocks. The first and the third circuit partitions in embodiment 200B are similar to the first and third circuit partitions in embodiment 200A. The second circuit partition 230 in embodiment 200B, however, includes the reference signal generator 218 in addition to the receiver digital circuitry 212. As in embodiment 200A, embodiment 200B is partitioned so that interference effects among the three circuit partitions tend to be reduced.

Figure 2C:
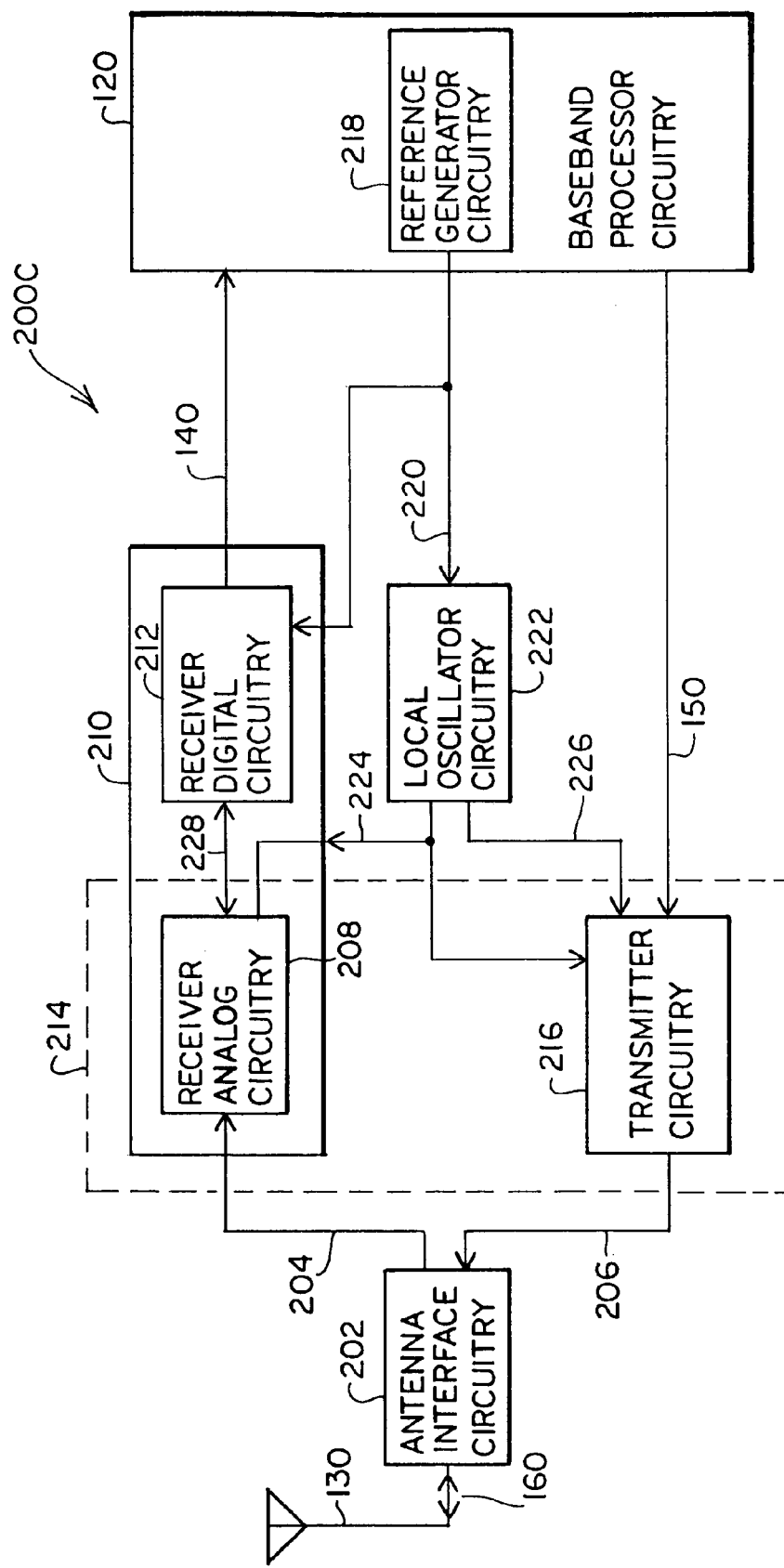
FIG. 2C illustrates yet another embodiment of RF transceiver circuitry partitioned according to invention, in which the reference generator circuitry resides within the baseband processor circuitry.

FIG. 2C illustrates an embodiment 200C, which constitutes a variation of embodiment 200A in FIG. 2A. Embodiment 200C shows that one may place the reference signal generator 218 within the baseband processor circuitry 120, as desired. Placing the reference signal generator 218 within the baseband processor circuitry 120 obviates the need for either discrete reference signal generator circuitry 218 or an additional integrated circuit or module that includes the reference signal generator 218. Embodiment 200C has the same partitioning as embodiment 200A, and operates in a similar manner.

Note that FIGS. 2A–2C show the receiver circuitry 210 as a block to facilitate the description of the embodiments shown in those figures. In other words, the block containing the receiver circuitry 210 in FIGS. 2A–2C constitutes a conceptual depiction of the receiver circuitry within the RF transceiver shown in FIGS. 2A–2C, not a circuit partition or circuit block.

Figure 2D:
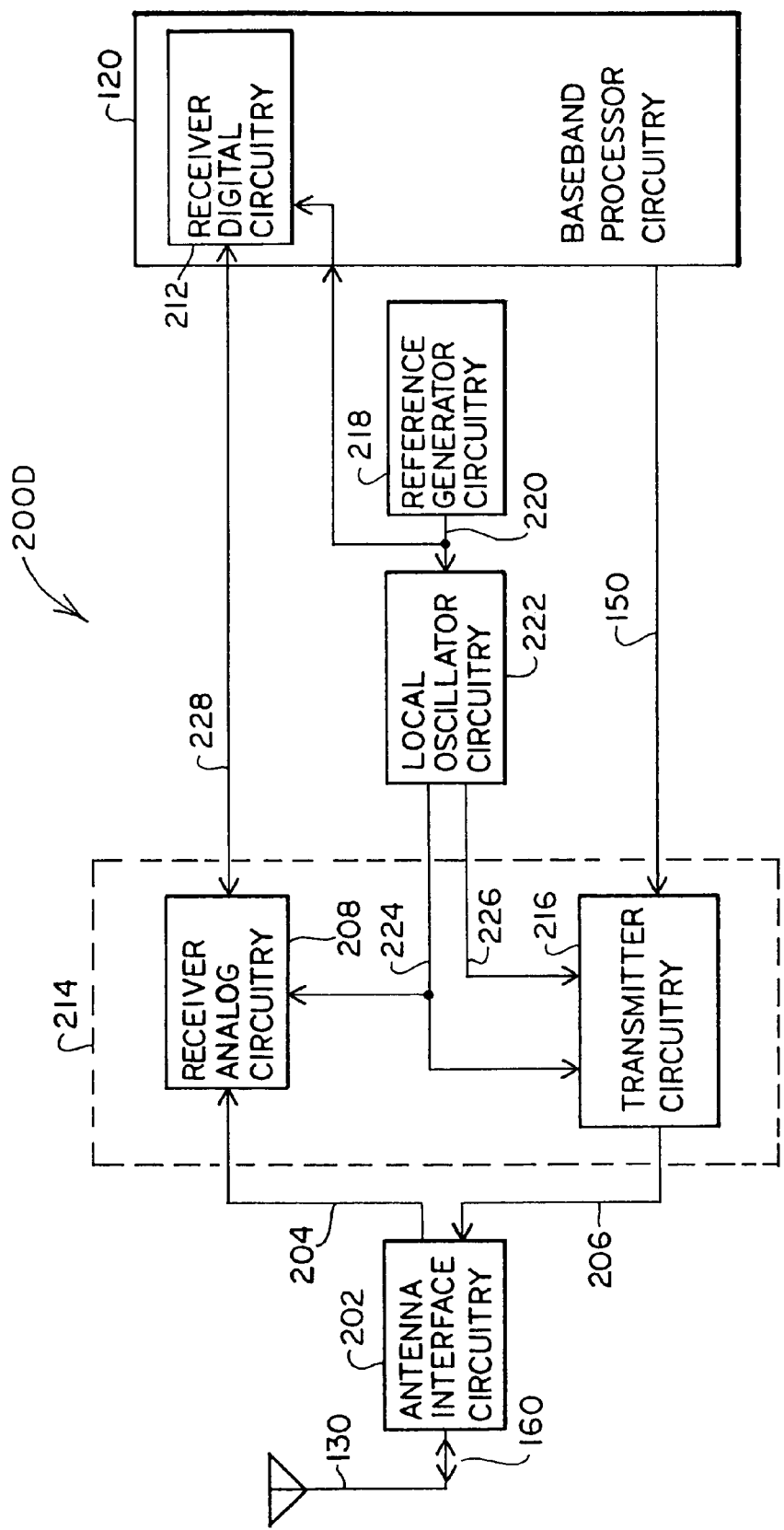
FIG. 2D shows another embodiment of RF transceiver circuitry partitioned according to the invention, in which the receiver digital circuitry resides within the baseband processor circuitry.

FIG. 2D shows an embodiment 200D of an RF transceiver partitioned according to the invention. The RF transceiver in FIG. 2D operates similarly to the transceiver shown in FIG. 2A. The embodiment 200D, however, accomplishes additional economy by including the receiver digital circuitry 212 within the baseband processor circuitry 120. As one alternative, one may integrate the entire receiver digital circuitry 212 on the same integrated circuit device that includes the baseband processor circuitry 120. Note that one may use software (or firmware), hardware, or a combination of software (or firmware) and hardware to realize the functions of the receiver digital circuitry 212 within the baseband processor circuitry 120, as persons skilled in the art who have the benefit of the description of the invention understand. Note also that, similar to the embodiment 200C in FIG. 2C, the baseband processor circuitry 120 in embodiment 200D may also include the reference signal generator 218, as desired.

The partitioning of embodiment 200D involves two circuit partitions, or circuit blocks. The first circuit partition 214 includes the receiver analog circuitry 208 and the transmitter circuitry 216. The second circuit partition includes the local oscillator circuitry 222. The first and second circuit partitions are partitioned so that interference effects between them tend to be reduced.

FIG. 3 shows the mechanisms that may lead to interference among the various blocks or components in a typical RF transceiver, for example, the transceiver shown in FIG. 2A. Note that the paths with arrows in FIG. 3 represent interference mechanisms among the blocks within the transceiver, rather than desired signal paths. One interference mechanism results from the reference signal 220 (see FIGS. 2A–2D), which preferably comprises a clock signal. In the preferred embodiments, the reference generator circuitry produces a clock signal that may have a frequency of 13 MHz (GSM clock frequency) or 26 MHz. If the reference generator produces a 26 MHz clock signal, RF transceivers according to the invention preferably divide that signal by two to produce a 13 MHz master system clock. The clock signal typically includes voltage pulses that have many Fourier series harmonics. The Fourier series harmonics extend to many multiples of the clock signal frequency. Those harmonics may interfere with the receiver analog circuitry 208 (e.g., the low-noise amplifier, or LNA), the local oscillator circuitry 222 (e.g., the synthesizer circuitry), and the transmitter circuitry 216 (e.g., the transmitter's voltage-controlled oscillator, or VCO). FIG. 3 shows these sources of interference as interference mechanisms 360, 350, and 340.

The receiver digital circuitry 212 uses the output of the reference generator circuitry 218, which preferably comprises a clock signal. Interference mechanism 310 exists because of the sensitivity of the receiver analog circuitry 208 to the digital switching noise and harmonics present in the receiver digital circuitry 212. Interference mechanism 310 may also exist because of the digital signals (for example, clock signals) that the receiver digital circuitry 212 communicates to the receiver analog circuitry 208. Similarly, the digital switching noise and harmonics in the receiver digital circuitry 212 may interfere with the local oscillator circuitry 222, giving rise to interference mechanism 320 in FIG. 3.

The local oscillator circuitry 222 typically uses an inductor in an inductive-capacitive (LC) resonance tank (not shown explicitly in the figures). The resonance tank may circulate relatively large currents. Those currents may couple to the sensitive circuitry within the transmitter circuitry 216 (e.g., the transmitter's VCO), thus giving rise to interference mechanism 330. Similarly, the relatively large currents circulating within the resonance tank of the local oscillator circuitry 222 may saturate sensitive components within the receiver analog circuitry 208 (e.g., the LNA circuitry). FIG. 3 depicts this interference source as interference mechanism 370.

The timing of the transmit mode and receive mode in the GSM specifications help to mitigate potential interference between the transceiver's receive-path circuitry and its transmit-path circuitry. The GSM specifications use time-division duplexing (TDD). According to the TDD protocol, the transceiver deactivates the transmit-path circuitry while in the receive mode of operation, and vice-versa. Consequently, FIG. 3 does not show potential interference mechanisms between the transmitter circuitry 216 and either the receiver digital circuitry 212 or the receiver analog circuitry 208.

As FIG. 3 illustrates, interference mechanisms exist between the local oscillator circuitry 222 and each of the other blocks or components in the RF transceiver. Thus, to reduce interference effects, RF transceivers according to the invention preferably partition the local oscillator circuitry 222 separately from the other transceiver blocks shown in FIG. 3. Note, however, that in some circumstances one may include parts or all of the local oscillator circuitry within the same circuit partition (for example, circuit partition 214 in FIGS. 2A–2D) that includes the receiver analog circuitry and the transmitter circuitry, as desired. Typically, a voltage-controlled oscillator (VCO) within the local oscillator circuitry causes interference with other sensitive circuit blocks (for example, the receiver analog circuitry) through undesired coupling mechanisms. If those coupling mechanisms can be mitigated to the extent that the performance characteristics of the RF transceiver are acceptable in a given application, then one may include the local oscillator circuitry within the same circuit partition as the receiver analog circuitry and the transmitter circuitry. Alternatively, if the VCO circuitry causes unacceptable levels of interference, one may include other parts of the local oscillator circuitry within the circuit partition that includes the receiver analog circuitry and the transmitter circuitry, but exclude the VCO circuitry from that circuit partition.

To reduce the effects of interference mechanism 310, RF transceivers according to the invention partition the receiver analog circuitry 208 separately from the receiver digital circuitry 212. Because of the mutually exclusive operation of the transmitter circuitry 216 and the receiver analog circuitry 208 according to GSM specifications, the transmitter circuitry 216 and the receiver analog circuitry 208 may reside within the same circuit partition, or circuit block. Placing the transmitter circuitry 216 and the receiver analog circuitry 208 within the same circuit partition results in a more integrated RF transceiver overall. The RF transceivers shown in FIGS. 2A–2D employ partitioning techniques that take advantage of the above analysis of the interference mechanisms among the various transceiver components. To reduce interference effects among the various circuit partitions or circuit blocks even further, RF transceivers according to the invention also use differential signals to couple the circuit partitions or circuit blocks to one another.

Figure 4:
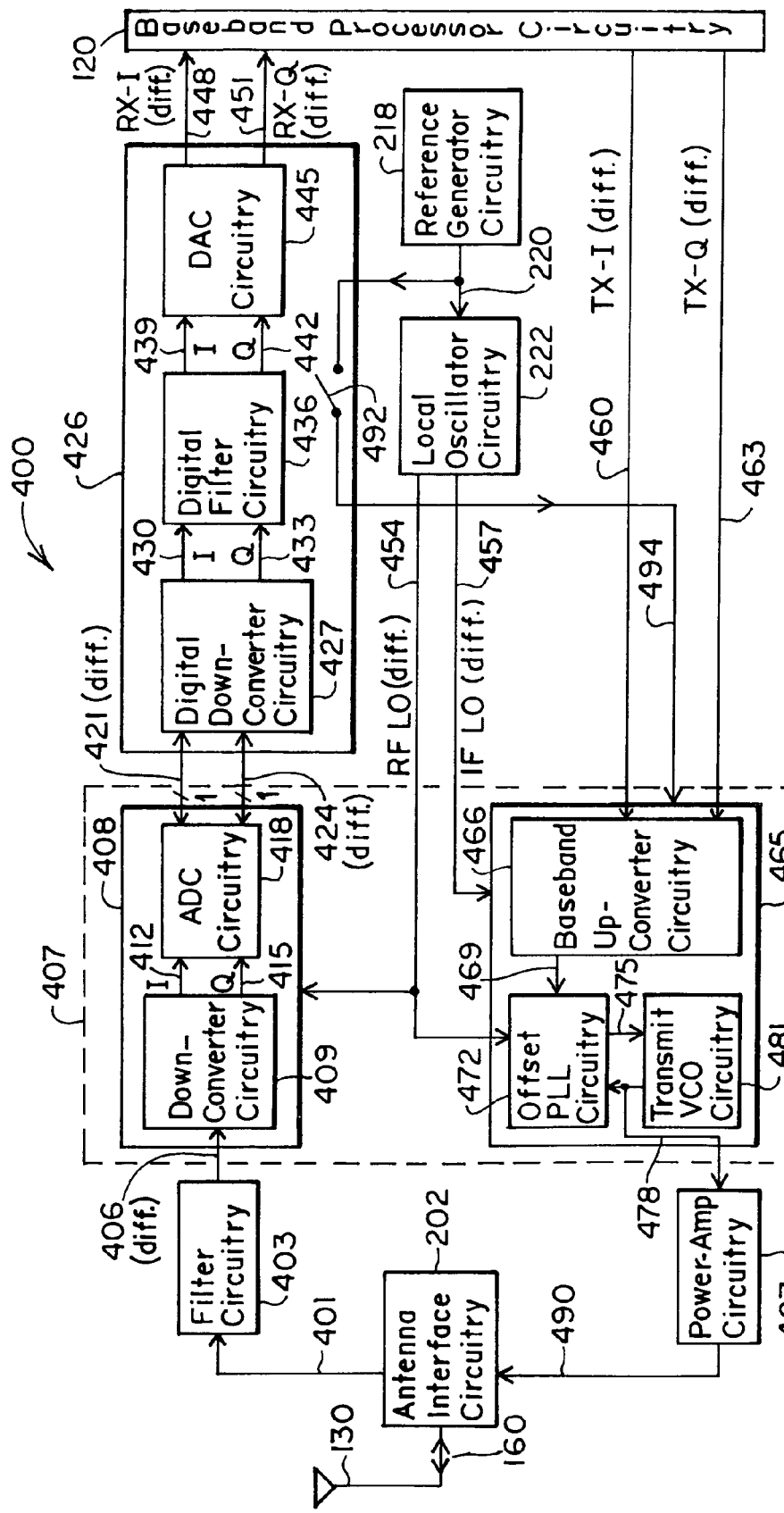
FIG. 4 shows a more detailed block diagram of RF transceiver circuitry partitioned according to the invention.

FIG. 4 shows a more detailed block diagram of an embodiment 400 of an RF transceiver partitioned according to the invention. The transceiver includes receiver analog circuitry 408, receiver digital circuitry 426, and transmitter circuitry 465. In the receive mode, the antenna interface circuitry 202 provides an RF signal 401 to a filter circuitry 403. The filter circuitry 403 provides a filtered RF signal 406 to the receiver analog circuitry 408. The receiver analog circuitry 408 includes down-converter (i.e., mixer) circuitry 409 and analog-to-digital converter (ADC) circuitry 418. The down-converter circuitry 409 mixes the filtered RF signal 406 with an RF local oscillator signal 454, received from the local oscillator circuitry 222. The down-converter circuitry 409 provides an in-phase analog down-converted signal 412 (i.e., I-channel signal) and a quadrature analog down-converted signal 415 (i.e., Q-channel signal) to the ADC circuitry 418.

The ADC circuitry 418 converts the in-phase analog down-converted signal 412 and the quadrature analog down-converted signal 415 into a one-bit in-phase digital receive signal 421 and a one-bit quadrature digital receive signal 424. (Note that FIGS. 4–8 illustrate signal flow, rather than specific circuit implementations; for more details of the circuit implementation, for example, more details of the circuitry relating to the one-bit in-phase digital receive signal 421 and the one-bit quadrature digital receive signal 424, see FIGS. 9–14.) Thus, The ADC circuitry 418 provides the one-bit in-phase digital receive signal 421 and the one-bit quadrature digital receive signal 424 to the receiver digital circuitry 426. As described below, rather than, or in addition to, providing the one-bit in-phase and quadrature digital receive signals to the receiver digital circuitry 426, the digital interface between the receiver analog circuitry 408 and the receiver digital circuitry 426 may communicate various other signals. By way of illustration, those signals may include reference signals (e.g., clock signals), control signals, logic signals, hand-shaking signals, data signals, status signals, information signals, flag signals, and/or configuration signals. Moreover, the signals may constitute single-ended or differential signals, as desired. Thus, the interface provides a flexible communication mechanism between the receiver analog circuitry and the receiver digital circuitry.

The receiver digital circuitry 426 includes digital down-converter circuitry 427, digital filter circuitry 436, and digital-to-analog converter (DAC) circuitry 445. The digital down-converter circuitry 427 accepts the one-bit in-phase digital receive signal 421 and the one-bit quadrature digital receive signal 424 from the receiver analog circuitry 408. The digital down-converter circuitry 427 converts the received signals into a down-converted in-phase signal 430 and a down-converted quadrature signal 433 and provides those signals to the digital filter circuitry 436. The digital filter circuitry 436 preferably comprises an infinite impulse response (IIR) channel-select filter that performs various filtering operations on its input signals. The digital filter circuitry 436 preferably has programmable response characteristics. Note that, rather than using an IIR filter, one may use other types of filter (e.g., finite impulse-response, or FIR, filters) that provide fixed or programmable response characteristics, as desired.

The digital filter circuitry 436 provides a digital in-phase filtered signal 439 and a digital quadrature filtered signal 442 to the DAC circuitry 445. The DAC circuitry 445 converts the digital in-phase filtered signal 439 and the digital quadrature filtered signal 442 to an in-phase analog receive signal 448 and a quadrature analog receive signal 451, respectively. The baseband processor circuitry 120 accepts the in-phase analog receive signal 448 and the quadrature analog receive signal 451 for further processing.

The transmitter circuitry 465 comprises baseband up-converter circuitry 466, offset phase-lock-loop (PLL) circuitry 472, and transmit voltage-controlled oscillator (VCO) circuitry 481. The transmit VCO circuitry 481 typically has low-noise circuitry and is sensitive to external noise. For example, it may pick up interference from digital switching because of the high gain that results from the resonant LC-tank circuit within the transmit VCO circuitry 481. The baseband up-converter circuitry 466 accepts an intermediate frequency (IF) local oscillator signal 457 from the local oscillator circuitry 222. The baseband up-converter circuitry 466 mixes the IF local oscillator signal 457 with an analog in-phase transmit input signal 460 and an analog quadrature transmit input signal 463 and provides an up-converted IF signal 469 to the offset PLL circuitry 472.

The offset PLL circuitry 472 effectively filters the IF signal 469. In other words, the offset PLL circuitry 472 passes through it signals within its bandwidth but attenuates other signals. In this manner, the offset PLL circuitry 472 attenuates any spurious or noise signals outside its bandwidth, thus reducing the requirement for filtering at the antenna 130, and reducing system cost, insertion loss, and power consumption. The offset PLL circuitry 472 forms a feedback loop with the transmit VCO circuitry 481 via an offset PLL output signal 475 and a transmit VCO output signal 478. The transmit VCO circuitry 481 preferably has a constant-amplitude output signal.

The offset PLL circuitry 472 uses a mixer (not shown explicitly in FIG. 4) to mix the RF local oscillator signal 454 with the transmit VCO output signal 478. Power amplifier circuitry 487 accepts the transmit VCO output signal 478, and provides an amplified RF signal 490 to the antenna interface circuitry 202. The antenna interface circuitry 202 and the antenna 130 operate as described above. RF transceivers according to the invention preferably use transmitter circuitry 465 that comprises analog circuitry, as shown in FIG. 4. Using such circuitry minimizes interference with the transmit VCO circuitry 481 and helps to meet emission specifications for the transmitter circuitry 465.

The receiver digital circuitry 426 also accepts the reference signal 220 from the reference generator circuitry 218. The reference signal 220 preferably comprises a clock signal. The receiver digital circuitry 426 provides to the transmitter circuitry 465 a switched reference signal 494 by using a switch 492. Thus, the switch 492 may selectively provide the reference signal 220 to the transmitter circuitry 465. Before the RF transceiver enters its transmit mode, the receiver digital circuitry 426 causes the switch 492 to close, thus providing the switched reference signal 494 to the transmitter circuitry 465.

The transmitter circuitry 465 uses the switched reference signal 494 to calibrate or adjust some of its components. For example, the transmitter circuitry 465 may use the switched reference signal 494 to calibrate some of its components, such as the transmit VCO circuitry 481, for example, as described in commonly owned U.S. Pat. No. 6,137,372, incorporated by reference here in its entirety. The transmitter circuitry 465 may also use the switched reference signal 494 to adjust a voltage regulator within its output circuitry so as to transmit at known levels of RF radiation or power.

While the transmitter circuitry 465 calibrates and adjusts its components, the analog circuitry within the transmitter circuitry 465 powers up and begins to settle. When the transmitter circuitry 465 has finished calibrating its internal circuitry, the receiver digital circuitry 426 causes the switch 492 to open, thus inhibiting the supply of the reference signal 220 to the transmitter circuitry 465. At this point, the transmitter circuitry may power up the power amplifier circuitry 487 within the transmitter circuitry 465. The RF transceiver subsequently enters the transmit mode of operation and proceeds to transmit.

Note that FIG. 4 depicts the switch 492 as a simple switch for conceptual, schematic purposes. One may use a variety of devices to realize the function of the controlled switch 492, for example, semiconductor switches, gates, or the like, as persons skilled in the art who have the benefit of the disclosure of the invention understand. Note also that, although FIG. 4 shows the switch 492 as residing within the receiver digital circuitry 426, one may locate the switch in other locations, as desired. Placing the switch 492 within the receiver digital circuitry 426 helps to confine to the receiver digital circuitry 426 the harmonics that result from the switching circuitry.

The embodiment 400 in FIG. 4 comprises a first circuit partition 407, or circuit block, that includes the receiver analog circuitry 408 and the transmitter circuitry 465. The embodiment 400 also includes a second circuit partition, or circuit block, that includes the receiver digital circuitry 426. Finally, the embodiment 400 includes a third circuit partition, or circuit block, that comprises the local oscillator circuitry 222. The first circuit partition 407, the second circuit partition, and the third circuit partition are partitioned from one another so that interference effects among the circuit partitions tend to be reduced. That arrangement tends to reduce the interference effects among the circuit partitions by relying on the analysis of interference effects provided above in connection with FIG. 3. Preferably, the first, second, and third circuit partitions each reside within an integrated circuit device. To further reduce interference effects among the circuit partitions, the embodiment 400 in FIG. 4 uses differential signals wherever possible. The notation "(diff.)" adjacent to signal lines or reference numerals in FIG. 4 denotes the use of differential lines to propagate the annotated signals.

Note that the embodiment 400 shown in FIG. 4 uses an analog-digital-analog signal path in its receiver section. In other words, the ADC circuitry 418 converts analog signals into digital signals for further processing, and later conversion back into analog signals by the DAC circuitry 445. RF transceivers according to the invention use this particular signal path for the following reasons. First, the ADC circuitry 418 obviates the need for propagating signals from the receiver analog circuitry 408 to the receiver digital circuitry 426 over an analog interface with a relatively high dynamic range. The digital interface comprising the one-bit in-phase digital receive signal 421 and the one-bit quadrature digital receive signal 424 is less susceptible to the effects of noise and interference than would be an analog interface with a relatively high dynamic range.

Second, the RF transceiver in FIG. 4 uses the DAC circuitry 445 to maintain compatibility with interfaces commonly used to communicate with baseband processor circuitry in RF transceivers. According to those interfaces, the baseband processor accepts analog, rather than digital, signals from the receive path circuitry within the RF transceiver. In an RF transceiver that meets the specifications of those interfaces, the receiver digital circuitry 426 would provide analog signals to the baseband processor circuitry 120. The receiver digital circuitry 426 uses the DAC circuitry 445 to provide analog signals (i.e., the in-phase analog receive signal 448 and the quadrature analog receive signal 451) to the baseband processor circuitry 120. The DAC circuitry 445 allows programming the common-mode level and the full-scale voltage, which may vary among different baseband processor circuitries.

Third, compared to an analog solution, the analog-digital-analog signal path may result in reduced circuit size and area (for example, the area occupied within an integrated circuit device), thus lower cost. Fourth, the digital circuitry provides better repeatability, relative ease of testing, and more robust operation than its analog counterpart. Fifth, the digital circuitry has less dependence on supply voltage variation, temperature changes, and the like, than does comparable analog circuitry.

Sixth, the baseband processor circuitry 120 typically includes programmable digital circuitry, and may subsume the functionality of the digital circuitry within the receiver digital circuitry 426, if desired. Seventh, the digital circuitry allows more precise signal processing, for example, filtering, of signals within the receive path. Eighth, the digital circuitry allows more power-efficient signal processing. Finally, the digital circuitry allows the use of readily programmable DAC circuitry and PGA circuitry that provide for more flexible processing of the signals within the receive path. To benefit from the analog-digital-analog signal path, RF transceivers according to the invention use a low-IF signal (for example, 100 KHz for GSM applications) in their receive path circuitry, as using higher IF frequencies may lead to higher performance demands on the ADC and DAC circuitry within that path. The low-IF architecture also eases image-rejection requirements, and allows on-chip integration of the digital filter circuitry 436. Moreover, RF transceivers according to the invention use the digital down-converter circuitry 427 and the digital filter circuitry 436 to implement a digital-IF path in the receive signal path. The digital-IF architecture facilitates the implementation of the digital interface between the receiver digital circuitry 426 and the receiver analog circuitry 408.

If the receiver digital circuitry 426 need not be compatible with the common analog interface to baseband processors, one may remove the DAC circuitry 445 and use a digital interface to the baseband processor circuitry 120, as desired. In fact, similar to the RF transceiver shown in FIG. 2D, one may realize the function of the receiver digital circuitry 426 within the baseband processor circuitry 120, using hardware, software, or a combination of hardware and software. In that case, the RF transceiver would include two circuit partitions, or circuit blocks. The first circuit partition, or circuit block, 407 would include the receiver analog circuitry 408 and the transmitter circuitry 465. A second circuit partition, or circuit block, would comprise the local oscillator circuitry 222. Note also that, similar to the RF transceiver shown in FIG. 2C, one may include within the baseband processor circuitry 120 the functionality of the reference generator circuitry 218, as desired.

Figure 5:
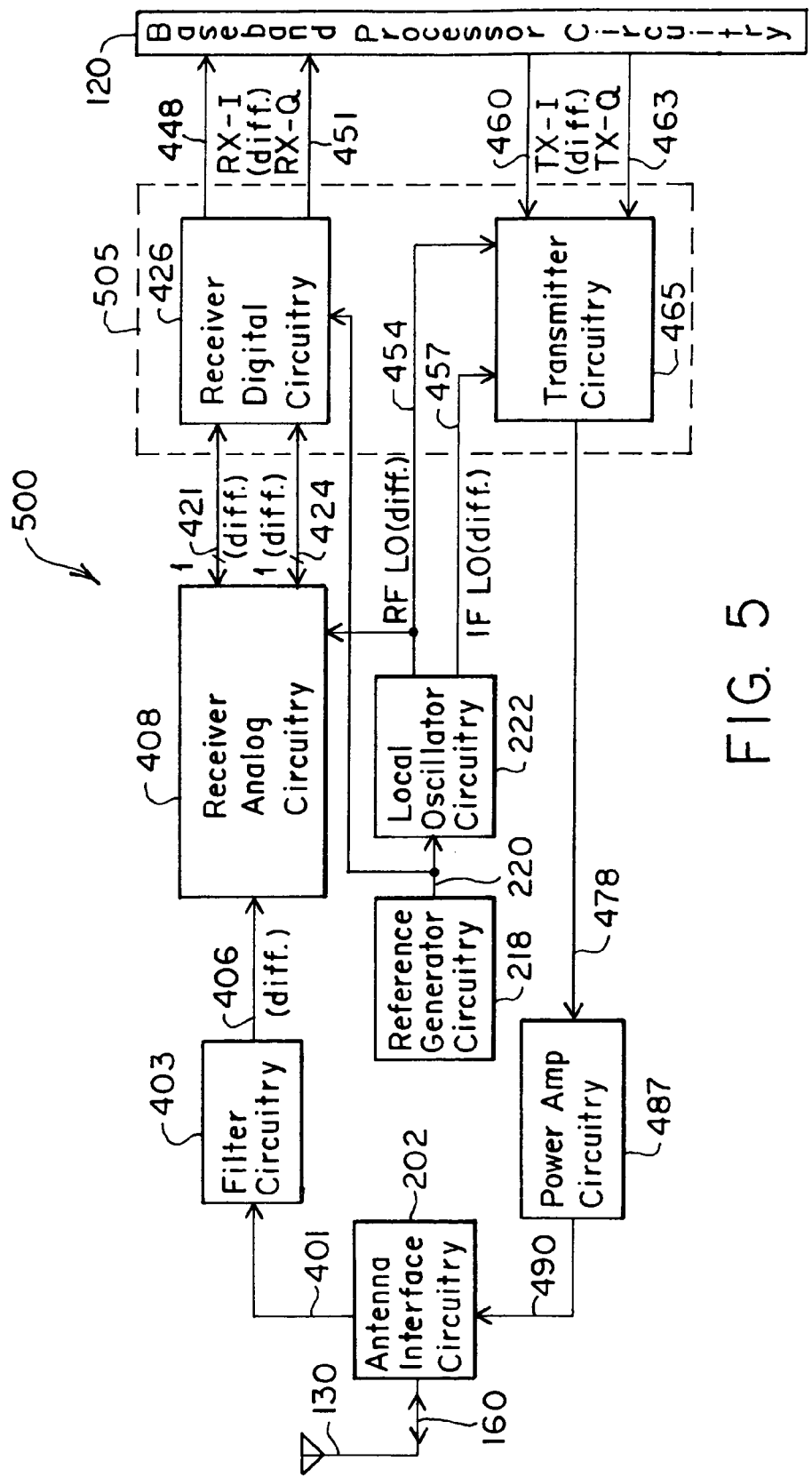
FIG. 5 illustrates an alternative technique for partitioning RF transceiver circuitry.
Figure 6:
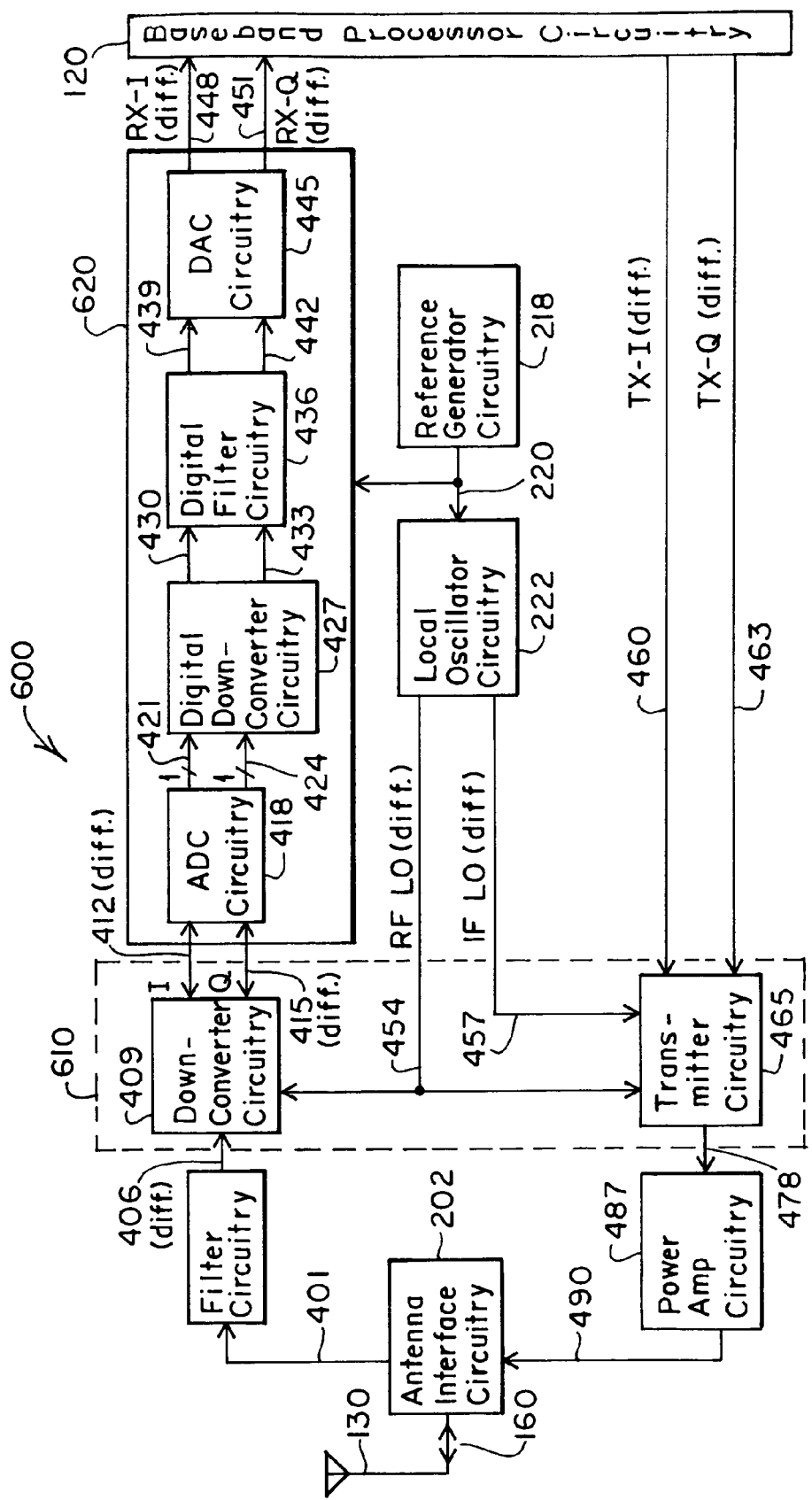
FIG. 6 shows yet another alternative technique for partitioning RF transceiver circuitry.

One may partition the RF transceiver shown in FIG. 4 in other ways. FIGS. 5 and 6 illustrate alternative partitioning of the RF transceiver of FIG. 4. FIG. 5 shows an embodiment 500 of an RF transceiver that includes three circuit partitions, or circuit blocks. A first circuit partition includes the receiver analog circuitry 408. A second circuit partition 505 includes the receiver digital circuitry 426 and the transmitter circuitry 465. As noted above, the GSM specifications provide for alternate operation of RF transceivers in receive and transmit modes. The partitioning shown in FIG. 5 takes advantage of the GSM specifications by including the receiver digital circuitry 426 and the transmitter circuitry 465 within the second circuit partition 505. A third circuit partition includes the local oscillator circuitry 222. Preferably, the first, second, and third circuit partitions each reside within an integrated circuit device. Similar to embodiment 400 in FIG. 4, the embodiment 500 in FIG. 5 uses differential signals wherever possible to further reduce interference effects among the circuit partitions.

FIG. 6 shows another alternative partitioning of an RF transceiver. FIG. 6 shows an embodiment 600 of an RF transceiver that includes three circuit partitions, or circuit blocks. A first circuit partition 610 includes part of the receiver analog circuitry, i.e., the down-converter circuitry 409, together with the transmitter circuitry 465. A second circuit partition 620 includes the ADC circuitry 418, together with the receiver digital circuitry, i.e., the digital down-converter circuitry 427, the digital filter circuitry 436, and the DAC circuitry 445. A third circuit partition includes the local oscillator circuitry 222. Preferably, the first, second, and third circuit partitions each reside within an integrated circuit device. Similar to embodiment 400 in FIG. 4, the embodiment 600 in FIG. 6 uses differential signals wherever possible to further reduce interference effects among the circuit partitions.

Figure 7:
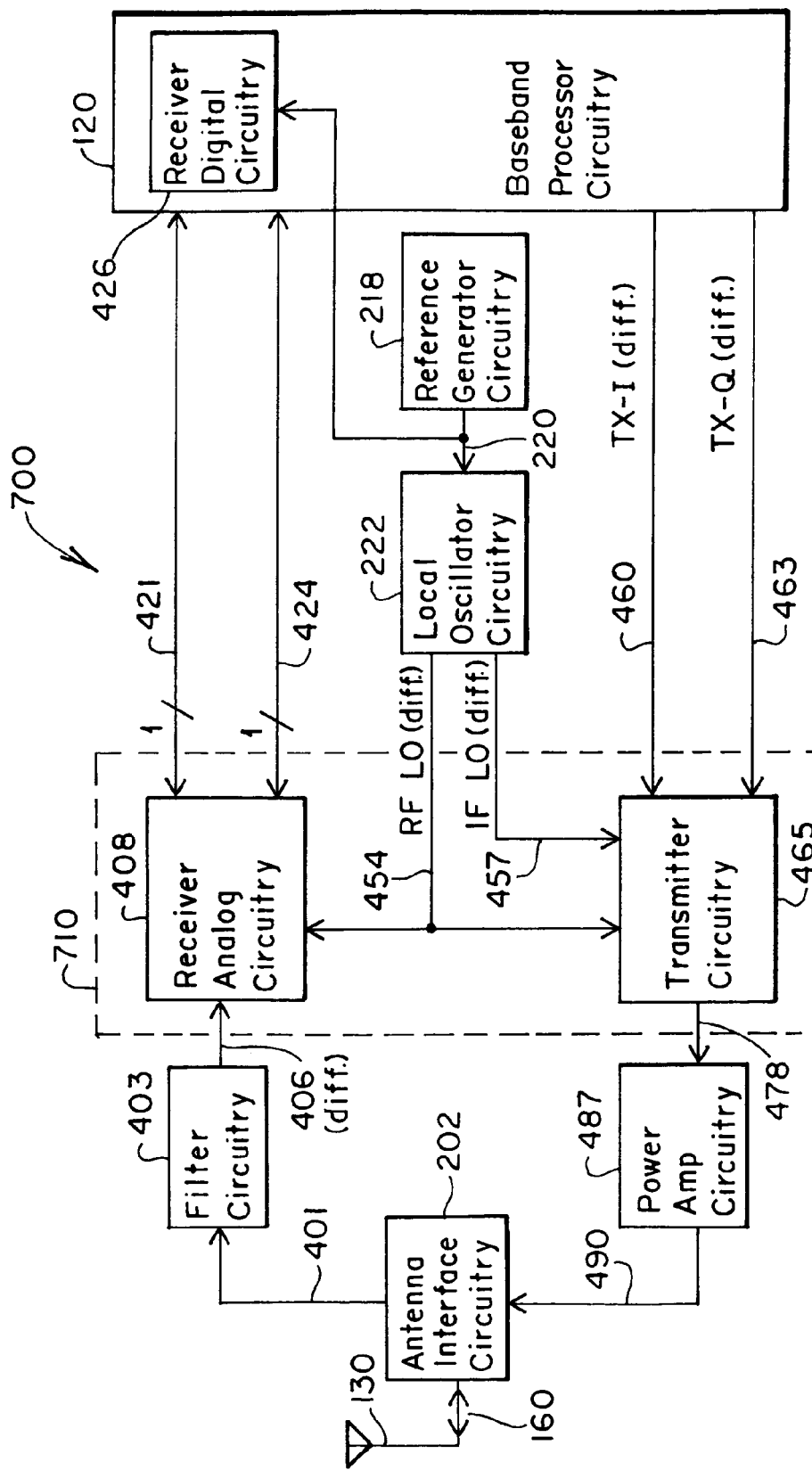
FIG. 7 depicts a more detailed block diagram of RF transceiver circuitry partitioned according to the invention, in which the receiver digital circuitry resides within the baseband processor circuitry.

FIG. 7 shows a variation of the RF transceiver shown in FIG. 4. FIG. 7 illustrates an embodiment 700 of an RF transceiver partitioned according to the invention. Note that, for the sake of clarity, FIG. 7 does not explicitly show the details of the receiver analog circuitry 408, the transmitter circuitry 465, and the receiver digital circuitry 426. The receiver analog circuitry 408, the transmitter circuitry 465, and the receiver digital circuitry 426 include circuitry similar to those shown in their corresponding counterparts in FIG. 4. Similar to the RF transceiver shown in FIG. 2D, the embodiment 700 in FIG. 7 shows an RF transceiver in which the baseband processor 120 includes the function of the receiver digital circuitry 426. The baseband processor circuitry 120 may realize the function of the receiver digital circuitry 426 using hardware, software, or a combination of hardware and software.

Because the embodiment 700 includes the function of the receiver digital circuitry 426 within the baseband processor circuitry 120, it includes two circuit partitions, or circuit blocks. A first circuit partition 710 includes the receiver analog circuitry 408 and the transmitter circuitry 465. A second circuit partition comprises the local oscillator circuitry 222. Note also that, similar to the RF transceiver shown in FIG. 2C, one may also include within the baseband processor circuitry 120 the functionality of the reference generator circuitry 218, as desired.

Figure 8:
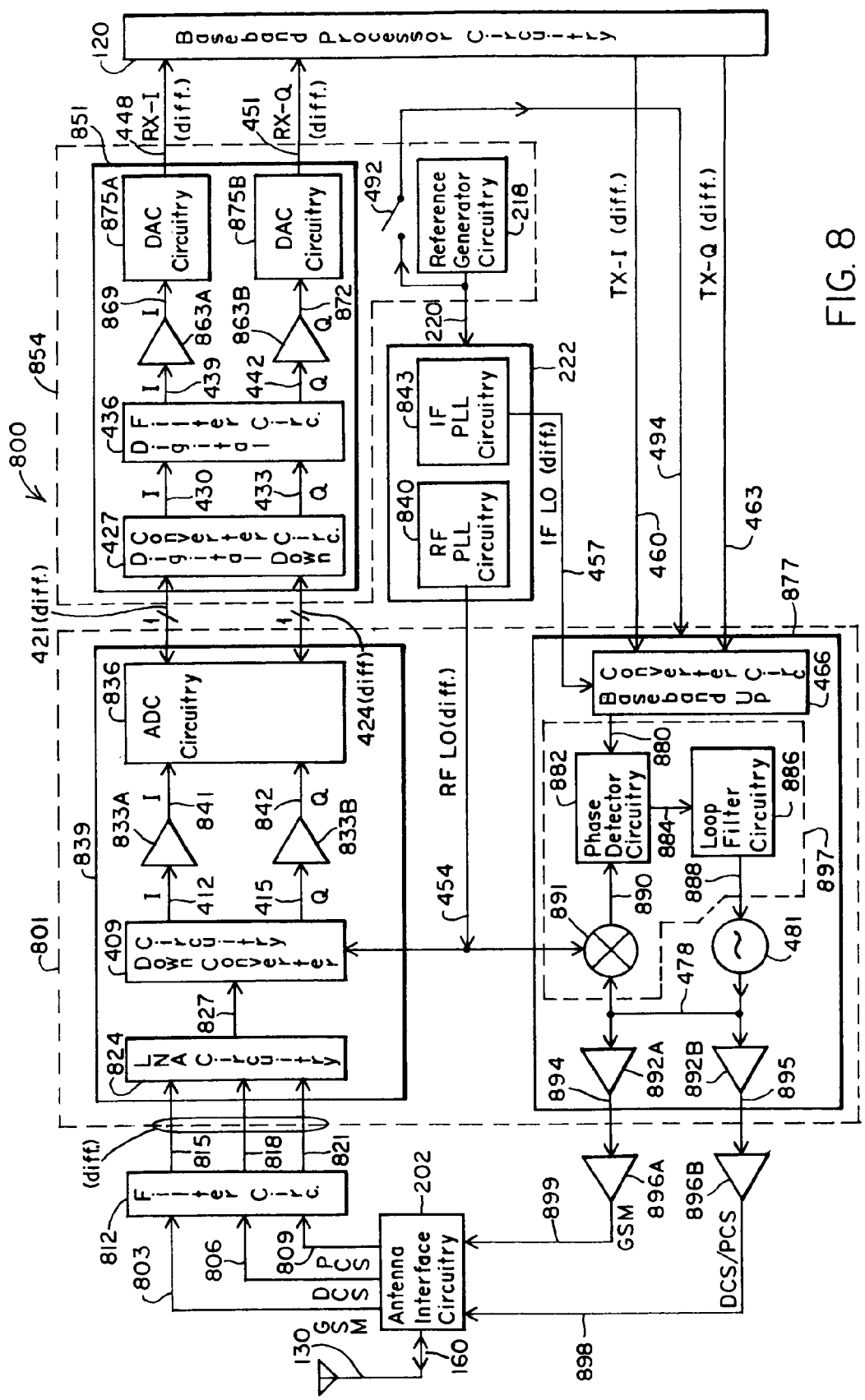
FIG. 8 illustrates a more detailed block diagram of a multi-band RF transceiver circuitry partitioned according to the invention.

FIG. 8 shows an embodiment 800 of a multi-band RF transceiver, partitioned according to the invention. Preferably, the RF transceiver in FIG. 8 operates within the GSM (925 to 960 MHz for reception and 880–915 MHz for transmission), PCS (1930 to 1990 MHz for reception and 1850–1910 MHz for transmission), and DCS (1805 to 1880 MHz for reception and 1710–1785 MHz for transmission) bands. Like the RF transceiver in FIG. 4, the RF transceiver in FIG. 8 uses a low-IF architecture. The embodiment 800 includes receiver analog circuitry 839, receiver digital circuitry 851, transmitter circuitry 877, local oscillator circuitry 222, and reference generator circuitry 218. The local oscillator circuitry 222 includes RF phase-lock loop (PLL) circuitry 840 and intermediate-frequency (IF) PLL circuitry 843. The RF PLL circuitry 840 produces the RF local oscillator, or RF LO, signal 454, whereas the IF PLL circuitry 843 produces the IF local oscillator, or IF LO, signal 457.

Table 1 below shows the preferred frequencies for the RF local oscillator signal 454 during the receive mode:

TABLE 1

| Band | RF Local Oscillator Frequency (MHz) |
| --- | --- |
| GSM | 1849.8–1919.8 |
| DCS | 1804.9–1879.9 |

TABLE 1-continued

| Band | RF Local Oscillator Frequency (MHz) |
|---|---|
| PCS | 1929.9–1989.9 |
| All Bands | 1804.9–1989.9 |

Table 2 below lists the preferred frequencies for the RF local oscillator signal 454 during the transmit mode:

TABLE 2

| Band | RF Local Oscillator Frequency (MHz) |
|---|---|
| GSM | 1279–1314 |
| DCS | 1327–1402 |
| PCS | 1423–1483 |
| All Bands | 1279–1483 |

During the receive mode, the IF local oscillator signal 457 is preferably turned off. In preferred embodiments, during the transmit mode, the IF local oscillator signal 457 preferably has a frequency between 383 MHz and 427 MHz. Note, however, that one may use other frequencies for the RF and IF local oscillator signals 454 and 457, as desired.

The reference generator 218 provides a reference signal 220 that preferably comprises a clock signal, although one may use other signals, as persons skilled in the art who have the benefit of the description of the invention understand. Moreover, the transmitter circuitry 877 preferably uses high-side injection for the GSM band and low-side injection for the DCS and PCS bands.

The receive path circuitry operates as follows. Filter circuitry 812 accepts a GSM RF signal 803, a DCS RF signal 806, and a PCS RF signal 809 from the antenna interface circuitry 202. The filter circuitry 812 preferably contains a surface-acoustic-wave (SAW) filter for each of the three bands, although one may use other types and numbers of filters, as desired. The filter circuitry 812 provides a filtered GSM RF signal 815, a filtered DCS RF signal 818, and a filtered PCS RF signal 821 to low-noise amplifier (LNA) circuitry 824. The LNA circuitry 824 preferably has programmable gain, and in part provides for programmable gain in the receive path circuitry.

The LNA circuitry 824 provides an amplified RF signal 827 to down-converter circuitry 409. In exemplary embodiments according to the invention, amplified RF signal 827 includes multiple signal lines, which may be differential signal lines, to accommodate the GSM, DCS, and PCS bands. Note that, rather than using the LNA circuitry with a real output, one may use an LNA circuitry that has complex outputs (in-phase and quadrature outputs), together with a poly-phase filter circuitry. The combination of the complex LNA circuitry and the poly-phase filter circuitry provides better image rejection, albeit with a somewhat higher loss. Thus, the choice of using the complex LNA circuitry and the poly-phase filter circuitry depends on a trade-off between image rejection and loss in the poly-phase filter circuitry.

The down-converter circuitry 409 mixes the amplified RF signal 827 with the RF local oscillator signal 454, which it receives from the RF PLL circuitry 840. The down-converter circuitry 409 produces the in-phase analog down-converted signal 412 and the quadrature in-phase analog down-converted signal 415. The down-converter circuitry 409 provides the in-phase analog down-converted signal 412 and the quadrature in-phase analog down-converted signal 415 to a pair of programmable-gain amplifiers (PGAs) 833A and 833B.

The PGA 833A and PGA 833B in part allow for programming the gain of the receive path. The PGA 833A and the PGA 833B supply an analog in-phase amplified signal 841 and an analog quadrature amplified signal 842 to complex ADC circuitry 836 (i.e., both I and Q inputs will affect both I and Q outputs). The ADC circuitry 836 converts the analog in-phase amplified signal 841 into a one-bit in-phase digital receive signal 421. Likewise, the ADC circuitry 836 converts the analog quadrature amplifier signal 842 into a one-bit quadrature digital receive signal 424.

Note that RF transceivers and receivers according to the invention preferably use a one-bit digital interface. One may, however, use a variety of other interfaces, as persons skilled in the art who have the benefit of the description of the invention understand. For example, one may use a multi-bit interface or a parallel interface. Moreover, as described below, rather than, or in addition to, providing the one-bit in-phase and quadrature digital receive signals to the receiver digital circuitry 851, the digital interface between the receiver analog circuitry 839 and the receiver digital circuitry 851 may communicate various other signals. By way of illustration, those signals may include reference signals (e.g., clock signals), control signals, logic signals, hand-shaking signals, data signals, status signals, information signals, flag signals, and/or configuration signals. Furthermore, the signals may constitute single-ended or differential signals, as desired. Thus, the interface provides a flexible communication mechanism between the receiver analog circuitry and the receiver digital circuitry.

The receiver digital circuitry 851 accepts the one-bit in-phase digital receive signal 421 and the one-bit quadrature digital receive signal 424, and provides them to the digital down-converter circuitry 427. The digital down-converter circuitry 427 converts the received signals into a down-converted in-phase signal 430 and a down-converted quadrature signal 433 and provides those signals to the digital filter circuitry 436. The digital filter circuitry 436 preferably comprises an IIR channel-select filter that performs filtering operations on its input signals. Note, however, that one may use other types of filters, for example, FIR filters, as desired.

The digital filter circuitry 436 provides the digital in-phase filtered signal 439 to a digital PGA 863A and the digital quadrature filtered signal 442 to a digital PGA 863B. The digital PGA 863A and PGA 863B in part allow for programming the gain of the receive path circuitry. The digital PGA 863A supplies an amplified digital in-phase signal 869 to DAC circuitry 875A, whereas the digital PGA 863B supplies an amplified digital quadrature signal 872 to DAC circuitry 875B. The DAC circuitry 875A converts the amplified digital in-phase signal 869 to the in-phase analog receive signal 448. The DAC circuitry 875B converts the amplified digital quadrature signal 872 signal into the quadrature analog receive signal 451. The baseband processor circuitry 120 accepts the in-phase analog receive signal 448 and the quadrature analog receive signal 451 for further processing, as desired.

Note that the digital circuit blocks shown in the receiver digital circuitry 851 depict mainly the conceptual functions and signal flow. The actual digital-circuit implementation may or may not contain separately identifiable hardware for the various functional blocks. For example, one may re-use (in time, for instance, by using multiplexing) the same digital circuitry to implement both digital PGA 863A and digital PGA 863B, as desired.

Note also that, similar to the RF transceiver in FIG. 4, the RF transceiver in FIG. 8 features a digital-IF architecture. The digital-IF architecture facilitates the implementation of the one-bit digital interface between the receiver digital circuitry 426 and the receiver analog circuitry 408. Moreover, the digital-IF architecture allows digital (rather than analog) IF-filtering, thus providing all of the advantages of digital filtering.

The transmitter circuitry 877 comprises baseband up-converter circuitry 466, transmit VCO circuitry 481, a pair of transmitter output buffers 892A and 892B, and offset PLL circuitry 897. The offset PLL circuitry 897 includes offset mixer circuitry 891, phase detector circuitry 882, and loop filter circuitry 886. The baseband up-converter circuitry 466 accepts the analog in-phase transmit input signal 460 and the analog quadrature transmit input signal 463, mixes those signals with the IF local oscillator signal 457, and provides a transmit IF signal 880 to the offset PLL circuitry 897. The offset PLL circuitry 897 uses the transmit IF signal 880 as a reference signal. The transmit IF signal 880 preferably comprises a modulated single-sideband IF signal but, as persons skilled in the art who have the benefit of the description of the invention understand, one may use other types of signal and modulation, as desired.

The offset mixer circuitry 891 in the offset PLL circuitry 897 mixes the transmit VCO output signal 478 with the RF local oscillator signal 454, and provides a mixed signal 890 to the phase detector circuitry 882. The phase detector circuitry 882 compares the mixed signal 890 to the transmit IF signal 880 and provides an offset PLL error signal 884 to the loop filter circuitry 886. The loop filter circuitry 886 in turn provides a filtered offset PLL signal 888 to the transmit VCO circuitry 481. Thus, the offset PLL circuitry 897 and the transmit VCO circuitry 481 operate in a feedback loop. Preferably, the output frequency of the transmit VCO circuitry 481 centers between the DCS and PCS bands, and its output is divided by two for the GSM band.

Transmitter output buffers 892A and 892B receive the transmit VCO output signal 478 and provide buffered transmit signals 894 and 895 to a pair of power amplifiers 896A and 896B. The power amplifiers 896A and 896B provide amplified RF signals 899 and 898, respectively, for transmission through antenna interface circuitry 202 and the antenna 130. Power amplifier 896A provides the RF signal 899 for the GSM band, whereas power amplifier 896B supplies the RF signal 898 for the DCS and PCS bands. Persons skilled in the art who have the benefit of the description of the invention, however, understand that one may use other arrangements of power amplifiers and frequency bands. Moreover, one may use RF filter circuitry within the output path of the transmitter circuitry 877, as desired.

The embodiment 800 comprises three circuit partitions, or circuit blocks. A first circuit partition 801 includes the receiver analog circuitry 839 and the transmitter circuitry 877. A second circuit partition 854 includes the receiver digital circuitry 851 and the reference generator circuitry 218. Finally, a third circuit partition comprises the local oscillator circuitry 222. The first circuit partition 801, the second circuit partition 854, and the third circuit partition are partitioned from one another so that interference effects among the circuit partitions tend to be reduced. That arrangement tends to reduce the interference effects among the circuit partitions because of the analysis of interference effects provided above in connection with FIG. 3. Preferably, the first, second, and third circuit partitions each reside within an integrated circuit device. To further reduce interference effects among the circuit partitions, the embodiment 800 in FIG. 8 uses differential signals wherever possible. The notation "(diff.)" adjacent to signal lines or reference numerals in FIG. 8 denotes the use of differential lines to propagate the annotated signals.

Note that, similar to the RF transceiver shown in FIG. 4 and described above, the embodiment 800 shown in FIG. 8 uses an analog-digital-analog signal path in its receiver section. The embodiment 800 uses this particular signal path for reasons similar to those described above in connection with the transceiver shown in FIG. 4.

Like the transceiver in FIG. 4, if the receiver digital circuitry 851 need not be compatible with the common analog interface to baseband processors, one may remove the DAC circuitry 875A and 875B, and use a digital interface to the baseband processor circuitry 120, as desired. In fact, similar to the RF transceiver shown in FIG. 2D, one may realize the function of the receiver digital circuitry 851 within the baseband processor circuitry 120, using hardware, software, or a combination of hardware and software. In that case, the RF transceiver would include two circuit partitions, or circuit blocks. The first circuit partition 801 would include the receiver analog circuitry 839 and the transmitter circuitry 877. A second circuit partition would comprise the local oscillator circuitry 222. Note also that, similar to the RF transceiver shown in FIG. 2C, in the embodiment 800, one may include within the baseband processor circuitry 120 the functionality of the reference generator circuitry 218, as desired.

Another aspect of the invention includes a configurable interface between the receiver digital circuitry and the receiver analog circuitry. Generally, one would seek to minimize digital switching activity within the receiver analog circuitry. Digital switching activity within the receiver analog circuitry would potentially interfere with the sensitive analog RF circuitry, for example, LNAs, or mixers. As described above, the receiver analog circuitry includes analog-to-digital circuitry (ADC), which preferably comprises sigma-delta-type ADCs. Sigma-delta ADCs typically use a clock signal at their output stages that generally has a pulse shape and, thus, contains high-frequency Fourier series harmonics. Moreover, the ADC circuitry itself produces digital outputs that the receiver digital circuitry uses. The digital switching present at the outputs of the ADC circuitry may also interfere with sensitive analog circuitry within the receiver analog circuitry.

Figure 9A:
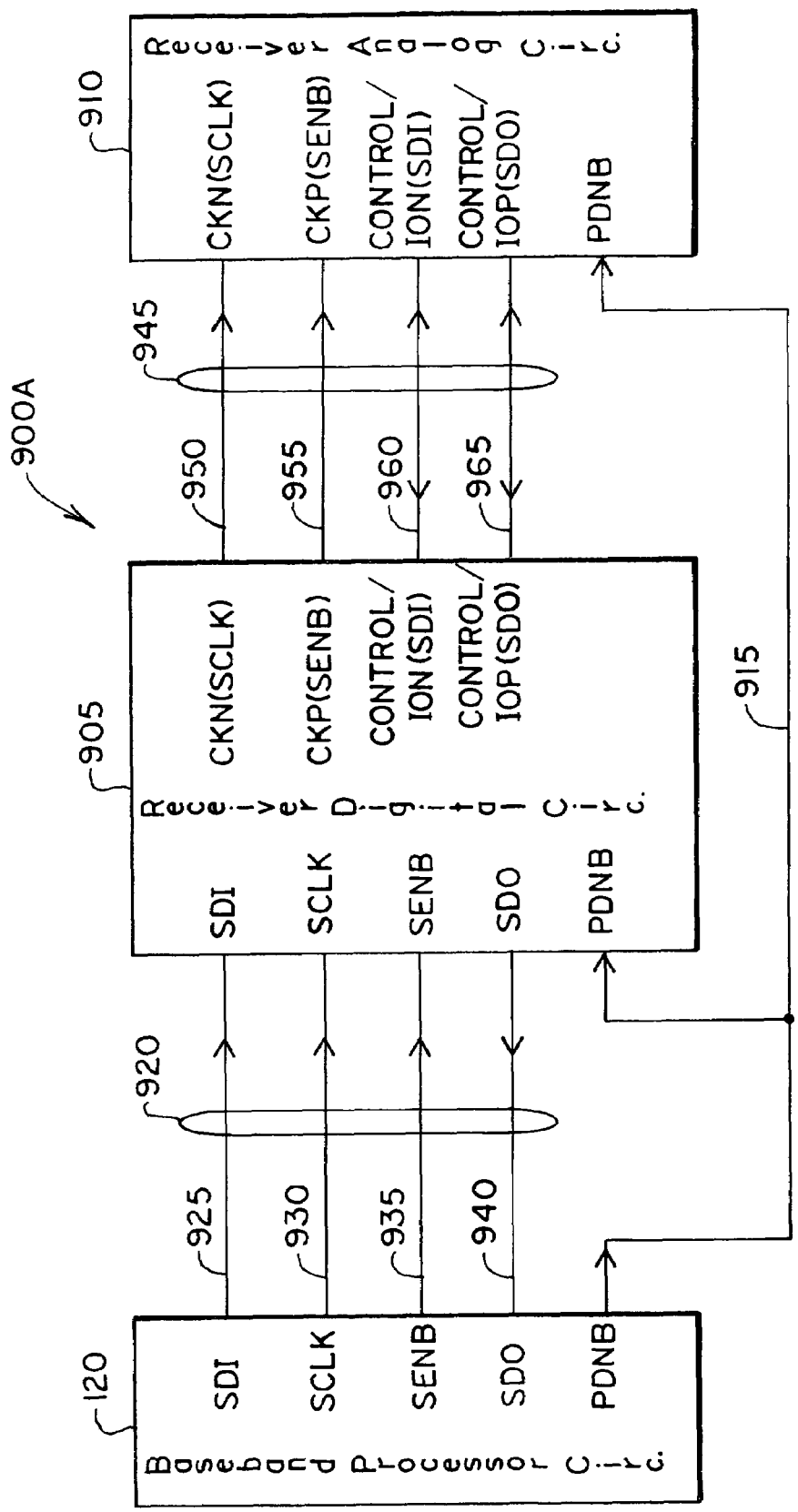
FIG. 9A shows a block diagram of an embodiment of the interface between the receiver digital circuitry and receiver analog circuitry in an RF transceiver according to the invention.

The invention contemplates providing RF apparatus according to the invention, for example, receivers and transceivers, that include an interface circuitry to minimize or reduce the effects of interference from digital circuitry within the RF apparatus. FIG. 9A shows an embodiment 900A of an interface between the receiver digital circuitry 905 and the receiver analog circuitry 910. The interface includes configurable interface signal lines 945. The baseband processor circuitry 120 in the transceiver of FIG. 9A communicates configuration, status, and setup information with both the receiver digital circuitry 905 and the receiver analog circuitry 910. In the preferred embodiments of RF transceivers according to the invention, the baseband processor circuitry 120 communicates with the receiver digital circuitry 905 and the receiver analog circuitry 910 by sending configuration data to read and write registers included within the receiver digital circuitry 905 and the receiver analog circuitry 910.

The receiver digital circuitry 905 communicates with the baseband processor circuitry 120 through a set of serial interface signal lines 920. The serial interface signal lines 920 preferably include a serial data-in (SDI) signal line 925, a serial clock (SCLK) signal line 930, a serial interface enable (SENB) signal line 935, and a serial data-out (SDO) signal line 940. The transceiver circuitry and the baseband processor circuitry 120 preferably hold all of the serial interface signal lines 920 at static levels during the transmit and receive modes of operation. The serial interface preferably uses a 22-bit serial control word that comprises 6 address bits and 16 data bits. Note, however, that one may use other serial interfaces, parallel interfaces, or other types of interfaces, that incorporate different numbers of signal lines, different types and sizes of signals, or both, as desired. Note also that, the SENB signal is preferably an active-low logic signal, although one may use a normal (i.e., an active-high) logic signal by making circuit modifications, as persons skilled in the art understand.

The receiver digital circuitry 905 communicates with the receiver analog circuitry 910 via configurable interface signal lines 945. Interface signal lines 945 preferably include four configurable signal lines 950, 955, 960, and 965, although one may use other numbers of configurable signal lines, as desired, depending on a particular application. In addition to supplying the serial interface signals 920, the baseband processor circuitry 120 provides a control signal 915, shown as a power-down (PDNB) signal in FIG. 9A, to both the receiver digital circuitry 905 and the receiver analog circuitry 910. The receiver digital circuitry 905 and the receiver analog circuitry 910 preferably use the power-down (PDNB) signal as the control signal 915 to configure the functionality of the interface signal lines 945. In other words, the functionality of the interface signal lines 945 depends on the state of the control signal 915. Also, the initialization of the circuitry within the receive path and the transmit path of the transceiver occurs upon the rising edge of the PDNB signal. Note that the PDNB signal is preferably an active-low logic signal, although one may use a normal (i.e., an active-high) logic signal, as persons skilled in the art would understand. Note also that, rather than using the PDNB signal, one may use other signals to control the configuration of the interface signal lines 945, as desired.

In the power-down or serial interface mode (i.e., the control signal 915 (for example, PDNB) is in the logic low state), interface signal line 950 provides the serial clock (SCLK) and interface signal line 955 supplies the serial interface enable signal (SENB). Furthermore, interface signal line 960 provides the serial data-in signal (SDI), whereas interface signal line 965 supplies the serial data-out (SDO) signal. One may devise other embodiments according to the invention in which, during this mode of operation, the transceiver may also perform circuit calibration and adjustment procedures, as desired (for example, the values of various transceiver components may vary over time or among transceivers produced in different manufacturing batches. The transceiver may calibrate and adjust its circuitry to take those variations into account and provide higher performance).

In the normal receive mode of operation (i.e., the control signal, PDNB, is in the logic-high state), interface signal line 950 provides a negative clock signal (CKN) and interface signal line 955 supplies the positive clock signal (CKP). Furthermore, interface signal line 960 provides a negative data signal (ION), whereas interface signal line 965 supplies a positive data signal (IOP).

In preferred embodiments of the invention, the CKN and CKP signals together form a differential clock signal that the receiver digital circuitry 905 provides to the receiver analog circuitry 910. The receiver analog circuitry 910 may provide the clock signal to the transmitter circuitry within the RF transceiver in order to facilitate calibration and adjustment of circuitry, as described above. During the receive mode, the receiver analog circuitry 910 provides the ION and IOP signals to the receiver digital circuitry 905. The ION and IOP signals preferably form a differential data signal. As noted above, the transceiver disables the transmitter circuitry during the receive mode of operation.

In preferred embodiments according to the invention, clock signals CKN and CKP are turned off when the transmitter circuitry is transmitting signals. During the transmit mode, interface signal lines 960 and 965 preferably provide two logic signals from the receiver digital circuitry 905 to the receiver analog circuitry 910. The signal lines may provide input/output signals to communicate data, status, information, flag, and configuration signals between the receiver digital circuitry 905 and the receiver analog circuitry 910, as desired. Preferably, the logic signals control the output buffer of the transmit VCO circuitry. Note that, rather than configuring interface signal lines 960 and 965 as logic signal lines, one may configure them in other ways, for example, analog signal lines, differential analog or digital signal lines, etc., as desired. Furthermore, the interface signal lines 960 and 965 may provide signals from the receiver digital circuitry 905 to the receiver analog circuitry 910, or vice-versa, as desired.

In addition to using differential signals, RF transceivers according to the invention preferably take other measures to reduce interference effects among the various transceiver circuits. Signals CKN, CKP, ION, and IOP may constitute voltage signals, as desired. Depending on the application, the signals CKN, CKP, ION, and IOP (or logic signals in the transmit mode) may have low voltage swings (for example, voltage swings smaller than the supply voltage) to reduce the magnitude and effects of interference because of the voltage switching on those signals.

In preferred embodiments according to the invention, signals CKN, CKP, ION, and IOP constitute current, rather than voltage, signals. Moreover, to help reduce the effects of interference even further, RF transceivers according to the invention preferably use band-limited signals. RF transceivers according to the invention preferably use filtering to remove some of the higher frequency harmonics from those signals to produce band-limited current signals.

Table 3 below summarizes the preferred functionality of the configurable interface signal lines 950, 955, 960, and 965 as a function of the state of the control signal 915 (for example, PDNB):

TABLE 3

| Signal Line | Control = 0 | Control = 1 (During Reception) | Control = 1 (During Transmission) |
| --- | --- | --- | --- |
| 950 | SCLK | CKN | (CKN off) |
| 955 | SENB | CKP | (CKP off) |
| 960 | SDI | ION | Logic Signal |
| 965 | SDO | IOP | Logic Signal |

Using configurable interface signal lines 945 in the interface between the receiver digital circuitry 905 and the receiver analog circuitry 910 allows using the same physical connections (e.g., pins on an integrated-circuit device or electrical connectors on a module) to accomplish different functionality. Thus, the configurable interface between the receiver digital circuitry 905 and the receiver analog circuitry 910 makes available the physical electrical connections available for other uses, for example, providing ground pins or connectors around sensitive analog signal pins or connectors to help shield those signals from RF interference. Moreover, the configurable interface between the receiver digital circuitry 905 and the receiver analog circuitry 910 reduces packaging size, cost, and complexity.

Figure 9B:
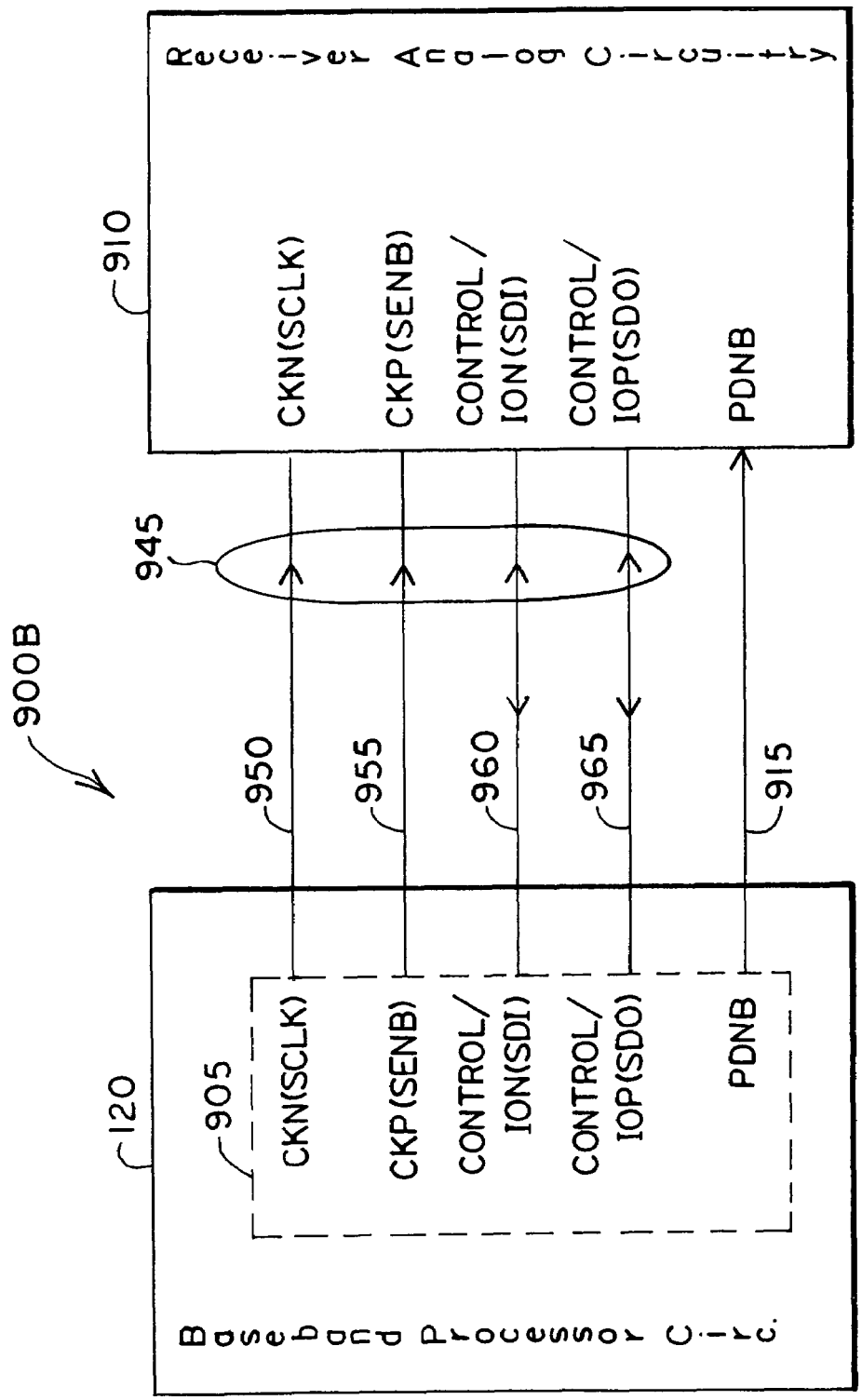
FIG. 9B depicts a block diagram of another embodiment of the interface between the baseband processor circuitry and the receiver analog circuitry in an RF transceiver according to the invention, in which the receiver digital circuitry resides within the baseband processor circuitry.

FIG. 9B shows an embodiment 900B that includes a configurable interface according to the invention. Here, the baseband processor circuitry 120 subsumes the functionality of the receiver digital circuitry 905. The baseband processor circuitry 120 realizes the functionality of the receiver digital circuitry 905, using hardware, software, or both, as desired. Because the baseband processor circuitry 120 has subsumed the receiver digital circuitry 905, the baseband processor circuitry 120 may communicate with the receiver analog circuitry 910 using configurable interface signal lines 945, depending on the state of the control signal 915 (e.g., the PDNB signal). The configurable interface signal lines 945 perform the same functions described above in connection with FIG. 9A, depending on the state of the control signal 915. As noted above, one may reconfigure the interface signal lines 960 and 965 during transmit mode to implement desired functionality, for example, logic signals.

Figure 10:
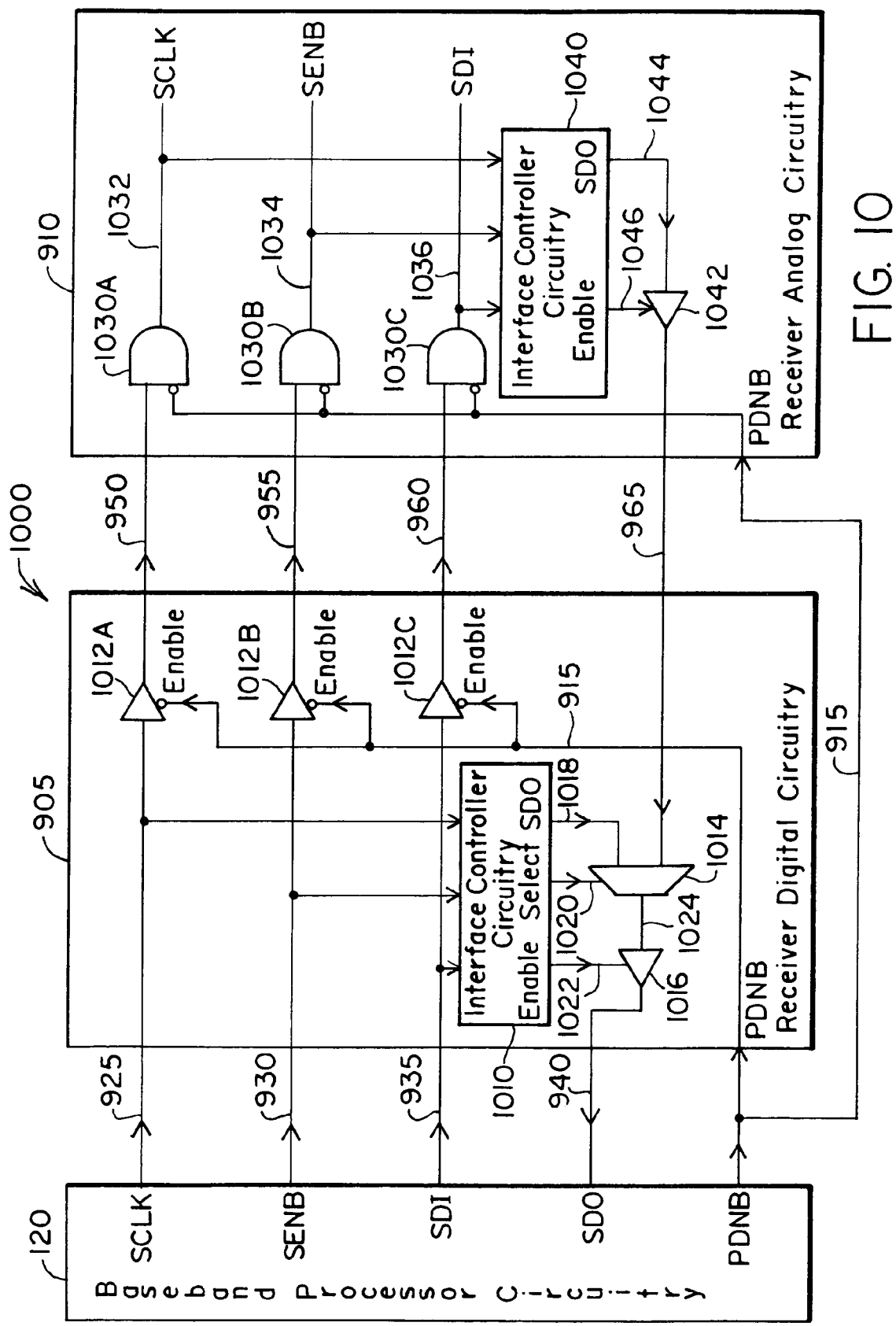
FIG. 10 illustrates a more detailed block diagram of the interface between the receiver analog circuitry and the receiver digital circuitry, with the interface configured as a serial interface.

FIG. 10 shows a conceptual block diagram of an embodiment 1000 of a configurable interface according to the invention within an RF transceiver in the power-down or serial interface mode (i.e., the control signal 915 is in a logic-low state). A logic low state on the control signal 915 enables the driver circuitry 1012A, 1012B, and 1012C, thus providing the configurable serial interface signal lines 950, 955, and 960 to the receiver analog circuitry 910. Similarly, the logic low state on the control signal 915 causes the AND gates 1030A, 1030B, and 1030C to provide configurable interface signal lines 950, 955, and 960 to other circuitry within the receiver analog circuitry 910. The outputs of the AND gates 1030A, 1030B, and 1030C comprise a gated SCLK signal 1032, a gated SENB signal 1034, and a gated SDI signal 1036, respectively.

Interface controller circuitry 1040 accepts as inputs the gated SCLK signal 1032, the gated SENB signal 1034, and the gated SDI signal 1036. The interface controller circuitry 1040 resides within the receiver analog circuitry 910 and produces a receiver analog circuitry SDO signal 1044 and an enable signal 1046. By controlling tri-state driver circuitry 1042, the enable signal 1046 controls the provision of the receiver analog circuitry SDO signal 1044 to the receiver digital circuitry 905 via the configurable interface signal line 965.

Interface controller circuitry 1010 within the receiver digital circuitry 905 accepts the SCLK signal 925, the SENB signal 930, and the SDI signal 935 from the baseband processor circuitry 120. By decoding those signals, the interface controller circuitry 1010 determines whether the baseband processor circuitry 120 intends to communicate with the receiver digital circuitry 905 (e.g., the baseband processor circuitry 120 attempts to read a status or control register present on the receiver digital circuitry 905). If so, the interface controller circuitry 1010 provides the SCLK signal 925, the SENB signal 930, and the SDI signal 935 to other circuitry (not shown explicitly) within the receiver digital circuitry 905 for further processing.

Interface controller circuitry 1010 provides as output signals a receiver digital circuitry SDO signal 1018, a select signal 1020, and an enable signal 1022. The receiver digital circuitry SDO signal 1018 represents the serial data-out signal for the receiver digital circuitry 905, i.e., the serial data-out signal that the receiver digital circuitry 905 seeks to provide to the baseband processor circuitry 120. The interface controller circuitry 1010 supplies the select signal 1020 to multiplexer circuitry 1014. The multiplexer circuitry 1014 uses that signal to selectively provide as the multiplexer circuitry output signal 1024 either the receiver digital circuitry SDO signal 1018 or the receiver analog circuitry SDO signal 1044, which it receives through configurable interface signal line 965. Tri-state driver circuitry 1016 provides the multiplexer circuitry output signal 1024 to the baseband processor circuitry 120 under the control of the enable signal 1022.

Tri-state driver circuitry 1012A, 1012B, and 1012C use an inverted version of the control signal 915 as their enable signals. Thus, a logic high value on the control signal 915 disables the driver circuitry 1012A, 1012B, and 1012C, thus disabling the serial interface between the receiver digital circuitry 905 and the receiver analog circuitry 910. Similarly, AND gates 1030A, 1030B, and 1030C use an inverted version of the control signal 915 to gate interface signal lines 950, 955, and 960. In other words, a logic high value on the control signal 915 inhibits logic switching at the outputs of AND gates 1030A, 1030B, and 1030C, which reside on the receiver analog circuitry 910.

Figure 11A:
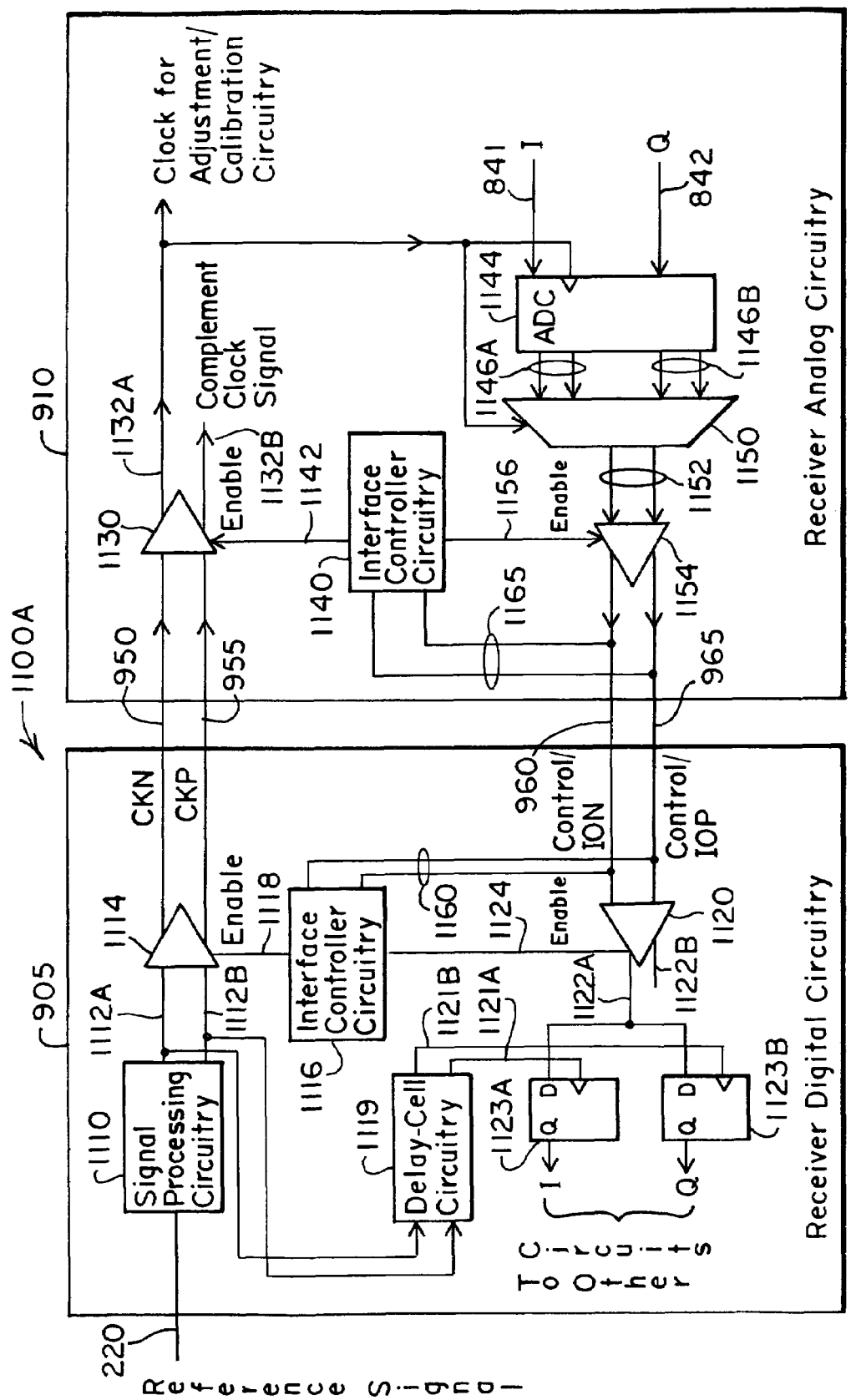
FIG. 11A shows a more detailed block diagram of an embodiment of the interface between the receiver analog circuitry and the receiver digital circuitry, with the interface configured as a data and clock signal interface.

FIG. 11A shows a conceptual block diagram of an embodiment 1100A of a configurable interface according to the invention, in an RF transceiver operating in the normal receive mode of operation (i.e., the control signal 915 is in a logic-high state). As noted above, in this mode, the receiver digital circuitry 905 provides a clock signal to the receiver analog circuitry 910 through the configurable interface signal lines 950 and 955. Configurable interface signal line 950 provides the CKN signal, whereas configurable interface signal line 955 supplies the CKP signal. Also in this mode, the receiver analog circuitry 910 provides a data signal to the receiver digital circuitry 905 through the configurable interface signal lines 960 and 965.

The receiver digital circuitry 905 provides the CKN and CKP signals to the receiver analog circuitry 910 by using clock driver circuitry 1114. The clock driver circuitry 1114 receives a clock signal 1112A and a complement clock signal 1112B from signal processing circuitry 1110. Signal processing circuitry 1110 receives the reference signal 220 and converts it to the clock signal 1112A and complement clock signal 1112B. Interface controller circuitry 1116 provides an enable signal 1118 that controls the provision of the CKN and CKP clock signals to the receiver analog circuitry 910 via the interface signal lines 950 and 955, respectively.

Receiver analog circuitry 910 includes clock receiver circuitry 1130 that receives the CKN and CKP clock signals and provides a clock signal 1132A and a complement clock signal 1132B. Interface controller circuitry 1140 within the receiver analog circuitry 910 provides an enable signal 1142 that controls the operation of the clock receiver circuitry 1130.

The clock signal 1132A clocks the ADC circuitry 1144, or other circuitry (for example, calibration circuitry), or both, as desired. Note that, rather than using the clock signal 1132A, one may use the complement clock signal 1132B, or both the clock signal 1132A and the complement clock signal 1132B, by making circuit modifications as persons skilled who have the benefit of the description of the invention understand. The ADC circuitry 1144 provides to multiplexer circuitry 1150 a one-bit differential in-phase digital signal 1146A and a one-bit differential quadrature digital signal 1146B. The multiplexer circuitry 1150 provides a one-bit differential digital output signal 1152 to data driver circuitry 1154. The output signal 1152 therefore constitutes multiplexed I-channel data and Q-channel data. The data driver circuitry 1154 supplies the differential data signal comprising ION and IOP to the receiver digital circuitry 905, using the configurable interface signal lines 960 and 965, respectively.

The clock signal 1132A also acts as the select signal of multiplexer circuitry 1150. On alternating edges of the clock signal 1132A, the multiplexer circuitry 1150 selects, and provides to, the data driver circuitry 1154 the one-bit differential in-phase digital signal 1146A (i.e., I-channel data) and the one-bit differential quadrature digital signal 1146B (i.e., Q-channel data). The interface controller circuitry 1140 supplies an enable signal 1156 to the data driver circuitry 1154 that controls the provision of the configurable interface signal 960 and the configurable interface signal 965 to the receiver digital circuitry 905 via the configurable interface signal lines 960 and 965.

The receiver digital circuitry 905 includes data receiver circuitry 1120. Data receiver circuitry 1120 accepts from the receiver analog circuitry 910 the signals provided via the configurable interface signal lines 960 and 965. The data receiver circuitry 1120 provides a pair of outputs 1122A and 1122B. An enable signal 1124, supplied by the interface controller circuitry 1116, controls the operation of the data receiver circuitry 1120.

The receiver digital circuitry 905 also includes a delay-cell circuitry 1119 that accepts as its inputs the clock signal 1112A and the complement clock signal 1112B. The delay-cell circuitry 1119 constitutes a delay-compensation circuit. In other words, ideally, the signal-propagation delay of the delay-cell circuitry 1119 compensates for the delays the signals experience as they propagate from the receiver digital circuitry 905 to the receiver analog circuitry 910, and back to the receiver digital circuitry 905.

The delay-cell circuitry 1119 provides as its outputs a clock signal 1121A and a complement clock signal 1121B. The clock signal 1121A and the complement clock signal 1121B clock a pair of D flip-flop circuitries 1123A and 1123B, respectively. The D flip-flop circuitries 1123A and 1123B latch the output 1122A of the data receiver circuitry 1120 alternately. In other words, the clock signal 1121A causes the latching of the I-channel data by the D flip-flop circuitry 1123A, whereas the complement clock signal 1121B causes the D flip-flop circuitry 1123B to latch the Q-channel data.

The output signals of the delay-cell circuitry 1119 help the receiver digital circuitry 905 to sample the I-channel data and the Q-channel data that it receives from the receiver analog circuitry 910. The receiver digital circuitry 905 receives multiplexed I-channel data and the Q-channel data through the ION signal 960 and the IOP signal 965. Thus, the D flip-flop circuitries 1123A and 1123B perform a de-multiplexing function on the multiplexed I-channel data and Q-channel data.

In the normal receive or transmit modes, (i.e., the control signal 915 is in the logic-high state), interface signal line 950 provides the negative clock signal (CKN) and interface signal line 955 supplies the positive clock signal (CKP). In preferred embodiments of the invention, the CKN and CKP signals together form a differential clock signal that the receiver digital circuitry 905 provides to the receiver analog circuitry 910.

During the receive mode, interface signal line 960 provides the negative data signal (ION), whereas interface signal line 965 supplies the positive data signal (IOP). The ION and IOP signals preferably form a differential data signal.

In the transmit mode, the data signal may function as an input/output signal to communicate data, status, information, flag, and/or configuration signals between the receiver digital circuitry 905 and the receiver analog circuitry 910. Preferably, the interface signal lines 960 and 965 function as two logic signal lines in the transmit mode. As noted above, the transceiver disables the receiver circuitry during the transmit mode of operation. In RF transceivers partitioned according to the invention (see, e.g., FIGS. 2A–2D, 4, and 8), the clock receiver circuitry 1130 may provide the clock signal 1132A, the complement clock signal 1132B, or both, to transmitter circuitry (partitioned together with the receiver analog circuitry 910) for circuit calibration, circuit adjustment, and the like, as described above.

In the transmit mode, once circuit calibration and adjustment has concluded, however, the clock driver circuitry 1114 uses the enable signal 1118 to inhibit the propagation of the CKN and CKP clock signals to the receiver analog circuitry 910. In this manner, the clock driver circuitry 1114 performs the function of the switch 492 in FIGS. 4 and 8. Note that, during the normal transmit mode of operation, the ADC circuitry 1144 does not provide any data to the receiver digital circuitry 905 via the ION and IOP signals because, according to the TDD protocol, the receiver path circuitry is inactive during the normal transmit mode of operation. Instead, the receiver digital circuitry 905 provides control signals to the receiver analog circuitry 910 via interface signal lines 960 and 965.

During the transmit mode, the interface controller circuitry 1116 provides control signals via signal lines 1160 to the interface signal lines 960 and 965. The interface controller circuitry 1140 receives the control signals via signal lines 1165 and provides them to various blocks within the receiver analog circuitry, as desired. During the receive mode, the interface controller circuitry 1116 inhibits (e.g., high-impedance state) the signal lines 1160. Similarly, the interface controller circuitry 1140 inhibits the signal lines 1165 during the receive mode.

For the purpose of conceptual illustration, FIG. 11A shows the interface controller circuitry 1116 and the interface controller circuitry 1140 as two blocks of circuitry distinct from the interface controller circuitry 1010 and the interface controller circuitry 1040 in FIG. 10, respectively. One may combine the functionality of the interface controller circuitry 1116 with the functionality of the interface controller circuitry 1010, as desired. Likewise, one may combine the functionality of interface controller circuitry 1140 with the functionality of the interface controller circuitry 1040, as desired. Moreover, one may combine the functionality of the signal processing circuitries 1110 with the functionality of the interface controller circuitry 1116 and the interface controller circuitry 1140, respectively. Combining the functionality of those circuits depends on various design and implementation choices, as persons skilled in the art understand.

Figure 11B:
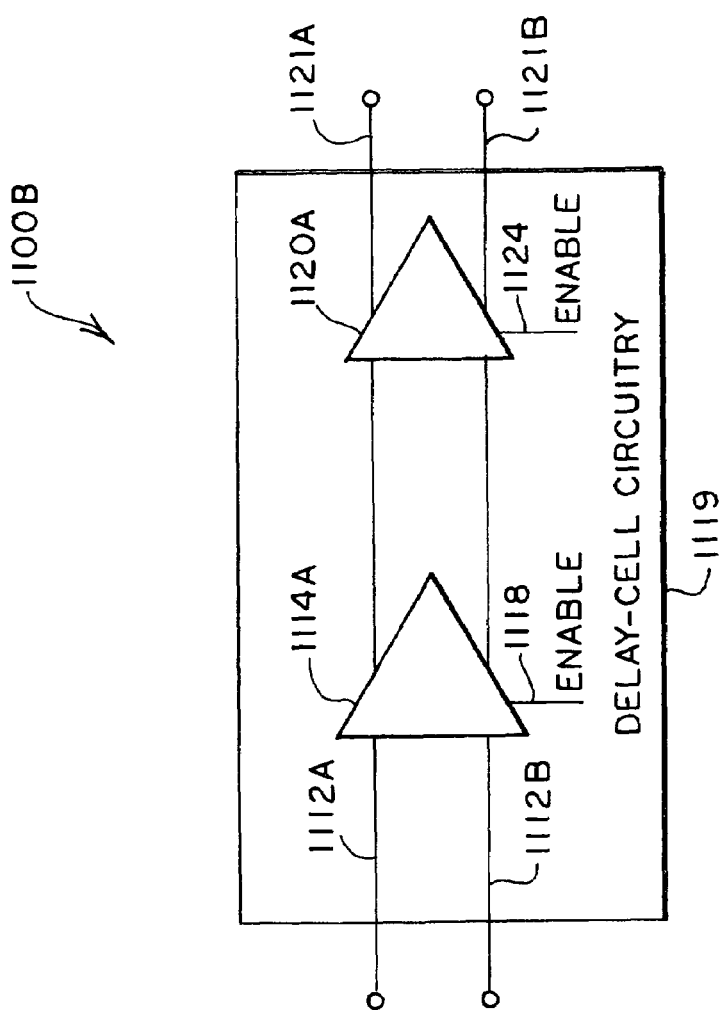
FIG. 11B illustrates a block diagram of an embodiment of a delay-cell circuitry that includes a clock driver circuitry in tandem with a clock receiver circuitry.

FIG. 11B illustrates a block diagram of a preferred embodiment 1100B of a delay-cell circuitry 1119 according to the invention. The delay-cell circuitry 1119 includes a replica of the clock driver circuitry 1114A in tandem with a replica of the data receiver circuitry 1120A. In other words, the block labeled "1114A" is a replica of the clock driver circuitry 1114, and the block labeled "1120A" is a replica of the data receiver circuitry 1120. (Note that the delay-cell circuitry 1119 may alternatively include a replica of the data driver circuitry 1154 in tandem with a replica of the clock receiver circuitry 1130.) The replica of the clock driver circuitry 1114A accepts the clock signal 1112A and the complement clock signal 1112B. The replica of the clock driver circuitry 1114A provides its outputs to the replica of the data receiver circuitry 1120A. The replica of the data receiver circuitry 1120A supplies the clock signal 1121A and the complement clock signal 1121B. The clock signal 1121A and the complement clock signal 1121B constitute the output signals of the delay-cell circuitry 1119. The delay-cell circuitry 1119 also receives as inputs enable signals 1118 and 1124 (note that FIG. 11A does not show those input signals for the sake of clarity). The enable signal 1118 couples to the replica of the clock driver circuitry 1114A, whereas the enable signal 1124 couples to the replica of the data receiver circuitry 1120A.

Note that FIG. 11B constitutes a conceptual block diagram of the delay-cell circuitry 1119. Rather than using distinct blocks 1114A and 1120A, one may alternatively use a single block that combines the functionality of those two blocks, as desired. Moreover, one may use a circuit that provides an adjustable, rather than fixed, delay, as desired. Note also that the embodiment 1100B of the delay-cell circuitry 1119 preferably compensates for the delay in the clock driver circuitry 1114 in FIG. 11A. In other words, the delay-cell circuitry 1119 preferably compensates sufficiently for the round-trip delay in the signals that travel from the receiver digital circuitry 905 to the receiver analog circuitry 910 and back to the receiver digital circuitry 905 to allow for accurate sampling in the receiver digital circuitry of the I-channel data and the Q-channel data. Note that in the embodiment 1100B, the replica of the clock driver circuitry 1114A mainly compensates for the round-trip delay, whereas the replica of the data receiver circuitry 1120A converts low-swing signals at the output of the replica of the clock driver circuitry 1114A into full-swing signals.

The receiver digital circuitry 905 and the receiver analog circuitry 910 preferably reside within separate integrated-circuit devices. Because those integrated-circuit devices typically result from separate semiconductor fabrication processes and manufacturing lines, their process parameters may not match closely. As a result, the preferred embodiment 1100B of the delay-cell circuitry 1119 does not compensate for the delay in the clock receiver circuitry 1130, the data driver circuitry 1154, and the data receiver circuitry 1120 in FIG. 11A.

Note, however, that if desired, the delay-cell circuitry 1119 may also compensate for the signal delays of the clock receiver circuitry 1130, the data driver circuitry 1154, and the data receiver circuitry 1120. Thus, in situations where one may match the process parameters of the receiver digital circuitry 905 and the receiver analog circuitry 910 relatively closely (for example, by using thick-film modules, silicon-on-insulator, etc.), the delay-cell circuitry 1119 may also compensate for the delays of other circuit blocks. As another alternative, one may use a delay-cell circuitry 1119 that provides an adjustable delay and then program the delay based on the delays in the receiver digital circuitry 905 and the receiver analog circuitry 910 (e.g., provide a matched set of receiver digital circuitry 905 and receiver analog circuitry 910), as persons skilled in the art who have the benefit of the description of the invention understand. Furthermore, rather than an open-loop arrangement, one may use a closed-loop feedback circuit implementation (e.g., by using a phase-locked loop circuitry) to control and compensate for the delay between the receiver analog circuitry 910 and the receiver digital circuitry 905, as desired.

Note that the digital circuit blocks shown in FIGS. 11A and 11B depict mainly the conceptual functions and signal flow. The actual circuit implementation may or may not contain separately identifiable hardware for the various functional blocks. For example, one may combine the functionality of various circuit blocks into one circuit block, as desired.

Figure 12:
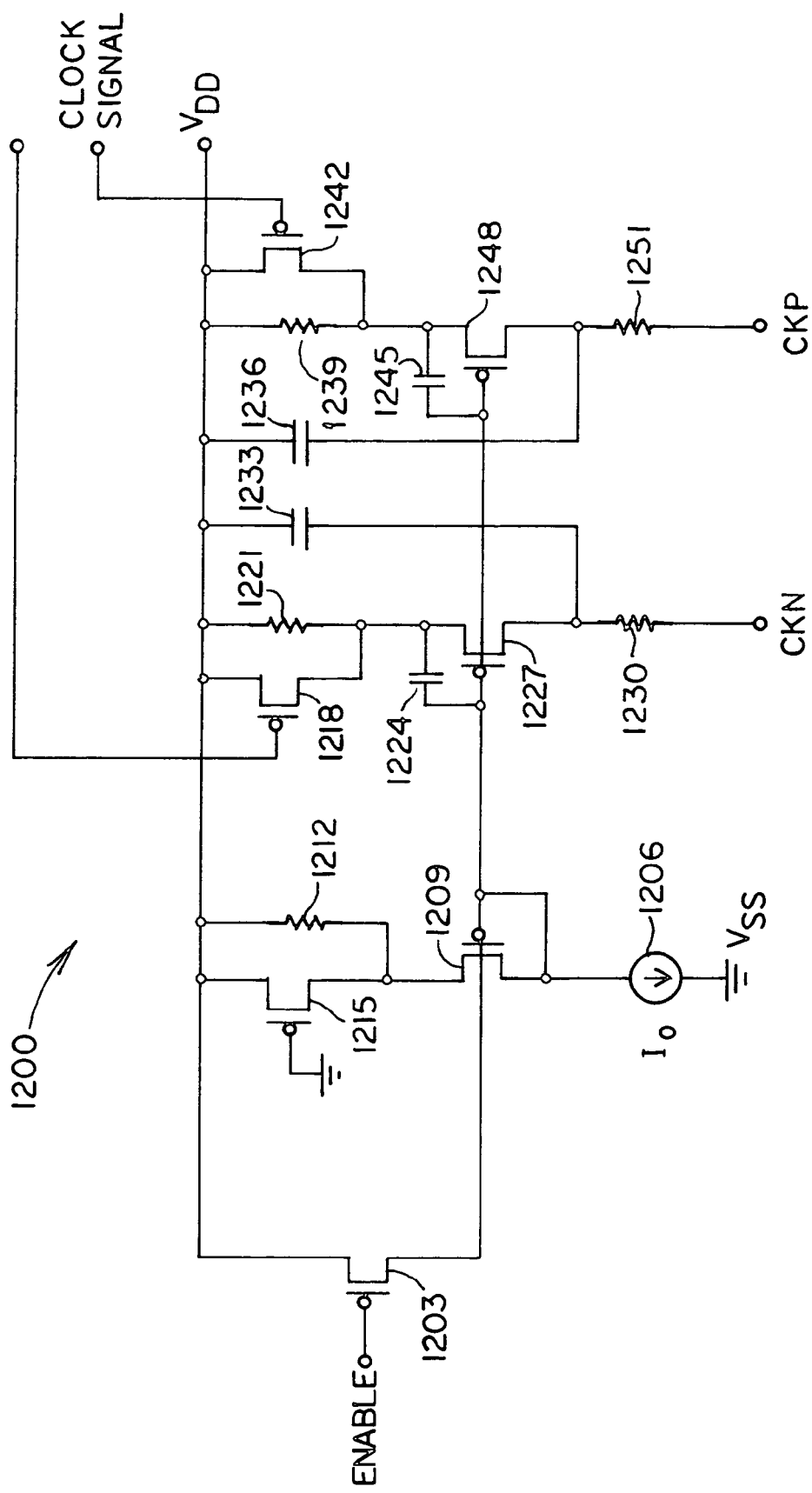
FIG. 12 depicts a schematic diagram of an embodiment of a signal-driver circuitry used to interface the receiver analog circuitry and the receiver digital circuitry according to the invention.

FIG. 12 shows a schematic diagram of a preferred embodiment 1200 of a signal-driver circuitry according to the invention. One may use the signal-driver circuitry as the clock driver circuitry 1114 and the data driver circuitry 1154 in FIG. 11A. In the latter case, the input signals to the signal-driver circuitry constitute the output signals 1152 and the enable signal 1156, whereas the output signals of the signal-receiver circuitry constitute the ION and IOP signals 960 and 965, respectively, in FIG. 11A.

The signal-driver circuitry in FIG. 12 constitutes two circuit legs. One circuit leg includes MOSFET devices 1218 and 1227 and resistor 1230. The second leg includes MOSFET devices 1242 and 1248 and resistor 1251. The input clock signal controls MOSFET devices 1218 and 1242. Current source 1206, MOSFET devices 1209 and 1215, and resistor 1212 provide biasing for the two circuit legs.

MOSFET devices 1227 and 1248 drive the CKN and CKP output terminals through resistors 1230 and 1251, respectively. Depending on the state of the clock signal, one leg of the signal-driver circuitry conducts more current than the other leg. Put another way, the signal-driver circuitry steers current from one leg to the other in response to the clock signal (i.e., in response to the clock signal, one leg of the circuit turns on and the other leg turns off, and vice-versa). As a result, the signal-driver circuitry provides a differential clock signal that includes current signals CKN and CKP.

If the enable signal is high, MOSFET device 1203 is off and therefore does not affect the operation of the rest of the circuit. In that case, a current $I_0$ flows through the current source 1206 and diode-connected MOSFET device 1209. The flow of current generates a voltage at the gate of MOSFET device 1209. MOSFET devices 1227 and 1248 share the same gate connection with MOSFET device 1209. Thus, MOSFET devices 1227 and 1248 have the same gate-source voltage, $V_{gs}$, as MOSFET device 1209 when the appropriate MOSFET devices are in the on state.

MOSFET devices 1218 and 1242 cause current steering between the first and second circuit legs. Only one of the MOSFET devices 1218 and 1242 is in the on state during the operation of the circuit. Depending on which MOSFET device is in the on state, the mirroring current $I_0$ flows through the circuit leg that includes the device in the on state.

Resistors 1221 and 1239 provide a small trickle current to the circuit leg that includes the MOSFET device (i.e., MOSFET device 1218 or MOSFET device 1242) that is in the off state. The small trickle current prevents the diode-connected MOSFET devices in the signal receiver circuitry (see FIG. 13) from turning off completely. The trickle current helps to reduce the delay in changing the state of the circuit in response to transitions in the input clock signal. The trickle currents also help to reduce transient signals at the CKP and CKN terminals and, thus, reduce interference effects.

Capacitors 1224 and 1245 provide filtering so that when MOSFET device 1218 and MOSFET device 1242 switch states, the currents through the first and second circuit legs (CKN and CKP circuit legs) do not change rapidly. Thus, capacitors 1224 and 1245 reduce the high-frequency content in the currents flowing through the circuit legs into the CKN and CKP terminals. The reduced high-frequency (i.e., band-limited) content of the currents flowing through the CKN and CKP terminals helps reduce interference effects to other parts of the circuit, for example, the LNA circuitries, as described above. Capacitors 1233 and 1236 and resistors 1230 and 1251 help to further reduce the high-frequency content of the currents flowing through the CKN and CKP terminals. Thus, the circuit in FIG. 12 provides smooth steering of current between the two circuit legs and therefore reduces interference effects with other circuitry.

When the enable signal goes to the low state, MOSFET device 1203 turns on and causes MOSFET device 1209 to turn off. MOSFET devices 1227 and 1248 also turn off, and the circuit becomes disabled. Note that the enable signal may be derived from the power-down PDNB signal.

Figure 13A:
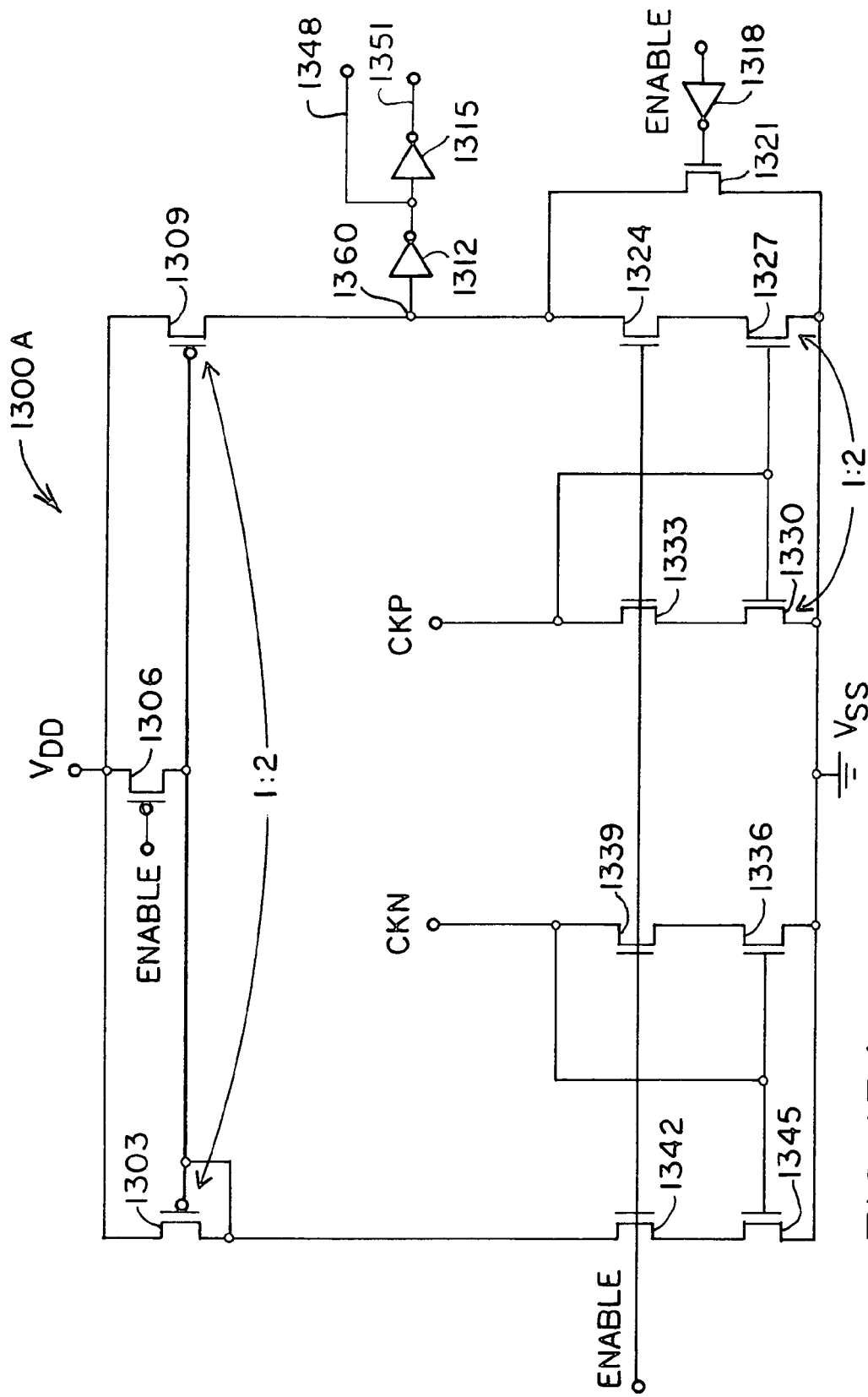
FIGS. 13A and 13B illustrate schematic diagrams of embodiments of signal-receiver circuitries used to interface the receiver analog circuitry and the receiver digital circuitry according to the invention.

FIG. 13A shows a schematic diagram of an exemplary embodiment 1300A of a signal-receiver circuitry according to the invention. One may use the signal-receiver circuitry as the clock receiver circuitry 1130 and the data receiver circuitry 1120 in FIG. 11A. In the latter case, the input signals to the signal-receiver circuitry constitute the ION and IOP signals 960 and 965 and the enable signal 1124, whereas the output signals constitute the signals at the outputs 1122A and 1122B, respectively, in FIG. 11A.

The signal receiver circuitry in FIG. 13A helps to convert differential input currents into CMOS logic signals. The signal-receiver circuitry in FIG. 13A constitutes two circuit legs. The first circuit leg includes MOSFET devices 1303, 1342, and 1345. The second leg includes MOSFET devices 1309, 1324, and 1327. Note that, preferably, the scaling of MOSFET devices 1303 and 1309 provides a current gain of 1:2 between them. Likewise, the scaling of MOSFET devices 1330 and 1327 preferably provides a current gain of 1:2 between them. The current gains help to reduce phase noise in the signal-receiver circuitry.

MOSFET devices 1339, 1342, 1333, and 1324 provide enable capability for the circuit. When the enable input is in the high state, MOSFET devices 1339, 1342, 1333, and 1324 are in the on state. MOSFET devices 1345 and 1336 are current mirrors, as are MOSFET devices 1303 and 1309. MOSFET devices 1330 and 1327 also constitute current mirrors.

The currents flowing through the CKN and CKP terminals mirror to the MOSFET devices 1327 and 1309. The actual current flowing through the second circuit leg depends on the currents that MOSFET device 1327 and MOSFET device 1309 try to conduct; the lower of the two currents determines the actual current that flows through the second circuit leg.

The difference between the currents that MOSFET device 1327 and MOSFET device 1309 try to conduct flows through the parasitic capacitance at node 1360. The current flow charges or discharges the capacitance at node 1360, thus making smaller the drain-source voltage ($V_{ds}$) of whichever of MOSFET devices 1327 and 1309 that seeks to carry the higher current. Ultimately, the lower of the currents that MOSFET devices 1327 and 1309 seek to conduct determines the current through the second leg of the circuit.

A pair of inverters 1312 and 1315 provide true and complement output signals 1351 and 1348, respectively. The signal receiver circuitry therefore converts differential input currents into CMOS logic output signals.

Figure 13B:
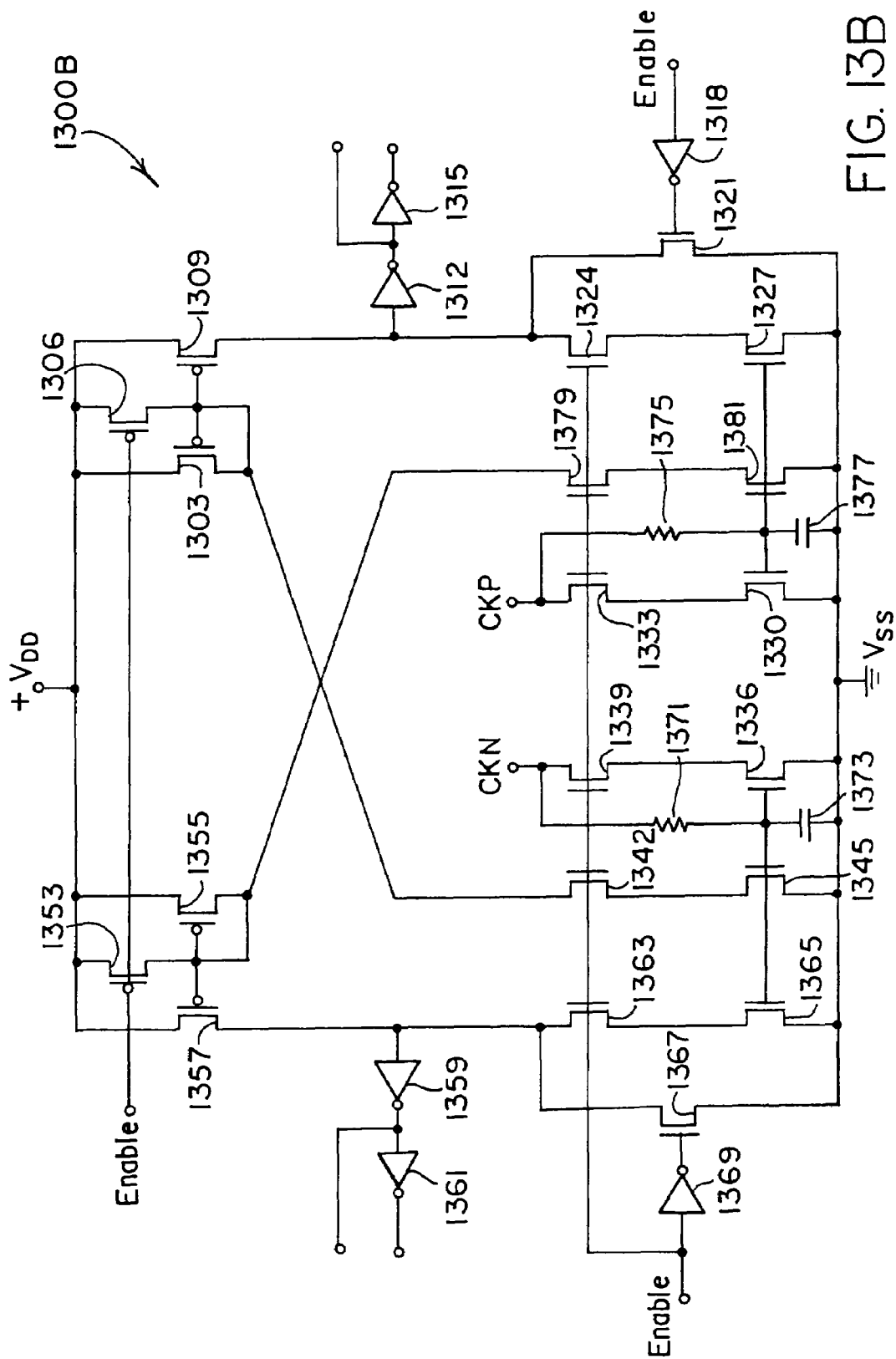

In exemplary embodiments of the invention, the signal receiver circuitry provides fully differential output signals. FIG. 13B shows an embodiment 1300B of such a signal receiver circuitry. One may use embodiment 1300B in a similar manner and application as embodiment 1300A, using the same input signals, as desired. Unlike embodiment 1300A, however, embodiment 1300B includes fully differential circuitry to generate fully differential output signals.

Embodiment 1300B includes the same devices as does embodiment 1300A, and the common devices operate in a similar manner. Furthermore, embodiment 1300B includes additional devices and components. Embodiment 1300B constitutes two circuit legs and replica of those circuit legs. The first circuit leg includes MOSFET devices 1303, 1342, and 1345. The replica of the first circuit leg includes devices 1355, 1379, and 1381. The second circuit leg includes MOSFET devices 1309, 1324, and 1327. The replica of the second circuit leg include devices 1357, 1363, and 1365. The scaling of MOSFET devices 1303 and 1309 provides a current gain of 1:2 between them, as does the scaling of MOSFET devices 1330 and 1327. Likewise, scaling of MOSFET devices 1355 and 1357 provides a current gain of 1:2 between them, as does the scaling of MOSFET devices 1336 and 1365. The current gains help to reduce phase noise in the signal-receiver circuitry.

Embodiment 1300B generally operates similarly to embodiment 1300A. Devices 1381, 1379, 1355, 1353, 1357, 1363, 1365, 1367, 1369, 1359, and 1361 perform the same functions as do devices 1345, 1342, 1303, 1306, 1309, 1324, 1327, 1321, 1318, 1312, and 1315, respectively. The enable function also operates similarly to embodiment 1300A. Resistors 1371 and 1375 and capacitors 1373 and 1377 filter the input clock (e.g., 13 MHz clock). Inverters 1312, 1315, 1361, and 1359 provide fully differential true and complement output signals.

Figure 14:
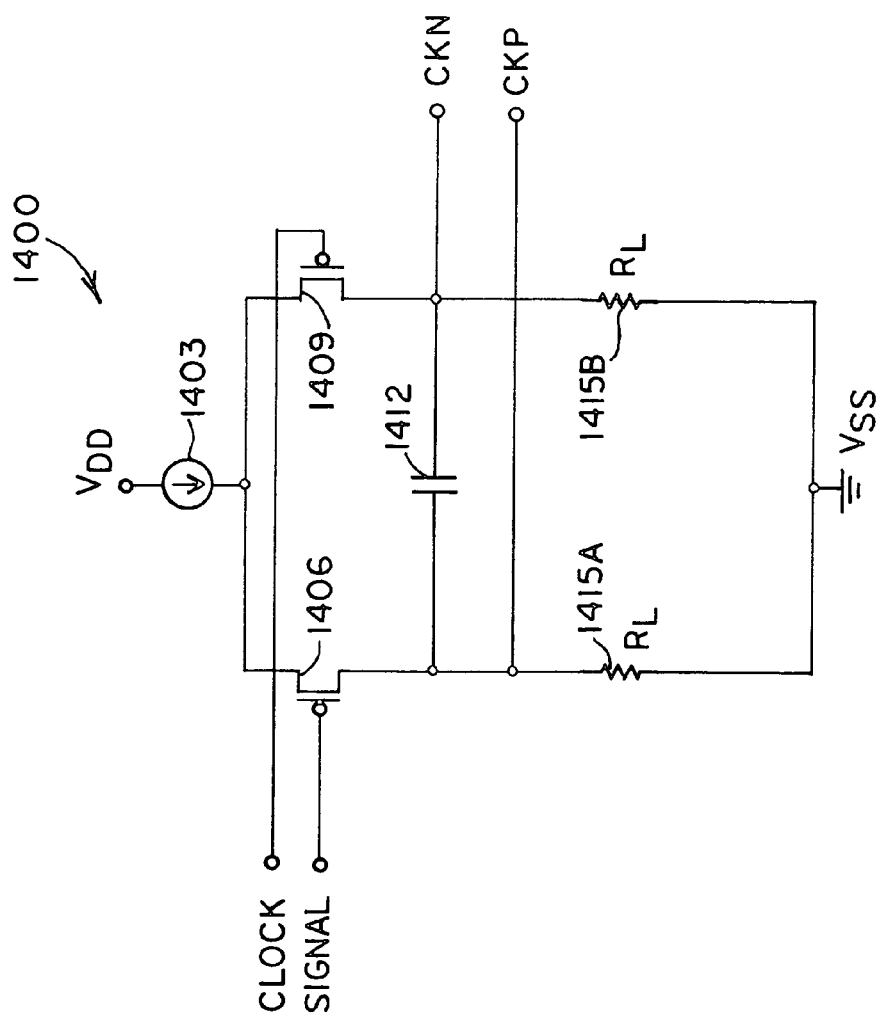
FIG. 14 shows a schematic diagram of another signal-driver circuitry that one may use to interface the receiver analog circuitry and the receiver digital circuitry according to the invention.

FIG. 14 shows an embodiment 1400 of an alternative signal-driver circuitry according to the invention. The signal-driver circuitry in FIG. 14 includes two circuit legs. The first circuit leg includes MOSFET device 1406 and resistor 1415A. The second circuit leg includes MOSFET device 1409 and resistor 1415B. A current source 1403 supplies current to the two circuit legs.

The input clock signal controls MOSFET devices 1406 and 1409. MOSFET devices 1406 and 1409 drive the CKP and CKN output terminals, respectively. Depending on the state of the clock signal, one leg of the signal-driver circuitry conducts current. Put another way, the signal-driver circuitry steers current from one leg to the other in response to the clock signal. As a result, the signal-driver circuitry provides a differential clock signal that includes signals CKN and CKP. Capacitor 1412 filters the output signals CKN and CKP. Put another way, capacitor 1412 provides band-limiting of the output signals CKN and CKP. Note that the current source 1403 supplies limited-amplitude signals by providing current through resistors 1415A and 1415B.

Note that the signal-driver circuitries (clock driver and data driver circuitries) according to the invention preferably provide current signals CKN and CKP. Similarly, signal-receiver circuitries (clock receiver and data receiver circuitries) according to the invention preferably receive current signals. As an alternative, one may use signal-driver circuitries that provide as their outputs voltage signals, as desired. One may also implement signal-receiver circuitries that receive voltage signals, rather than current signals. As noted above, depending on the application, one may limit the frequency contents of those voltage signals, for example, by filtering, as desired.

Generally, several techniques exist for limiting noise, for example, digital switching-noise, in the interface between the receiver analog circuitry and the receiver digital circuitry according to the invention. Those techniques include using differential signals, using band-limited signals, and using amplitude-limited signals. RF apparatus according to the invention may use any or all of those techniques, as desired. Furthermore, one may apply any or all of those techniques to interface circuitry that employs voltage or current signals, as persons of ordinary skill in the art who have the benefit of the description of the invention understand.

Note also that the RF transceiver embodiments according to the invention lend themselves to various choices of circuit implementation, as a person skilled in the art who have the benefit of the description of the invention understand. For example, as noted above, each of the circuit partitions, or circuit blocks, of RF transceivers partitioned according to the invention, resides preferably within an integrated circuit device. Persons skilled in the art, however, will appreciate that the circuit partitions, or circuit blocks, may alternatively reside within other substrates, carriers, or packaging arrangements. By way of illustration, other partitioning arrangements may use modules, thin-film modules, thick-film modules, isolated partitions on a single substrate, circuit-board partitions, and the like, as desired, consistent with the embodiments of the invention described here.

One aspect of the invention contemplates partitioning RF transceivers designed to operate within several communication channels (e.g., GSM, PCS, and DCS). Persons skilled in the art, however, will recognize that one may partition according to the invention RF transceivers designed to operate within one or more other channels, frequencies, or frequency bands, as desired.

Moreover, the partitioning of RF transceivers according to the invention preferably applies to RF apparatus (e.g., receivers or transceivers) with a low-IF, digital-IF architecture. Note, however, that one may apply the partitioning and interfacing concepts according to the invention to other RF receiver or transceiver architectures and configurations, as persons of ordinary skill in the art who have the benefit of the description of the invention understand. By way of illustration, one may use the partitioning and interface concepts according to the invention in RF apparatus that includes:

low-IF receiver circuitry;
a low-IF receiver circuitry and offset-PLL transmitter circuitry;
low-IF receiver circuitry and direct up-conversion transmitter circuitry;
direct-conversion receiver circuitry;
direct-conversion receiver circuitry and offset-PLL transmitter circuitry; or
direct-conversion receiver circuitry and direct up-conversion transmitter circuitry.

As an example of the flexibility of the partitioning concepts according to the invention, one may include the LO circuitry in one partition, the receiver digital circuitry in a second partition, and the transmitter up-converter circuitry and the receiver analog circuitry in a third partition. As another illustrative alternative, one may include the LO circuitry and the transmitter up-converter circuitry within one circuit partition, depending on the noise and interference characteristics and specifications for a particular implementation.

Note that, in a typical direct-conversion RF receiver or transceiver implementation, the receiver digital circuitry would not include the digital down-converter circuitry (the receiver analog circuitry, however, would be similar to the embodiments described above). Furthermore, in a typical direct up-conversion transmitter circuitry, one would remove the offset PLL circuitry and the transmit VCO circuitry from the transmitter circuitry. The LO circuitry would supply the RF LO signal to the up-conversion circuitry of the transmitter circuitry, rather than the offset-PLL circuitry. Also, in a direct up-conversion implementation, the LO circuitry typically does not provide an IF LO signal.

Furthermore, as noted above, one may use the partitioning and interface concepts according to the invention not only in RF transceivers, but also in RF receivers for high-performance applications. In such RF receivers, one may partition the receiver as shown in FIGS. 2A–2D and 4–8, and as described above. In other words, the RF receiver may have a first circuit partition that includes the receiver analog circuitry, and a second circuit partition that includes the receiver digital circuitry.

The RF receiver may also use the digital interface between the receiver analog circuitry and the receiver digital circuitry, as desired. By virtue of using the receiver analog circuitry and the receiver digital circuitry described above, the RF receiver features a low-IF, digital-IF architecture. In addition, as noted above with respect to RF transceivers according to the invention, depending on performance specifications and design goals, one may include all or part of the local oscillator circuitry within the circuit partition that includes the receiver analog circuitry, as desired. Partitioning RF receivers according to the invention tends to reduce the interference effects between the circuit partitions.

As noted above, although RF apparatus according to the invention use a serial interface between the receiver analog circuitry and the receiver digital circuitry, one may use other types of interface, for example, parallel interfaces, that incorporate different numbers of signal lines, different types and sizes of signals, or both, as desired. Moreover, the clock driver circuitries and the data driver circuitries may generally constitute signal-driver circuitries that one may use in a variety of digital interfaces between the receiver analog circuitry and the receiver digital circuitry according to the invention.

Likewise, the clock receiver circuitries and data receiver circuitries may generally constitute signal-receiver circuitries that one may use in a variety of digital interfaces between the receiver analog circuitry and the receiver digital circuitry according to the invention. In other words, one may use signal-driver circuitries and signal-receiver circuitries to implement a wide variety of digital interfaces, as persons of ordinary skill who have the benefit of the description of the invention understand.

Other aspects of the inventive concepts relate to the transmitter circuitry within RF apparatus, for example, in an RF transmitter circuitry or in an RF transceiver circuitry, such as transmitter circuitry 216 in FIG. 2, transmitter circuitry 465 in FIGS. 4–7, or transmitter circuitry 877 in FIG. 8. More particularly, one aspect of the invention relates to the generation, calibration, and fine-tuning of RF frequencies within the transmitter circuitry in an RF apparatus. In exemplary embodiments, the transmitter circuitry, such as transmitter circuitry 465 in FIGS. 4–7 or transmitter circuitry 877 in FIG. 8, includes a VCO circuitry 481, as described above.

The VCO circuitry 481 provides an output signal 478 that may constitute an RF output of the transmitter circuitry. Accordingly, the VCO circuitry 481 has the task of providing the RF output signal of the transmitter circuitry at a desired frequency or at a set or band of desired frequencies. The precision of the RF output signal of the transmitter circuitry depends in part on the calibration and fine-tuning of the VCO circuitry 481. To provide output signals with precise frequencies, RF apparatus according to the invention incorporate techniques for calibrating and fine-tuning the frequency of the output signal 478 of the VCO circuitry 481, as described below.

Figure 15:
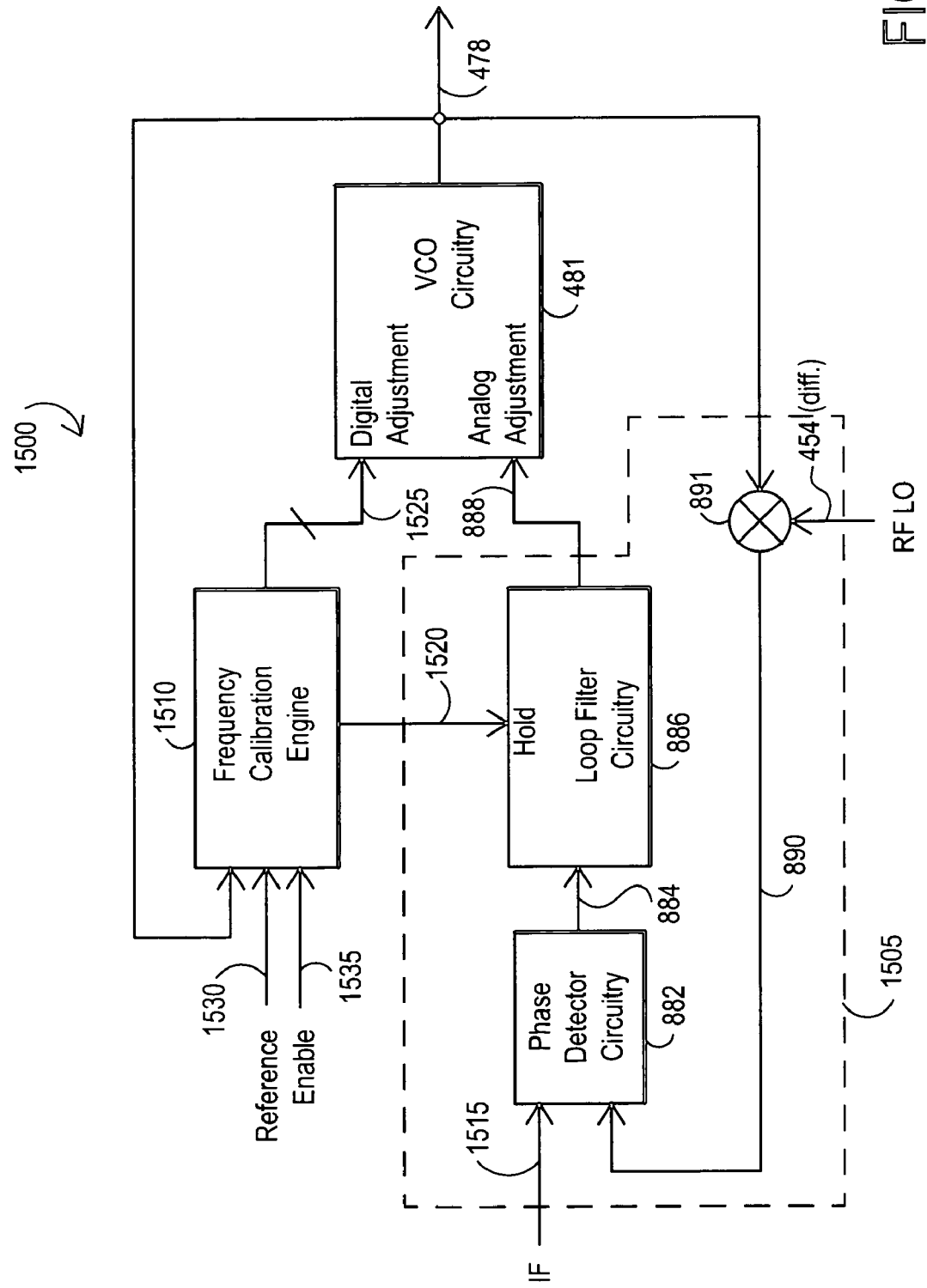
FIG. 15 depicts a conceptual or block diagram of an embodiment according to the invention of a circuit arrangement for use in a transmitter circuitry.

FIG. 15 shows a conceptual or block diagram of an embodiment 1500 according to the invention for use in a transmitter circuitry. The embodiment 1500 includes an offset-PLL circuitry 1505, VCO circuitry 481, and frequency calibration engine 1510. The offset-PLL circuitry 1505 may comprise offset-PLL circuitry 472 in FIG. 4 or offset-PLL circuitry 897 in FIG. 8, as desired. The offset-PLL circuitry 1505 includes phase detector 882, loop filter circuitry 886, and offset mixer circuitry 891.

The VCO circuitry 481 operates in conjunction with two feedback loops formed by the various circuit blocks in embodiment 1500. The first feedback loop includes VCO circuitry 481 and the frequency calibration engine 1510. The second feedback loop includes VCO circuitry 481, offset mixer circuitry 891, phase detector circuitry 882, and loop filter circuitry 886. The VCO circuitry 481 provides transmit VCO output signal 478 to the frequency calibration engine 1510 in the first feedback loop and to the offset mixer circuitry 891 in the second feedback loop. The offset mixer circuitry 891 mixes or multiplies the transmit VCO output signal 478 with the RF LO signal 454 to generate the mixed signal 890. The offset mixer circuitry 891 provides the mixed signal 890 to the phase detector circuitry 882.

The phase detector circuitry 882 receives IF signal 1515 and mixed signal 890. The IF signal 1515 may, for example, comprise the up-converted IF signal 469 (see FIG. 4) or the transmit IF signal 880 (see FIG. 8), as desired. Depending on the relative phase of the IF signal 1515 and the mixed signal 890, the phase detector circuitry 882 provides offset PLL error signal 884 to the loop filter circuitry 886. The loop filter circuitry 886 filters the offset PLL error signal 884 and provides filtered offset PLL signal 888 to the VCO circuitry 481. The filtered offset PLL signal 888 constitutes an error signal that the VCO circuitry 481 uses to tune the frequency of its output signal 478 to the desired or prescribed frequency, i.e., the frequency of the input IF signal 1515. The VCO circuitry 481 uses the filtered offset PLL signal 888 and a calibration signal 1525 during its calibration cycle.

The loop filter circuitry 886 also receives a control or hold signal 1520 from the frequency calibration engine 1510. When activated, the hold signal 1520 causes the loop filter circuitry 886 to keep the filtered offset PLL signal 888 at a relatively constant level. By using the hold signal 1520 to cause a relatively constant level of the filtered offset PLL signal 888, the frequency calibration engine 1510 may preempt any adjustment of the output frequency of the VCO circuitry 481 by the second feedback loop. In effect, the relatively constant level of the filtered offset PLL signal 888 causes the continuously variable capacitor to have a capacitance that falls roughly mid-way between its minimum and maximum capacitance values, as described below in more detail. The calibration signal 1525 may comprise a digital word (i.e., a plurality of digital signals), or a single digital signal, as desired, depending on the configuration of the VCO circuitry 481, as described below in more detail.

The calibration of the VCO circuitry 481 includes two phases or stages. In the first phase, the enable signal 1535 enables the frequency calibration engine 1510. The frequency calibration engine 1510 maintains a relatively constant level of the filtered offset PLL signal 888 by using the hold signal 1520. Consequently, the loop filter circuitry 886 does not adjust the output frequency of the VCO circuitry 481 during this phase, i.e., the feedback loop that includes the phase detector circuitry 882, the loop filter circuitry 886, the VCO circuitry 481, and the mixer circuitry 891 is inactive and does not perform a feedback function. Using the calibration signal 1525, the frequency calibration engine 1510 coarsely adjusts the output frequency of the VCO circuitry 481 to a value close to the frequency of reference signal 1530, which is a known, desired, or prescribed frequency. That frequency may constitute the frequency for a communication channel, for example, a frequency for a GSM channel, as specified by the user.

The frequency of the output signal 478 of VCO circuitry 481 may relate to the frequency of reference signal 1530 in a variety of ways. For example, the frequency of reference signal 1530 may equal approximately the frequency of the output signal 478 of the VCO circuitry 481. In that case, the circuitry within embodiment 1500 uses the two frequencies to each other without scaling. As an alternative, embodiment 1500 may scale the frequencies of both reference signal 1530 and the output signal 478 of VCO circuitry 481 and use the resulting frequencies.

Once the frequency calibration engine 1510 has finished the coarse adjustment of the output frequency of the VCO circuitry 481, the first phase ends and the second phase commences. In the second phase, the offset-PLL circuitry 1505 fine tunes the frequency of the output signal 478 of VCO circuitry 481 to the known, prescribed, or desired frequency. Once the frequency calibration engine 1510 de-asserts the hold signal 1520, the offset-PLL circuitry 1505 proceeds to further adjust, or fine-tune, the output frequency of the VCO circuitry 481. During this phase, once the hold signal 1520 no longer keeps the filtered offset PLL signal 888 at a relatively constant level, the output signal of the loop filter circuitry 886 (i.e., the filtered offset PLL signal 888) may vary and thus cause the fine-tuning of the output frequency of the VCO circuitry 481. The feedback action within the loop that includes the VCO circuitry 481, the mixer 891, the phase detector circuitry 882, and the loop filter circuitry 886 causes the filtered offset PLL signal 888 to change in such a way as to fine-tune the output frequency of the VCO circuitry 481 to a frequency substantially equal to the desired or prescribed frequency.

In exemplary embodiments, the first and second stages in the calibration of the output frequency of the VCO circuitry 481 occur before a transmit burst, for example, a burst according to GSM standards, begins. Note that the user may specify the desired output frequency of VCO circuitry 481 on a burst-by-burst basis such that the VCO circuitry 481 may produce a different output frequency in subsequent bursts, as desired. Once the feedback action within the second phase has adjusted the output frequency of the VCO circuitry 481, IF signal 1515 modulates the output frequency of the VCO circuitry 481. Note that the IF signal 1515 may include message or intelligence information or data with which one wishes to modulate an attribute (for example, the phase) of the output signal 478 of the VCO circuitry 481. The message or intelligence information or data may constitute a variety of signals, such as voice, audio, music, video, images, and the like, as desired. Furthermore, message or intelligence signal may have a variety of formats, as desired, for example, an analog format or a digital format. Note that, depending on the format, one may use interfacing and conversion circuitry, such as digital-to-analog converters, as persons of ordinary skill in the art who have the benefit of the description of the invention understand.

The modulated output signal of the VCO circuitry 481 may feed output buffer circuitry (not shown explicitly in FIG. 15). The buffer circuitry buffers the modulated output signal of the VCO circuitry 481. The output signal of the buffer circuitry may in turn drive power amplifier circuitry (not illustrated explicitly in FIG. 15). The power amplifier circuitry boosts the output signal of the buffer circuitry to increase its power level. The output of the power amplifier circuitry may couple to an antenna (not depicted explicitly in FIG. 15) that transmits RF signals.

Generally, the IF signal 1515 constitutes a time-varying signal because of the variations in the intelligence information of data within the IF signal 1515. The offset-PLL circuitry 1505 acts as a tracking circuit. In other words, a change in the IF signal 1515 results in a corresponding change in the frequency of the output signal 478 of the VCO circuitry 481. Consider the situation with a relatively constant IF signal 1515 so that the output signal 478 of the VCO circuitry 481 has a nominal frequency dictated, among other things, by the feedback loop that includes the mixer circuitry 891, the phase detector circuitry 882, and the loop filter circuitry 886. A subsequent change in the IF signal 1515 causes a variation in the offset PLL error signal 884, an output signal of the phase detector circuitry 882. The variation in the offset PLL error signal 884 in turn results in a change in the filtered offset PLL signal 888, an output signal of the loop filter circuitry 886. As a result, the frequency of the output signal 478 of the VCO circuitry 481 varies. Thus, the offset-PLL circuitry 1505 and the VCO circuitry 481 together constitute a tracking offset-PLL circuit because the frequency of the output signal 478 tends to track the changes in the attribute (e.g., phase or frequency) of the IF signal 1515.

Note that the frequency of the output signal 478 of the VCO circuitry 481 differs from that of the IF signal 1515 by an amount equal to the frequency of the RF LO signal 454 (i.e., an offset substantially equal to the frequency of the RF LO signal 454, hence the name "offset-PLL circuitry"). In other words, the mixer circuitry 891 multiplies the RF LO signal 454 with the output signal 478 of the VCO circuitry 481 to generate the mixed signal 890. The feedback loop around the VCO circuitry 481 causes the frequency of the mixed signal 890 to substantially equal the frequency of the IF signal 1515. The offset in the frequencies of the output signal 478 of the VCO circuitry 481 and the IF signal 1515 tends to reduce undesired interaction and interference, such as pulling, between those signals.

FIG. 16 shows a conceptual or block diagram of an exemplary embodiment of the VCO circuitry 481. The VCO circuitry 481 constitutes a resonator-based VCO. The VCO circuitry 481 includes a variable capacitor 1605, a fixed capacitor 1610, an inductor 1615, an equivalent resistance 1620, and an amplifier circuitry 1625. One of the terminals of each of the variable capacitor 1605, the fixed capacitor 1610, the inductor 1615, the equivalent resistance 1620, and the amplifier circuitry 1625 couples to the output signal 478 of the VCO circuitry 481, whereas the other terminal of each of those components couples to a reference terminal 1630.

The reference terminal 1630 in exemplary embodiments constitutes a ground terminal of the VCO circuitry 481. Thus, in those embodiments, the output 478 of the VCO circuitry 481 references the reference terminal 1630, i.e., a ground terminal, which typically has a zero voltage or potential. Note that, as an alternative, one may use a VCO circuitry with a differential output. In that case, the variable capacitor 1605, the fixed capacitor 1610, the inductor 1615, the equivalent resistance 1620, and the amplifier circuitry 1625 couple across the differential outputs of the VCO circuitry.

In exemplary embodiments, VCO circuitry 481 can provide an output frequency in the 1650–1910 MHz range (although one may generally use a VCO circuitry that provides other values of output signal frequency, as desired). The user may prescribe a channel by specifying the center frequency of that channel. The VCO circuitry 481 tunes the frequency of its output signal 478 to the specified channel center frequency by modifying the capacitance of the variable capacitor 1605 during the calibration cycle.

The fixed capacitor 1610 may constitute an internal and/or external capacitance, as desired. The combination of the variable capacitor 1605, the fixed capacitor 1610, and the inductor 1615 constitutes a resonant tank. The capacitance, C, of the parallel combination of the variable capacitor 1605 and the fixed capacitor 1610, and the inductance, L, of inductor 1615 determine the natural frequency, $\omega_0$, of that resonant tank:

$$\omega_o = \frac{1}{\sqrt{LC}},$$

where $\omega_0 = 2\pi f_0,$ where $f_0$ represents the resonant frequency in Hertz, and $C = C_{var} \| C_{fixed},$ or, alternatively, $C = C_{var} + C_{fixed}.$ In the above equations, $C_{var}$ and $C_{fixed}$ represent the capacitance of the variable capacitor 1605 and of the fixed capacitor 1610, respectively.

The equivalent resistance 1620 represents the overall circuit resistance, for example, the parasitic resistances of the variable capacitor 1605, the fixed capacitor 1610, and the inductor 1615. The inductor 1615 may constitute an internal (e.g., integrated) inductor, an external inductor, a wire-bond or package inductor, such as described in commonly owned U.S. patent application Ser. No. 09/999,702, incorporated by reference here, or a combination of any of those types of inductor.

The amplifier circuitry 1625 helps sustain oscillations in the resonant LC-tank. In the absence of the amplifier circuitry 1625, the equivalent resistance 1620 and/or other losses in the VCO circuitry 481 would dampen the oscillations in the resonant LC-tank. The amplifier circuitry 1625 supplies energy to the resonant tank to compensate for the energy that the equivalent resistance 1620 dissipates, thus sustaining the oscillations in the resonant tank.

Two signals control the effective capacitance of the variable capacitance 1605. By changing the effective capacitance of the variable capacitor 1605 through varying the two control signals, one may alter the natural frequency of the resonant tank and, therefore, the frequency present at the output 478 of the VCO circuitry 481. In exemplary embodiments, the two control signals in FIG. 16 constitute the filtered offset PLL signal 888 and the calibration signal 1525.

FIG. 17 illustrates more details at the block diagram or conceptual level of an embodiment of the VCO circuitry 481. The VCO circuitry 481 includes variable capacitor 1605, fixed capacitor 1610, inductor 1615, equivalent resistance 1620, and amplifier circuitry 1625. One of the terminals of each of the variable capacitor 1605, the fixed capacitor 1610, the inductor 1615, the equivalent resistance 1620, and the amplifier circuitry 1625 couples to the output signal 478 of the VCO circuitry 481, whereas the other terminal of each of those components couples to a reference terminal 1630. Alternatively, one may use a VCO circuitry with a differential output. In that case, the variable capacitor 1605, the fixed capacitor 1610, the inductor 1615, the equivalent resistance 1620, and the amplifier circuitry 1625 couple across the differential outputs of the VCO circuitry.

Unlike the prior art, the variable capacitor 1605 includes a discretely variable capacitor 1705 and a continuously variable capacitor 1710. The discretely variable capacitor 1705 allows relatively coarse adjustment of the frequency of the output signal 478 of the VCO circuitry 481 through discrete changes in the capacitance of capacitor 1705. Those discrete changes cause variations in the capacitance of the variable capacitor 1610. One may change the frequency of the output signal 478 of the VCO circuitry 481 through the calibration signal 1525. In other words, the calibration signal 1525 controls the capacitance of the discretely variable capacitor 1705. When the capacitance of the discretely variable capacitor 1705 and, hence, the capacitance of the variable capacitor 1605 changes, the resonant frequency of the LC-tank (which includes variable capacitor 1605 and inductor 1615) changes. As a result, the frequency of the output signal 478 of the VCO circuitry 481 changes.

The continuously variable capacitor 1710 allows further adjustment or fine tuning of the frequency of the output signal 478 of the VCO circuitry 481 through variations in the capacitance of capacitor 1710, which in turn result in changes in the capacitance of the variable capacitor 1610. Exemplary embodiments use the filtered offset PLL signal 888 to change the frequency of the output signal 478 of the VCO circuitry 481. Put another way, the filtered offset PLL signal 888 controls the capacitance of the continuously variable capacitor 1710. Changes in the capacitance of the continuously variable capacitor 1710 cause changes in the capacitance of the variable capacitor 1605. Consequently, the resonant frequency of the LC-tank varies, which causes the frequency of the output signal 478 of the VCO circuitry 481 to change.

Note that the filtered offset PLL signal 888 and the calibration signal 1525 may constitute a single signal or a plurality of signals, as desired. The choice depends on a particular implementation of the discretely variable capacitor 1705 and the continuously variable capacitor 1710. For example, a multi-stage discretely variable capacitor 1705 or a multi-stage continuously variable capacitor 1710 use multi-signal control signals (the calibration signal 1525 and the filtered offset PLL signal 888, respectively). The fixed capacitor 1610 may represent an external or internal capacitor coupled to the VCO circuitry 481, and/or any parasitic capacitance within the VCO circuitry in FIG. 17. The other components of the VCO circuitry 481, for example, the amplifier circuitry 1625, the equivalent resistance 1620, and the inductor 1615, operate in a similar manner as described above in connection with FIG. 16.

One may use the discretely variable capacitor 1705 after manufacturing a device to dynamically compensate for any component tolerances, including the internal capacitance values, any external capacitor, and the inductor 1615. In addition, one may use the discretely variable capacitor 1705 to provide coarse tuning of the desired frequency of the output signal 478, thus reducing the frequency range that variations in the capacitance of the continuously variable capacitor 1710 would cover to fine-tune VCO circuitry 481.

After coarse tuning by the discretely variable capacitor 1705, one may use the continuously variable capacitor 1710 to provide fine tuning of the desired frequency at the output of the VCO circuitry 481. The process of coarse and fine tuning initially calibrates the frequency of the output signal 478 to the desired or prescribed frequency. After the initial calibration, one may use the continuously variable capacitor 1710 to compensate for any post-calibration frequency drifts and for signal modulation. Post-calibration frequency drifts may occur because of a variety of factors, including, for example, temperature variations, voltage fluctuations, and the like. In this way, the present invention allows for manufacturing the VCO circuitry 481 without the trimming requirements of prior art implementations, and allows integrating the VCO circuitry 481 on a single integrated circuit.

As mentioned above, the calibration cycle of the VCO circuitry 481 includes two stages. One may use the adjustment of the capacitance of the discretely variable capacitor 1705 to adjust the frequency of the output signal 478 of the VCO circuitry 481, as described above, during the first calibration phase. During this phase, the calibration signal 1525 provides a way of adjusting the capacitance of the discretely variable capacitor 1705. In addition, one may use the adjustment of the capacitance of the continuously variable capacitor 1710 to fine tune the frequency of the output signal 478 to a desired or prescribed frequency, as described above, during the second calibration phase. During the second calibration phase, the filtered offset PLL signal 888 acts as a control signal that adjusts the capacitance of the continuously variable capacitor 1710. Thus, together, the two stages or phases of the calibration cycle provide a convenient and flexible mechanism for the user to tune the frequency of the VCO circuitry 481 to a desired or prescribed value.

Figure 18:
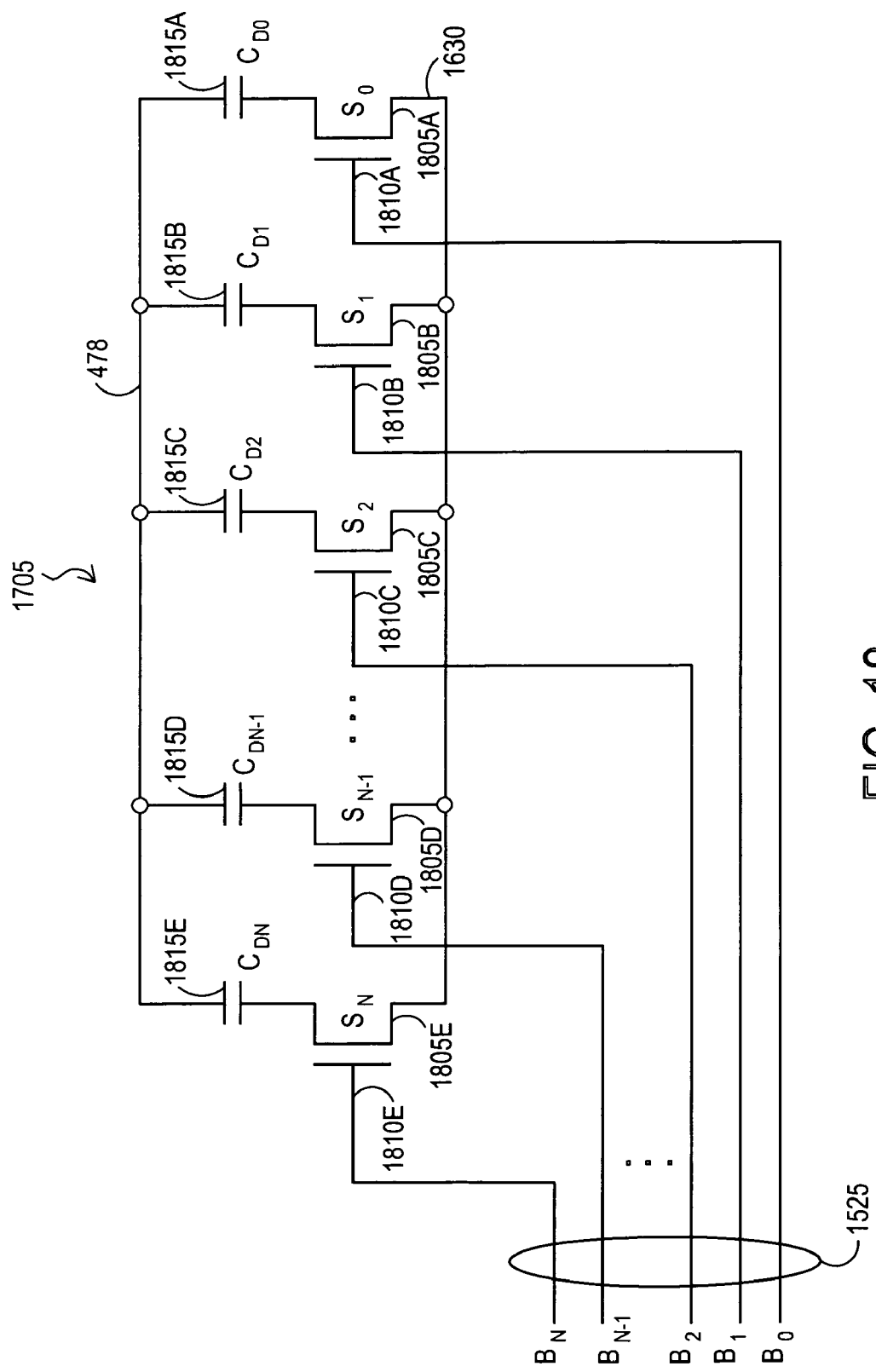
FIG. 18 depicts an embodiment according to the invention of the discretely variable capacitor.

FIG. 18 illustrates an embodiment according to the invention of the discretely variable capacitor 1705. The discretely variable capacitor 1705 includes a plurality of transistors or switches 1805A–1805E ($S_0$ through $S_N$) and a plurality of capacitors 1815A–1815E ($C_{D0}$ through $C_{DN}$). Transistors 1805A–1805E constitute N-type metal oxide semiconductor (NMOS) transistors. One terminal of each capacitor in the plurality of capacitors 1815A–1815E couples to the signal line 478. Another terminal of each capacitor in the plurality of capacitors 1815A–1815E couples to a drain terminal of a corresponding NMOS transistor in the plurality of NMOS transistors 1805A–1805E. A source terminal of each of the NMOS transistors in the plurality of NMOS transistors 1805A–1805E couples to the reference terminal 1630 (note that the reference terminal 1630 in FIG. 18 may not necessarily be the same as reference terminal 1630 in FIG. 17).

More particularly, the first capacitor 1815A ($C_{D0}$) couples between signal line 478 and the drain terminal of NMOS transistor 1805A ($S_0$), and the source terminal of NMOS transistor 1805A ($S_0$) couples to the reference terminal 1630, and so on for capacitors 1815B–1815E and NMOS transistors 1805B–1805E. NMOS transistor 1805A acts as a switch ($S_0$). It adds in (i.e., switches into the circuit) or leaves out (i.e., switches out of the circuit) the capacitor 1815A ($C_{D0}$) in the overall capacitance of the discretely variable capacitance 1705 (capacitor $C_D$ in FIG. 17). A similar arrangement and operation applies to capacitors 1815B–1815E ($C_{D0}$ through $C_{DN}$) and NMOS transistors 1805B–1805E ($S_0$ through $S_N$), respectively.

As mentioned above, the calibration signal 1525 controls the operation of the NMOS transistors 1815A–1815E. The calibration signal 1525 in exemplary embodiments of the invention includes one or more bits 1810A–1810E ($B_0$ through $B_N$). Put another way, the calibration signal 1525 constitutes a digital word with N+1 bits, $B_0, B_1, B_2, \ldots, B_{N-1}$, and $B_N$. Each of the bits 1810A–1810E controls the switching action of a corresponding NMOS transistor in the plurality of NMOS transistors 1805A–1805E. For example, bit 1810A controls the on and off states of NMOS transistor 1805A, and so on. When a given bit, $B_i$, where i=0, 1, 2, ..., N, has a logic high level, the corresponding NMOS transistor, $S_i$, turns on, thus coupling the capacitor $C_{Di}$ between the signal line 478 and the reference terminal 1630. Conversely, when the bit $B_i$ has a logic-low level, the corresponding NMOS transistor, $S_i$, turns off and decouples the capacitor $C_{Di}$ from the reference terminal 1630.

Advantages of this arrangement include providing a large range of possible capacitance variations and a solution to problems with poor component tolerances that plague conventional designs. As another significant advantage, the arrangement drastically reduces the capacitance variation that the continuously variable capacitance 1710 (capacitor $C_A$ in FIG. 17) has to accommodate. Although typically impractical to implement off-chip, one may integrate the digitally controlled arrangement described above into a single integrated circuit, as desired.

One may use the discretely variable capacitance 1705 to provide a coarse tuning of the oscillation frequency of the VCO circuitry 481 near the desired output frequency. The capacitance of the continuously variable capacitance 1710 then need only vary enough to cover the frequency range between the steps available through the discrete changes of the digitally controlled discretely variable capacitor 1705 and to cover any post-calibration component drifts (for example, because of temperature and voltage variations, and the like) and variations due to signal modulation. This reduction in the required capacitance variation eliminates the need for a large capacitance variation that typically requires the use of a variable reverse-biased diode (or varactor), as conventional VCO circuitries employ. Avoiding a large capacitance variation in turn results in reduced noise susceptibility. By eliminating the need for a varactor, the present invention provides a frequency synthesis solution suitable for integration in a single CMOS integrated circuit.

Note that one may couple together any number of capacitors and NMOS transistors circuits, as desired. Furthermore, one may make numerous variations and modifications to the circuit arrangement in FIG. 18 and still achieve a capacitance that is discretely variable based upon a digital control word or signal. The values of the capacitors and the control procedure would depend upon the choices made, as persons of ordinary skill in the art who have the benefit of the description of the invention understand.

Moreover, although exemplary embodiments of the invention, such as the embodiment in FIG. 18, use NMOS transistors, one may use other types of devices, as desired. For example, one may use P-type metal oxide semiconductor (PMOS) transistors to implement switches 1805A–1805E. The level and type of logic bits 1810A–1810E (i.e., the voltage level applied through each of the bits 1810A–1810E) corresponds to levels appropriate for the NMOS transistors 1805A–1805E. One may readily modify the level and type of logic bits 1810A–1810E, as desired. For example, one may use active-low logic signals, rather than active-high logic signals. Furthermore, if one uses PMOS transistors rather than NMOS transistors to implement switches 1805A–1805E, one may invert the logic levels of bits 1810A–1810E to accommodate the PMOS transistors. In addition, one may use binary or thermometer coding in the implementation of the discretely variable capacitor 1705.

Note that FIG. 18 provides merely one way of implementing the discretely variable capacitor 1705. As described in commonly owned U.S. patent application Ser. No. 09/708,339, mentioned above and incorporated by reference, one may use a variety of capacitor/switch circuit arrangements to implement the discretely variable capacitor 1705, as desired. The choice of circuit arrangement depends on design and performance specifications for a particular application. Furthermore, one may use differential, rather than single-ended circuit implementations, as described in U.S. patent application Ser. No. 09/708,339.

Exemplary embodiments of the invention relate to VCO circuitries and RF apparatus implemented in CMOS processes. One, however, may use other types of semiconductor fabrication processes, as desired. The choice of the type of switch and control signals used depends in part on the type of semiconductor and processing technology used, as persons of ordinary skill in the art who have the benefit of the description of the invention understand.

For the circuit depicted in FIG. 18, with simple capacitor/switch circuits coupled together in parallel fashion, the total capacitance for the discretely variable capacitance 1705 equals the sum of the capacitances of all capacitors that have their respective switches in the ON (i.e., conducting) state. Thus, one may represent the total capacitance for the discretely variable capacitance 1705 as:

$$C_D = (C_{D0} \cdot B_0) + (C_{D1} \cdot B_1) + \ldots + (C_{DN-1} \cdot B_{N-1}) + (C_{DN} \cdot B_N).$$

If one considers each capacitance value as a multiple of a unit or base capacitance value, $C_0$, times a desired capacitor weighting, W, one may represent the total capacitance as:

$$C_D = (W_{D0} \cdot C_0 \cdot B_0) + (W_{D1} \cdot C_0 \cdot B_1) + \ldots + (W_{DN-1} \cdot C_0 \cdot B_{N-1}) + (W_{DN} \cdot C_0 \cdot B_N).$$

In this embodiment, the choice of weighting coefficients defines what values of capacitance are available.

Numerous weighting schemes are possible, and the one implemented depends upon the particular design considerations involved. One possible choice for a weighting scheme is an equal weighting scheme, such that all of the weights are the same. In other words, $$W_{D0} = W_{D1} = \ldots = W_{DN-1} = W_{DN} = \lambda,$$

where $\lambda$ represents a constant. This equal weighting scheme, however, is relatively inefficient because it requires a large number capacitor/switch circuits and a small base capacitor value to provide a large number of capacitor value choices. Another possible weighting scheme is a binary weighting scheme, such that each weight differs from the previous weight by a factor of 2. Thus, $$W_{D0} = 1,$$

$$W_{D1} = 2,$$

$$W_{D2} = 4$$

$$\ldots$$

$$W_{DN-1} = 2^{N-1},$$

and $$W_{DN} = 2^N.$$

Although this binary weighting scheme is relatively efficient in allowing the selection of a wide range of capacitance values with a limited number of capacitor/switch circuits, this scheme suffers from practical implementation problems due to differential non-linearities (DNL) in manufacturing the capacitance values. In contrast, the equal weighting scheme has a low occurrence of problems with DNL.

Possible compromise weighting schemes between the equal and binary weighting schemes include radix less-than-two and mixed radix weighting schemes. One may implement a radix less-than-two weighting scheme, for example, such that each weight is a factor (i.e., the radix) less than 2 (e.g., 7/4) different from the previous weight:

$W_{D0}=1$, $W_{D1}=7/4$, $W_{D2}=(7/4)^2$

...

$W_{DN-1}=(7/4)^{N-1}$, and $W_{DN}=(7/4)^N$.

One may also implement a mixed radix weighting scheme, for example, such that each weight is some combination of factors (e.g., 2 and 7/4) different from the previous weight:

$W_{D0}=1$, $W_{D1}=2$, $W_{D2}=4$, $W_{D3}=4 \cdot (7/4)$, $W_{D4}=4 \cdot (7/4)^2$

...

and $W_{DN}=2^X \cdot (7/4)^Y$, where X and Y constitute integer numbers.

Generally, the choice of the weighting scheme depends on the particular circuit used and implemented and the coarse tuning algorithm chosen. The frequency calibration engine 1510 may perform any desired procedure to adjust the digital control word (i.e., the calibration signal 1525) to coarsely tune the output frequency of the VCO circuitry 481. Potential procedures include non-linear control algorithms and linear control algorithms. For example, one may implement a non-linear control algorithm that makes a simple "too fast" or "too slow" frequency comparison determination between the output signal 478 of the VCO circuitry 481 and reference signal 1530 or between a frequency-scaled version of output signal 478 and a frequency-scaled version of reference signal 1530.

The frequency calibration engine 1510 may use a successive approximation algorithm to coarsely tune the frequency of the output signal 478 of the VCO circuitry 481. Alternatively, one may use a linear control algorithm that makes a quantitative frequency comparison determination about the approximate size of the frequency error between the frequency of the output signal 478 and the reference signal 1530. The frequency calibration engine 1510 may change the calibration signal (i.e., digital control word) 1525 by an appropriate amount to compensate for the size of the frequency error. The procedure used may depend upon numerous variables, including the particular application involved and the level of coarse tuning desired, as persons of ordinary skill in the art who have the benefit of the description of the invention understand.

For successive approximation-type algorithms, it is typically easier to recover from erroneously dropping capacitance values, while it is typically more difficult to recover from erroneously keeping capacitance values. In other words, one may more easily recover from erroneously turning off the respective switch and thus excluding the capacitance from the overall capacitance in the LC-tank than from erroneously turning on the respective switch and therefore including the capacitance to the overall capacitance in the LC-tank. In addition, manufacturing tolerances may create significant problems because the actual capacitance values may not match desired values. To compensate for these recovery and tolerance problems, one may manufacture the capacitance values in the radix less-than-two scheme described above. To further improve redundancy and error recovery, one may use capacitor weightings and the number of capacitors so as to achieve a degree of value overlap.

Exemplary embodiments of the invention use a modified binary search algorithm. The well-known binary search algorithm is within the knowledge of persons of ordinary skill in the art. The modified binary search algorithm differs from the conventional binary search algorithm in that it uses overlapping ranges. Conventional binary search algorithms operate by dividing a search range into sub-ranges and repeating the process until locating the desired search datum. The modified binary search algorithm uses overlapping ranges to avoid errors that may result from imperfections in practical circuit implementations. The imperfections may include component tolerance, drift, mismatch, and the like. In the absence of overlapping ranges, the imperfections may cause the search algorithm to choose an incorrect range and, thus, produce erroneous and/or undesired results. More specifically, in the absence of overlapping ranges, a value relatively close to a range boundary may cause the algorithm to select an incorrect sub-range and therefore produce an erroneous result. Using overlapping ranges avoids that situation. Note that one may modify the control algorithm and/or the capacitor values as desired, and that one may use numerous alternative circuit designs, while still achieving a discretely variable capacitance circuit as the present invention contemplates.

Figure 19A:
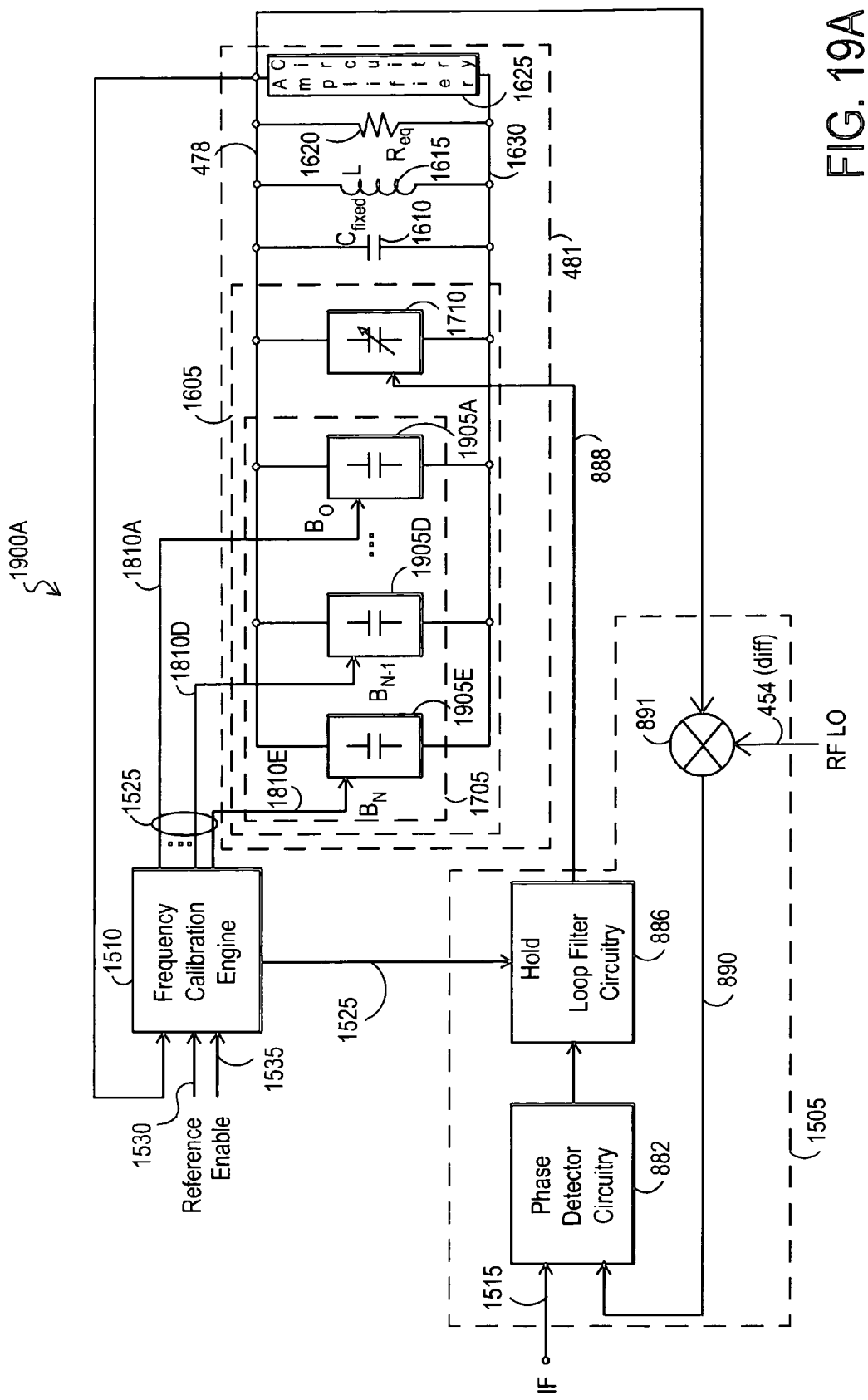
FIG. 19A illustrates an embodiment according to the invention of a circuit arrangement for use in a transmitter circuitry.

FIG. 19A shows an embodiment 1900A according to the invention of a circuit arrangement for use in a transmitter circuitry. Embodiment 1900A provides a more detailed conceptual or block diagram of embodiment 1500 (see FIG. 15). The embodiment 1900A includes an offset-PLL circuitry 1505, VCO circuitry 481, and frequency calibration engine 1510. The offset-PLL circuitry 1505 includes phase detector 882, loop filter circuitry 886, and offset mixer circuitry 891. The various blocks and signals in the circuit arrangement in embodiment 1900A may have similar structures and perform the same or similar functionality as the corresponding blocks and signals in embodiment 1500, described above. The offset-PLL circuitry 1505 may comprise offset-PLL circuitry 472 in FIGS. 4–7 or offset-PLL circuitry 897 in FIG. 8, as desired.

The embodiment 1900A shows further details of the interconnections between the frequency calibration engine 1510 and the discretely variable capacitor 1705. The VCO circuitry 481 includes variable capacitor 1605, fixed capacitor 1610, inductor 1615, equivalent resistance 1620, and amplifier circuitry 1625. The variable capacitor 1605 includes discretely variable capacitor 1705 and continuously variable capacitor 1710. The various blocks and signals within the VCO circuitry 481 may have similar structure and functionality to the corresponding blocks and signals shown in FIGS. 16–17.

Similar to FIG. 17, the calibration signal 1525 adjusts the capacitance of the discretely variable capacitor 1705. That adjustment occurs during the first phase of the calibration procedure, as described above. The discretely variable capacitor 1705 includes variable capacitors 1905A through 1905E. In general, one may use any suitable number of variable capacitors 1905A–1905E, as desired. The calibration signal 1525 constitutes a digital word that includes one bit for adjusting the capacitance of each of the variable capacitors 1905A–1905E. Thus, calibration signal 1525 includes bits 1810A–1810E, where bit 1810A adjusts the capacitance of variable capacitor 1905A, bit 1810B adjusts the capacitance of variable capacitor 1905B, and so on.

In exemplary embodiments, each of the variable capacitors 1905A–1905E has the structure shown in FIG. 19B. Thus, each of the variable capacitors 1905A–1905E includes a capacitor $C_{Di}$ 1915, a switch or transistor $S_i$ 1920, and a control bit $B_i$ 1925. Capacitor $C_{Di}$ 1915 denotes one of capacitors 1815A–1815E, whereas switch $S_i$ 1920 denotes one of the switches 1805A–1805E in FIG. 18. Likewise, control bit $B_i$ 1925 denotes one of the bits 1810A–1810E in FIG. 18.

Similar to FIG. 17, the filtered offset PLL signal 888 adjusts the capacitance of the continuously variable capacitor 1710. That adjustment takes place during the second phase of the calibration of the output frequency of the VCO circuitry 481, as described above.

Together with other blocks in embodiment 1900A, the VCO circuitry 481 forms two feedback loops. The first feedback loop includes VCO circuitry 481 and the frequency calibration engine 1510. The second feedback loop includes VCO circuitry 481, offset mixer circuitry 891, phase detector circuitry 882, and loop filter circuitry 886. The two feedback loops function similarly to the two feedback loops described in connection with embodiment 1500 (see FIG. 15).

The calibration of the VCO circuitry 481 includes two stages or phases, as with the embodiment 1500 shown in FIG. 15. In the first phase, the frequency calibration engine 1510 uses the hold signal 1520 to maintain a relatively constant level of the filtered offset PLL signal 888. Consequently, the loop filter circuitry 886 does not adjust the output frequency of the VCO circuitry 481 during this phase. Using the calibration signal 1525, the frequency calibration engine 1510 coarsely adjusts the output frequency of the VCO circuitry 481 to a known frequency. In the second phase, once the frequency calibration engine 1510 de-asserts the hold signal 1520, the offset-PLL circuitry 1505 proceeds to further adjust the output frequency of the VCO circuitry 481.

During the second phase, the hold signal 1510 no longer keeps the filtered offset PLL signal 888 at a relatively constant level. Consequently, the output signal of the loop filter circuitry 886 may vary and thus cause the adjustment of the output frequency of the VCO circuitry 481. Through feedback action, the filtered offset PLL signal 888 varies in such a way as to further adjust or fine tune the output frequency of the VCO circuitry 481 to a frequency substantially equal to the desired or prescribed frequency. IF signal 1515 modulates the output frequency of the VCO circuitry 481 through the tracking offset-PLL circuitry, as described in detail in connection with embodiment 1500 (see FIG. 15). In exemplary embodiments, for example, embodiments 1500 and 1900A, the first and second stages in the calibration of the output frequency of the VCO circuitry 481 occur before a transmit burst, for example, a burst according to GSM standards, begins. Then, during the burst, the offset PLL circuitry 1505 may further adjust or fine tune the output frequency of VCO circuitry 481 to compensate for various environmental changes, such as temperature and voltage variations, and for variations due to signal modulation.

In various embodiments according to the invention, such as embodiments 1500 and 1900A, regardless of the exact structure and control algorithm used for the discretely variable capacitor 1705, at the conclusion of the first calibration phase the frequency calibration engine 1510 fixes the then-existing calibration signal 1525. Consequently, the capacitance of the discretely variable capacitor 1705 becomes fixed and will remain the same while the capacitance of the continuously variable capacitor 1710 varies in the second calibration phase. In this way, RF apparatus according to the invention may operate to initially calibrate the frequency of the output signal 478 of the VCO circuitry 481 to a desired output frequency, by providing a coarse level of tuning control through the discretely variable capacitor 1705 and a fine level of tuning control via the continuously variable capacitor 1710.

In exemplary embodiments, such as embodiments 1500 and 1900A, the hold signal 1520 also causes the capacitance of the continuously variable capacitor 1710 to have a value that falls approximately in the middle of its capacitance range. More specifically, during the first phase of the calibration cycle, the hold signal 1520 causes the filtered offset PLL signal 888 to have a relatively constant level at a particular level. That level of the filtered offset PLL signal 888 causes the capacitance of the continuously variable capacitor 1710 to have a value roughly mid-way between its minimum and maximum values. That capacitance value provides approximately equal ranges for adjustment of the capacitance value of the continuously variable capacitor 1710 towards either the minimum value or maximum value of the capacitance.

Figure 20:
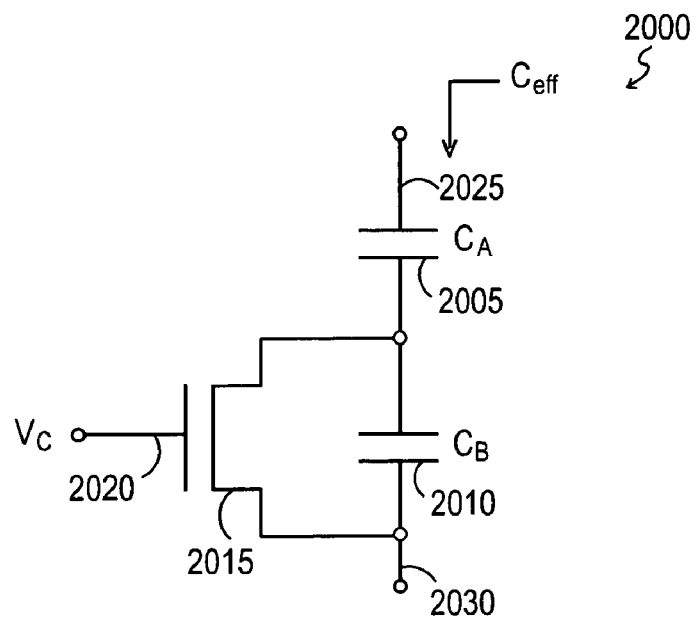
FIG. 20 depicts an exemplary embodiment of a single-stage continuously variable capacitor according to the invention.

FIG. 20 shows an exemplary embodiment of a single-stage continuously variable capacitor 1710. The embodiment 2000 includes a capacitor 2005, a transistor 2015, and a capacitor 2010. One terminal of the capacitor 2005 couples to one terminal 2025 of the continuously variable capacitor. A second terminal of the capacitor 2005 couples to a drain of the transistor 2015 and a terminal of capacitor 2010. A second terminal of capacitor 2010 couples to the source terminal of the transistor 2015 and a second terminal of the continuously variable capacitor 2030.

The terminal 2025 of the continuously variable capacitor may couple to the output 478 of the VCO circuitry 481, whereas the terminal 2030 of the continuously variable capacitor may couple to the reference terminal 1630. A control voltage 2020 ($V_c$) couples to a gate terminal of the transistor 2015. The control voltage 2020 ($V_c$) may constitute the filtered offset PLL signal 888, as FIGS. 15–17 and 19A illustrate. Note that, although FIG. 20 shows an NMOS device as the transistor 2015, one may use other types of devices, for example, PMOS devices, by making modifications within the knowledge of persons skilled in the art who have the benefit of the description of the invention. Generally, one may use a variable impedance device, one example of which constitutes the transistor 2015 in FIG. 20.

The impedance of the transistor 2015 or, generally, the variable impedance device, affects the effective capacitance between terminals 2025 and 2030. When the transistor 2015 has a high impedance (e.g., it is in the OFF state), the effective capacitance, $C_{eff}$, between the terminals 2025 and 2030 essentially constitutes a series coupling of capacitor 2005 and capacitor 2010. In other words, $$C_{eff} \approx \frac{C_A \cdot C_B}{C_A + C_B}, \quad \text{(Eq. 1)}$$

where $C_A$ and $C_B$ denote the capacitance values of capacitor 2005 and capacitor 2010, respectively. Note that Equation 1 above ignores the parasitic capacitances and resistances in the circuit.

In contrast, when the transistor 2015 turns fully on, it effectively shorts together the two terminals of capacitor 2010. As a result, the effective circuit between terminals 2025 and 2030 includes mainly the capacitor 2005. Put in mathematical terms, $$C_{eff} \approx C_A. \quad \text{(Eq. 2)}$$

Note that Equation 2 ignores the parasitic resistance of the transistor 2015 in its ON state, $R_{ds(on)}$, the parasitic capacitances present in the circuit, and other parasitic effects.

Figure 21:
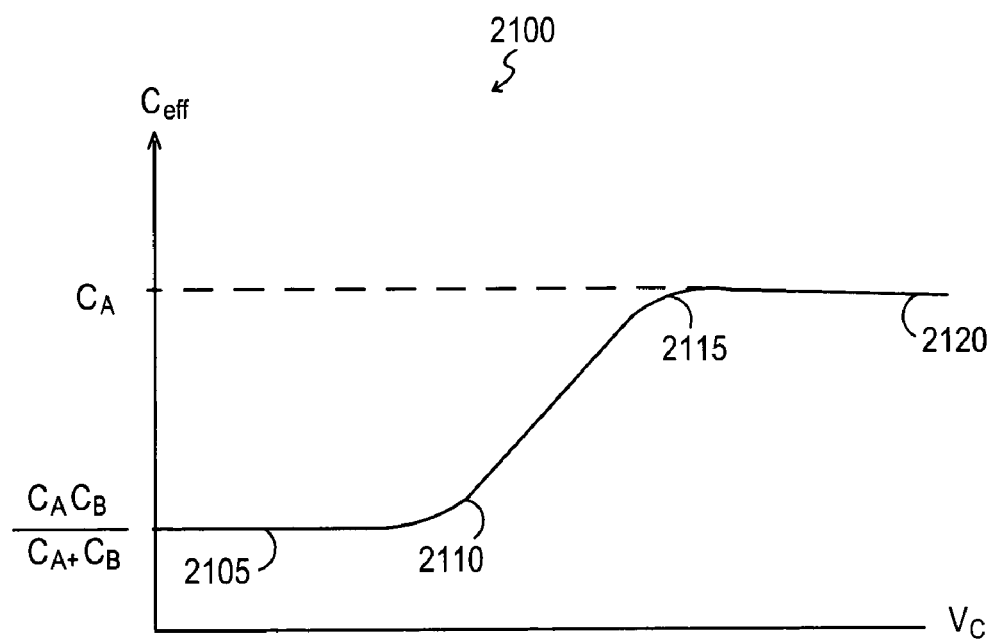
FIG. 21 illustrates a graph that illustrates an effective capacitance of a single-stage continuously variable capacitor as a function of a control voltage.

Between the two extremes of the transistor 2015 fully off and fully on, the effective capacitance, $C_{eff}$, varies as a function of the control voltage 2020 ($V_c$). FIG. 21 shows a graph 2100 that illustrates the dependence of the effective capacitance, $C_{eff}$, as a function of the control voltage 2020 ($V_c$). At point 2105 along the graph 2100, transistor 2015 is fully off, and Equation 1 provides the value of the effective capacitance, $C_{eff}$. As the control voltage 2020 increases, the effective capacitance remains relatively constant until point 2110, where transistor 2015 begins to turn on. In other words, point 2015 corresponds approximately to a value of the control voltage 2020 given by:

$$V_c \approx V_T, \quad \text{(Eq. 3)}$$

where $V_T$ denotes the threshold voltage of transistor 2015.

Between point 2105 and point 2110, transistor 2015 may conduct some current because of sub-threshold leakage. In typical implementations, however, the sub-threshold leakage currents have a magnitude that is relatively small and therefore does not materially affect the effective capacitance, $C_{eff}$. From the vicinity of point 2110 to the vicinity of 2115, transistor 2015 turns on as the control voltage 2020 increases. Near point 2115, transistor 2015 turns on fully, thus effectively shorting the terminals of capacitor 2010. Thus, for values of the control voltage 2020 beyond the corresponding value for point 2115, the effective capacitance, $C_{eff}$, remains relatively constant at about $C_A$. Point 2120 corresponds to a maximum value of the control voltage 2020. Equation 2 above provides the effective capacitance, $C_{eff}$, at point 2120, which approximately equals $C_A$.

Figure 22:
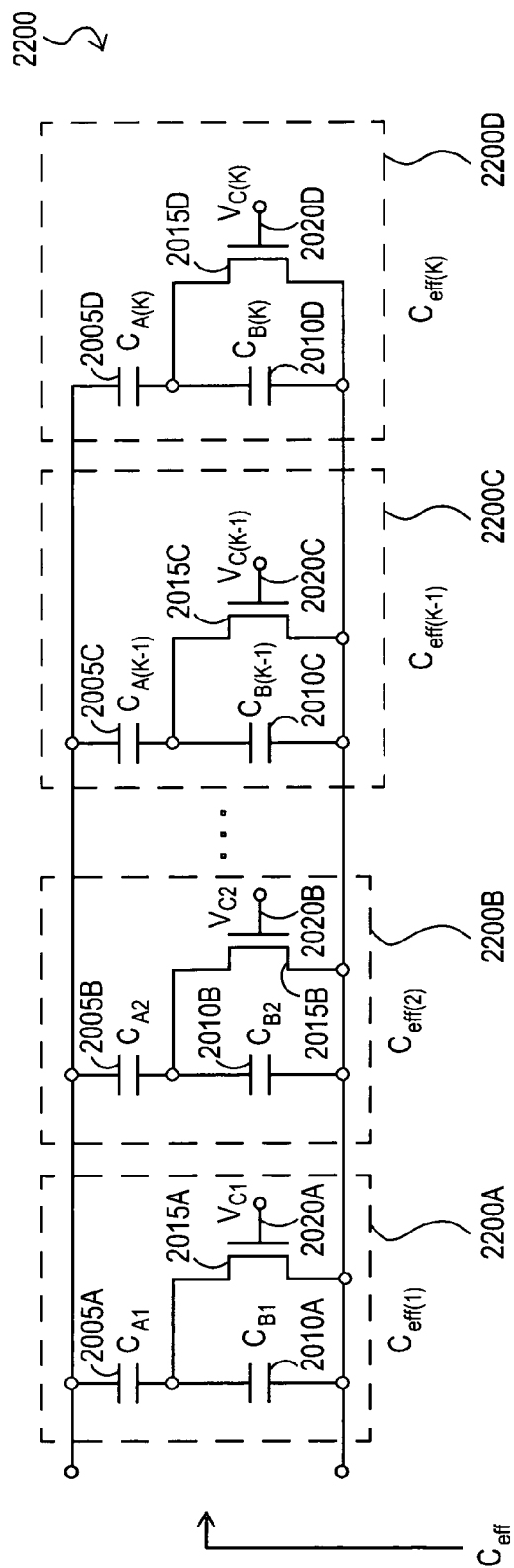
FIG. 22 shows an exemplary embodiment of a multi-stage continuously variable capacitor according to the invention.

Rather than the single-stage embodiment 2000 of the continuously variable capacitor 1710, one may use a multi-stage embodiment. FIG. 22 shows an embodiment 2200 of a multi-stage continuously variable capacitor 1710. The embodiment 2200 includes K stages, denoted as 2200A–2200D. Each of the stages 2200A–2200D may correspond to and have the circuitry of the single-stage embodiment 2000 of FIG. 20. In other words, each of the stages 2200A–2200D includes two capacitors and a transistor (or more generally, a variable impedance device) that couples to a control voltage. The embodiment 2200 therefore includes capacitors 2005A–2005D ($C_{A1}$–$C_{A(K)}$), capacitors 2010A–2010D ($C_{B1}$–$C_{B(K)}$), and transistors 2015A–2015D. A series of control voltages 2020A–2020D ($V_{c1}$–$V_{c(K)}$) controls the operation of transistors 2015A–2015D, respectively. In other words, control voltage 2020A couples to the gate terminal of transistor 2015A, control voltage 2020B couples to the gate terminal of transistor 2015B, and so on.

The effective capacitance, $C_{eff}$, of the embodiment 2200 depends on the effective capacitance of each of the stages 2200A–2200D. As mentioned above, each of the stages 2200A–2200D corresponds to the embodiment 2000 in FIG. 20. Thus, the effective capacitance, $C_{eff}$, of the embodiment 2200 constitutes the sum of the respective effective capacitances of each stage 2200A–2200D. In mathematical terms, $$C_{eff} = C_{eff(1)} + C_{eff(2)} + \ldots + C_{eff(K-1)} + C_{eff(K)} \quad \text{(Eq. 4A)}$$

or, alternatively, $$C_{eff} = \sum_{i=1}^{K} C_{eff(i)}, \quad \text{(Eq. 4B)}$$

where $C_{eff(1)}$, $C_{eff(2)}$, ..., $C_{eff(K-1)}$, and $C_{eff(K)}$ represent the effective capacitance of a corresponding stage 2200A–2200D of the embodiment 2200.

Figure 23A:
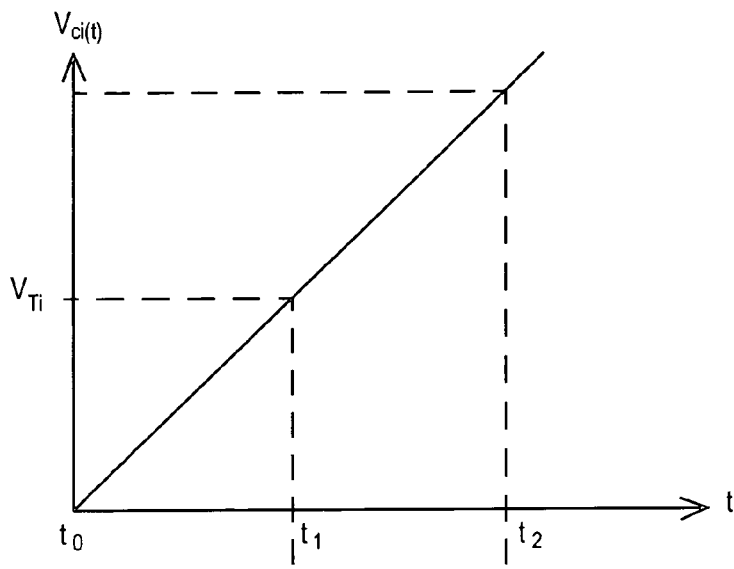
FIG. 23A depicts a control voltage as a function of time in an exemplary embodiment according to the invention of the continuously variable capacitor.
Figure 23B:
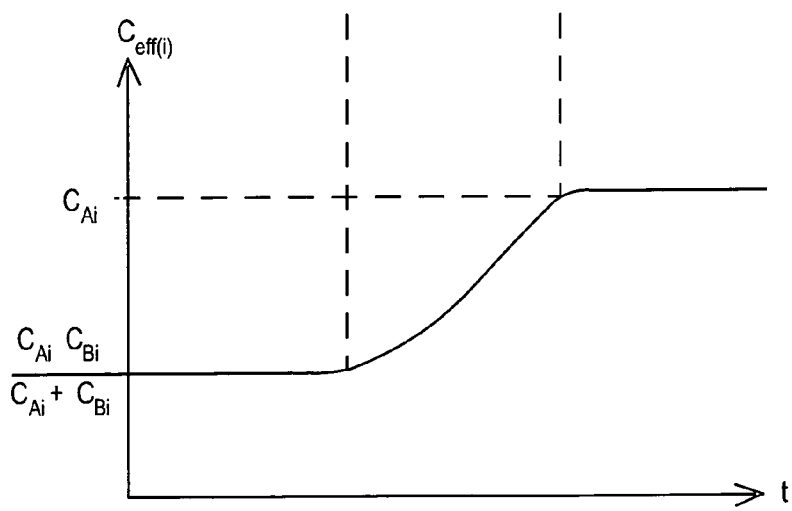
FIG. 23B illustrates variation of the effective capacitance as a function of time in an exemplary embodiment according to the invention of a continuously variable capacitor.

FIG. 23 shows how the effective capacitance, $C_{eff(i)}$, of one of the stages 2200A–2200D, say, stage i, changes in response to variations in its respective control voltage, $V_{c(i)}$. FIG. 23A illustrates the control voltage, $V_{c(i)}$, as a function of time. The control voltage $V_{c(i)}$ varies as a linear function of time. FIG. 23B depicts the variation of the effective capacitance, $C_{eff(i)}$, as a function of time when driven by the control voltage $V_{c(i)}$ of FIG. 23A. At $t=t_0$, the control voltage $V_{c(i)}$ equals zero. As a result, the transistor in stage i is in the OFF state and the effective capacitance of the stage has a value according to Equation 1 above (using the values of the two capacitors for stage i). At $t=t_1$, the control voltage $V_{c(i)}$ equals approximately the threshold voltage $V_{Ti}$ of the transistor in stage i. Thus, the effective capacitance $C_{eff(i)}$ begins to increase. At $t=t_2$, the control voltage $V_{c(i)}$ has a sufficiently high value as to fully turn on the transistor in stage i. Thus, effective capacitance of stage i has a value according to Equation 2 above (using the respective capacitor value for stage i). Further increases in the control voltage $V_{c(i)}$ do not change appreciably the value of the effective capacitance $C_{eff(i)}$, as described above.

By using an appropriate control scheme (e.g., by using appropriate voltages 2020A–2020D), one may cause the effective capacitance, $C_{eff}$, of the embodiment 2200 to vary in an approximately linear manner. In other words, by manipulating the level of the control voltages 2020A–2020D as a function of time, the overall effective capacitance, $C_{eff}$, of the embodiment 2200 provides a nearly linear response. As an illustration, FIG. 24 shows an example of using offset control voltages to provide an approximately linear response in the effective capacitance $C_{eff}$ of a three-stage version of the embodiment 2200. Each of the three stages may have a circuit arrangement similar to one of the stages 2200A–2200D shown in FIG. 22.

Figure 24A:
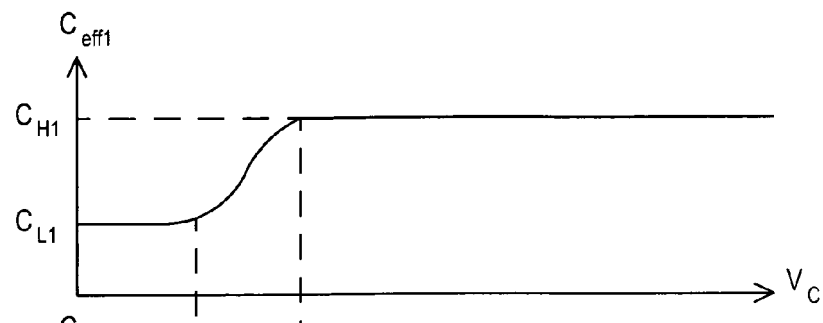
FIG. 24A shows an effective capacitance of a first stage of a three-stage continuously variable capacitor in an exemplary embodiment according to the invention.
Figure 24B:
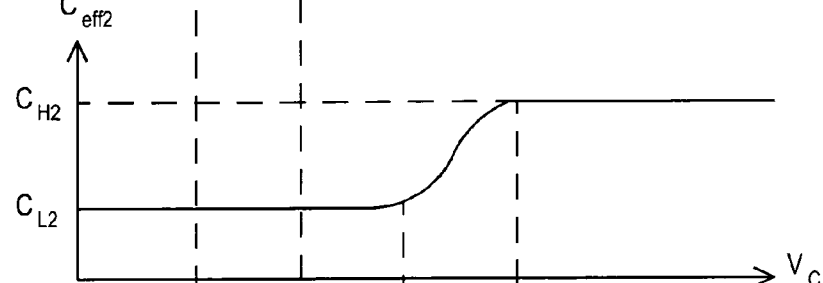
FIG. 24B depicts an effective capacitance of a second stage of a three-stage continuously variable capacitor in an exemplary embodiment according to the invention.
Figure 24C:
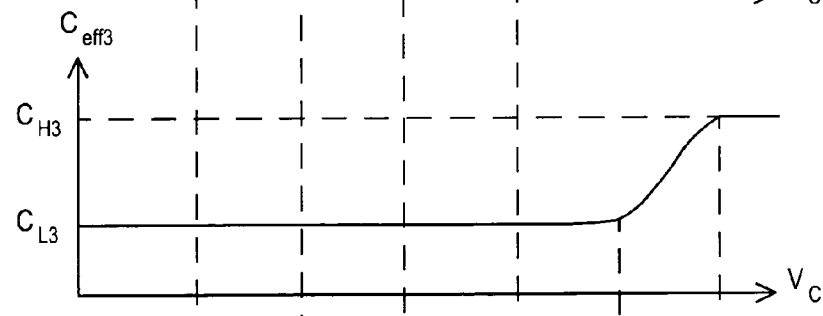
FIG. 24C illustrates an effective capacitance of a third stage of a three-stage continuously variable capacitor in an exemplary embodiment according to the invention.

FIGS. 24A–24C illustrate the effective capacitance of each of the three stages (i.e., $C_{eff1}$, $C_{eff2}$, and $C_{eff3}$), respectively, as a function of control voltage, $V_c$. The effective capacitance of the three stages changes at voltages $V_1$, $V_2$, and $V_3$ (derived as described below), respectively. At $V_c=V_1$, the transistor in the first stage turns on, the effective capacitance of the first stage, $C_{eff1}$, begins to rise. Similarly, at $V_c=V_2$, the transistor in the second stage turns on, the effective capacitance of the first stage, $C_{eff2}$, begins to rise. A similar phenomenon occurs in the third stage at $V_c=V_3$. The level of the control voltage for the second stage includes an offset from the level of the control voltage for the first stage. Similarly, the level of the control voltage for the third stage includes an offset from the level of the control voltage for the second stage. Mathematically, one may represent the relations among the voltages $V_1$, $V_2$, and $V_3$ as follows:

$$V_2 = V_1 + \delta_1, \text{ and}$$

$$V_3 = V_2 + \delta_2,$$

where $\delta_1$ and $\delta_2$ represent offset voltages. Note that $\delta_1$ and $\delta_2$ may have equal or differing values, as desired. In each stage, as the transistor turns on fully, and the effective capacitance of that stage levels off, similar to what FIG. 21 shows. Thus, for a stage i, the effective capacitance makes a transition from a low capacitance level $C_{Li}$ to a high capacitance level $C_{Hi}$, as FIGS. 24A–24C illustrate.

Figure 24D:
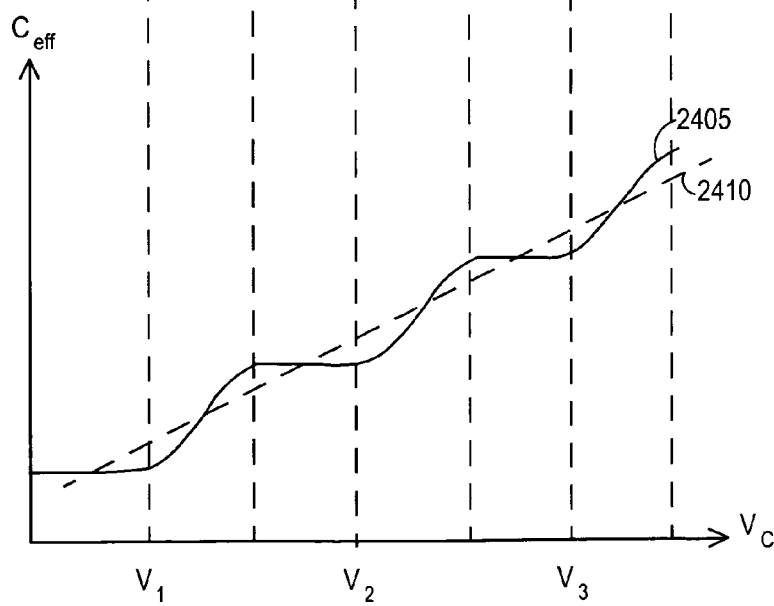
FIG. 24D shows a plot of an effective capacitance of the overall three-stage continuously variable capacitor in an exemplary embodiment according to the invention.

FIG. 24D illustrates a plot 2405 of the effective capacitance, $C_{eff}$, of the overall three-stage embodiment. Because of the parallel coupling of the three stages, the overall effective capacitance, $C_{eff}$, constitutes the sum of the effective capacitances of the three stages. Thus, Equations 4A and 4B govern the overall effective capacitance, $C_{eff}$. Referring to FIG. 24D, because of the offset relationships among the voltages at which the transistors in the respective three stages turn on (i.e., voltages $V_1$, $V_2$, and $V_3$), the plot with respect to the control voltage of the overall effective capacitance, $C_{eff}$, has a relatively linear shape. Note that one may increase the linearity of plot of the overall effective capacitance by increasing the number of stages within the continuously variable capacitor 1710.

Note that, for the sake of clarity of presentation, FIG. 24 does not show overlapping capacitance ranges (i.e., it does not illustrate overlapping transitions in the capacitance of the three stages). As noted above, in a practical implementation, one may use overlapping transitions in the capacitance of the three stages (e.g., the capacitance of the second stage begins to make a transition before the capacitance of the first stage has completed its transition), as desired.

As FIG. 24D illustrates, one may fit a line 2410 to the plot 2405 (e.g., by using the least-squares method or other suitable techniques). Mathematically, one may express the slope of line 2410, m, and the gain, $K_v$, of the VCO circuitry 481, as:

$$m = \frac{dC_{eff}}{dV_c}, \text{ and } K_v = \frac{df_o}{dV_c},$$

or alternatively $$K_v = m\frac{df_o}{dC_{eff}},$$

where $f_o$, $C_{eff}$, and $V_c$ denote the resonant frequency of the LC-tank within the VCO circuitry 481, the effective capacitance, and the control voltage, respectively. Thus, by using a plurality of stages, one may obtain an approximately linear overall effective capacitance, $C_{eff}$, of the continuously variable capacitor (note that the overall effective capacitance of the plurality of stages constitutes the capacitance value of the continuously variable capacitor 1710). The approximately linear effective capacitance results in a relatively linear VCO gain, $K_v$, which provides overall higher performance of the RF transceiver or transmitter circuitry.

Note that burst-mode communication systems, such as GSM, do not necessitate using VCO circuitries with high gains, i.e., large values of $K_v$. In burst-mode systems, the user sets the desired frequency of the VCO circuitry 481 before a burst commences. In other words, the user specifies the center frequency of a desired GSM channel. The VCO circuitry 481 subsequently tunes the frequency of its output signal 478 to the specified frequency. During the data burst, the VCO circuitry 481 need not make relatively large variations in the frequency of its output signal 478. Rather, the VCO circuitry 481 may make relatively small frequency changes to compensate for intra-burst variations in its operating environment (e.g., a change in temperature, voltage, and the like), and for variations because of signal modulation. Consequently, in burst-mode systems, the VCO circuitry 481 may have a relatively small gain, $K_v$, and still provide high overall system performance.

Although FIG. 24 shows plots for a continuously variable capacitor that includes three stages, one may use a different number of stages, as desired. As persons of ordinary skill in the art who have the benefit of the description of the invention understand, using a larger number of stages results in a smoother plot of the overall effective capacitance. Consequently, the VCO circuitry 481 has a more linear response as the number of stages increases.

Figure 25:
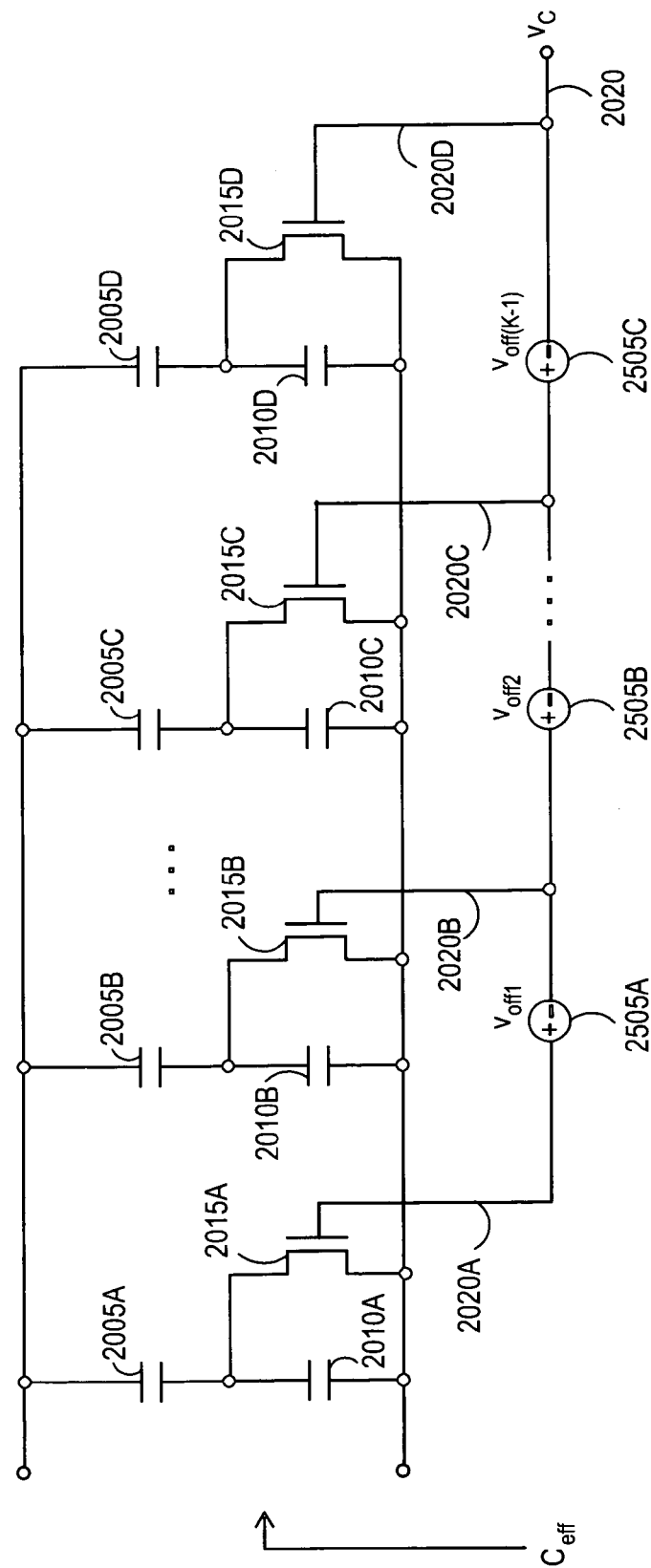
FIG. 25 depicts an exemplary circuit arrangement for using offset voltages to control a multi-stage continuously variable capacitor according to the invention.

FIG. 25 illustrates an exemplary circuit arrangement for using offset voltages to realize a multi-stage continuously variable capacitor 1710. Each stage in FIG. 25 has a circuit arrangement similar to what FIG. 20 shows. Thus, overall, the circuit arrangement in FIG. 25 includes capacitors 2005A–2005D, 2010A–2010D, and transistors 2015A–2015D. Control voltages 2020A–2020D couple, respectively, to the gate terminals of transistors 2015A–2015D. The circuit arrangement further includes voltage sources 2505A–2505C ($V_{off1}$–$V_{off(K-1)}$). The voltage sources 2505A–2505C act as offset voltage sources that derive control voltages 2020A–2020C from the control voltage 2020 ($V_c$). Control voltage 2020D constitutes the control voltage 2020 (i.e., with a zero offset). In exemplary embodiments, the control voltage 2020 constitutes the filtered offset PLL signal 888.

In the exemplary circuit arrangement of FIG. 25, the control voltage 2020 ($V_c$) and 2505A–2505C couple in series as a chain. Voltage source 2505A drives the gate terminal of transistor 2015A, voltage source 2505B controls transistor 2015B, and so on. Finally, voltage source 2020 (i.e., the control voltage), drives the gate terminal of transistor 2015D. Put another way, the voltage driving transistor 2015D has a zero offset from the control voltage 2020. Note, however, that one may offset the gate voltage of transistor 2015D from the control voltage 2020, as desired. Furthermore, one may use voltage sources 2505A–2505C that have equal or unequal voltage levels. The choice of the voltage levels depends on the particular implementation of the inventive concepts described here, for example, the type and threshold or conduction voltages of the transistors or variable impedance devices.

The plot of the effective capacitance, $C_{eff}$, of the entire chain of stages in FIG. 25 has a similar overall shape as does plot 2405 in FIG. 24. The exact shape of the effective capacitance depends, among other things, on the number of stages used in the circuit arrangement of FIG. 25. As mentioned above, the larger the number of stages, the smoother and more linear the plot of the effective capacitance. In a typical application, one may employ a suitable number of stages, as desired, depending on the design and performance specification for that particular implementation.

Figure 26:
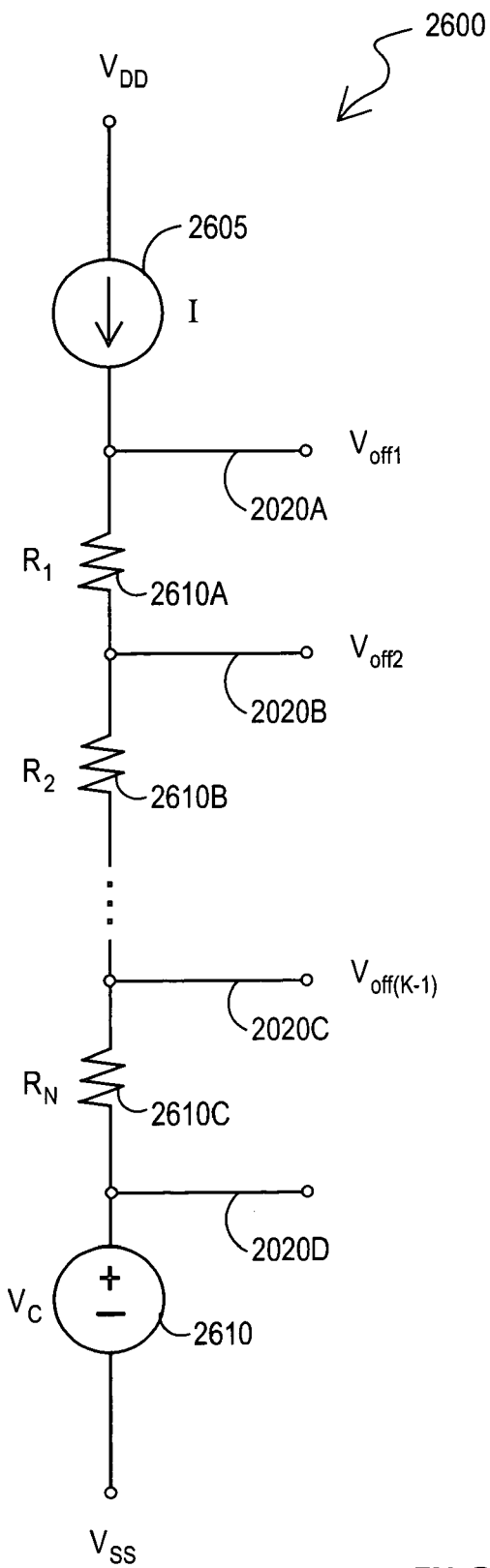
FIG. 26 illustrates an exemplary embodiment according to the invention for generating the offset voltages that constitute the control voltages for the various stages of a continuously variable capacitor according to the invention.

One may implement the voltage sources 2505A–2505C in a variety of ways. FIG. 26 shows one embodiment for generating the offset voltages that provide the control voltages for the various stages of the continuously variable capacitor (such as the embodiment shown in FIG. 25). Embodiment 2600 in FIG. 26 includes a current source 2605 and a plurality of resistors 2610A–2610C. A voltage source 2610 represents the voltage source that provides the control voltage 2020D. The current source 2605, the resistors 2610A–2610C, and the control voltage source 2610 couple in a series chain between the supply voltage, $V_{DD}$, and the reference or ground voltage, $V_{SS}$. In the embodiment shown in FIG. 26, the current source 2605 resides at the top of the chain and the control voltage source 2610 at the bottom of the chain with resistors 2610A–2610C between the two, although one may use other arrangements, as desired.

The current source 2605 provides an essentially constant current, I, to the chain of resistors 2610A–2610C. The flow of current I through the resistors 2610A–2610C gives rise to offset voltages that constitute control voltages 2020A–2020C. Control voltages 2020A–2020C drive the transistors in the various stages of the continuously variable capacitor, as described above. The control voltage source 2610 provides control voltage 2020D, as also described above. By controlling the resistance of resistors 2610A–2610C, one may provide various levels of the offset voltages and, hence, the levels of the control voltages to the various stages.

In exemplary embodiments, transistors 2015A–2015D constitute MOS devices, which have a relatively high gate input resistance. Consequently, the currents flowing into the gates of the transistors 2015A–2015D have relatively small magnitudes and do not appreciably affect the levels of the control voltages for the various stages. If one uses general variable impedance devices or circuit arrangements that draw larger currents through their control terminals, one may adjust the resistance of the resistors 2610A–2610C to compensate for those currents. Furthermore, one may adjust the values of resistors 2610A–2610C to account for, or compensate for, non-ideal behavior in various components. The resistors 2610A–2610C may therefore have the same or different resistances. In one embodiment according to the invention, however, the resistors 2610A–2610C have approximately the same value and the transistors 2015A–2015D have roughly the same threshold voltage.

For a relatively large number of resistors in the circuit arrangement of FIG. 26, the control voltages generated by resistors near the top of the chain may fail to produce the desired voltage levels. More specifically, as the desired voltage levels near the supply voltage, the current source 2605 ceases to supply the current I to the resistor chain. That performance limitation in the current source 2605 arises from a practical, rather than ideal, implementation of the current source 2605. Once the current source 2605 ceases to supply current I to the resistor chain, one or more of the control voltages may fail to have their desired levels. Thus, generally speaking, the circuit arrangement of FIG. 26 is suitable for relatively small numbers of control voltages, which may have small dynamic ranges.

Figure 27:
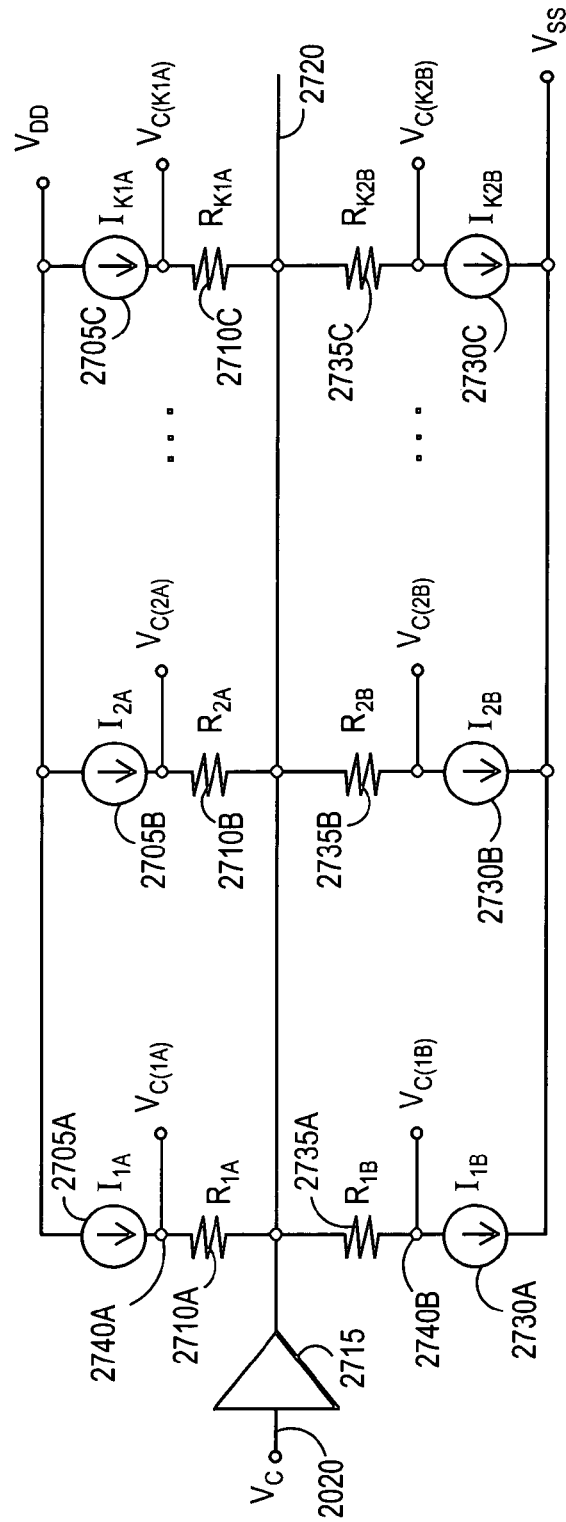
FIG. 27 shows another circuit arrangement for generating control voltages in a multi-stage continuously variable capacitor in an exemplary embodiment according to the invention.

FIG. 27 shows another embodiment according to the invention for generating control voltages in a multi-stage continuously variable capacitor. Embodiment 2700 in FIG. 27 overcomes the limitation of the circuit arrangement of FIG. 26. A buffer 2715 buffers control voltage 2020 and generates a buffered control voltage 2720. In exemplary embodiments, the buffer 2715 has a unity voltage-gain, although one may use other gain values in other embodiments of the invention, as desired, by making modifications within the knowledge of persons of ordinary skill in the art who have read the description of the invention. The buffer 2715 provides increased current-drive capability at its output (i.e., the node that supplies the buffered control voltage 2720). Depending on the current-drive capability of the voltage source that supplies the control voltage 2020, however, one may omit the buffer 2715, as desired.

Embodiment 2700 includes a plurality of circuit branches in its upper part and a plurality of circuit branches in its lower part. FIG. 27 shows three branches in each of the lower and upper parts of the embodiment 2700 for illustration purposes. Note, however, that as persons of ordinary skill in the art who have the benefit of the description of the invention understand, one may generally use other numbers of branches, as desired. Each of the circuit branches includes a series coupling of a current source and a resistor. Thus, the circuit branches in the upper part employ current sources 2705A–2705C and resistors 2710A–2710C. Similarly, the circuit branches in the lower part include current sources 2730A–2730C and resistors 2735A–2735C. Embodiment 2700 supplies control voltages $V_{C(1A)}$–$V_{C(K1A)}$ from the circuitry in its upper part. Likewise, embodiments 2700 provides control voltages $V_{C(1B)}$–$V_{C(K2B)}$ from the circuitry in lower part.

Each of the branches in the upper part couples between the supply voltage $V_{DD}$ and the output of buffer 2715. In each branch, the node that couples each resistor to its respective current source supplies a control voltage for driving a transistor or variable impedance device in the multi-stage continuously variable capacitor. For example, in the left-most branch in the upper-part of the embodiment 2700, current source 2705A couples to the supply voltage $V_{DD}$ and one terminal of resistor 2710A (i.e., node 2740A). A second terminal of resistor 2710A couples to the output of buffer 2715 (i.e., the node that supplies the buffered control voltage 2720). Node 2740A supplies control voltage $V_{C(1A)}$. A similar circuit arrangement applies to the other branches in the upper half of embodiment 2700.

Likewise, each of the lower-part branches couples between the output of buffer 2715 and the reference or ground terminal $V_{SS}$. Thus, as an example, in the left-most branch in the lower part of the embodiment 2700, resistor 2735A couples between the output of buffer 2715 (i.e., the node that supplies the buffered control voltage 2720) and one terminal of current source 2730A (i.e., node 2740B). Node 2740B provides control voltage $V_{C(1B)}$. A second terminal of the current source 2730A couples to the reference or ground terminal $V_{SS}$. A similar circuit arrangement applies to the other branches in the lower half of embodiment 2700.

In the embodiment 2700, the current sources 2705A–2705C and current sources 2730A–2730C operate independently of each other. If the control voltage generated by one branch becomes large enough so that its current source ceases to function properly, other current sources remain unaffected. Thus, the embodiment 2700 can supply a relatively large number of control voltages essentially independently of one another.

Figure 28:
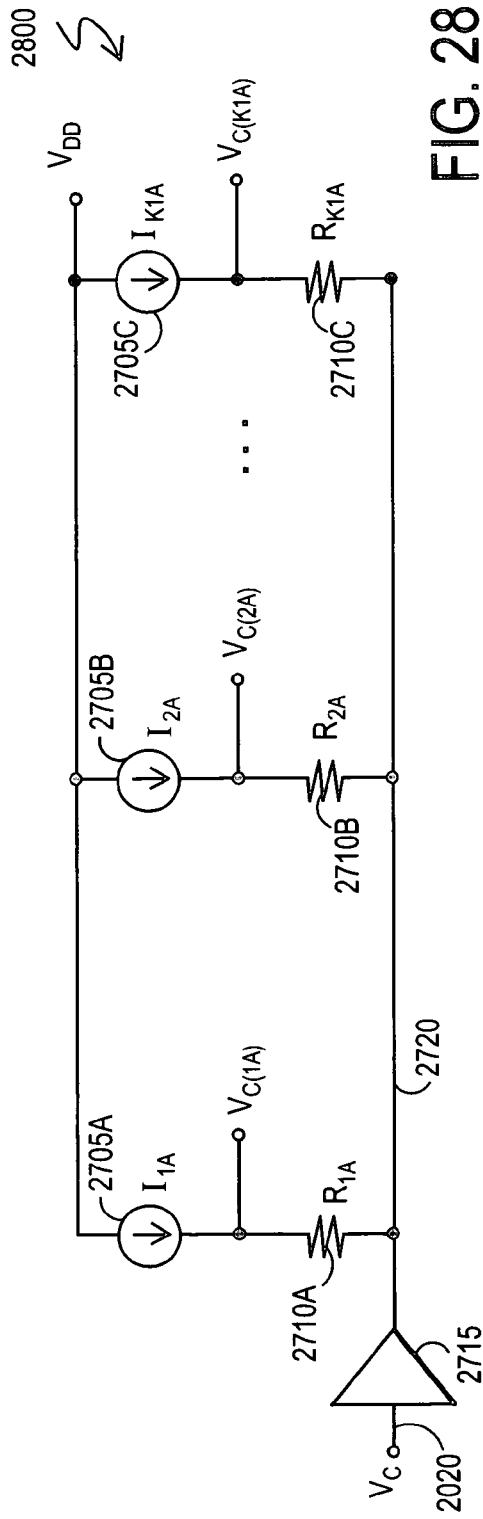
FIG. 28 depicts an additional circuit arrangement for generating control voltages in a multi-stage continuously variable capacitor in an exemplary embodiment according to the invention.
Figure 29:
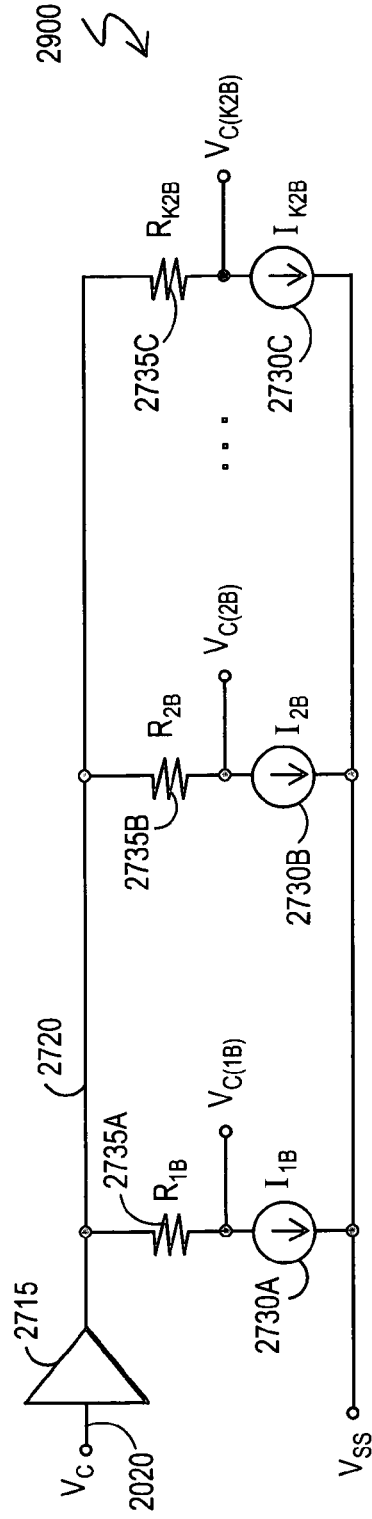
FIG. 29 illustrates another circuit arrangement for generating control voltages in a multi-stage continuously variable capacitor in an exemplary embodiment according to the invention.

Note that embodiment 2700 uses both the upper part and the lower part of the circuit arrangement. Rather than using both halves, however, one may use the upper part or the lower part, as desired. FIG. 28 shows an embodiment 2800 that uses the upper-part circuit arrangement of embodiment 2700 in FIG. 27. In contrast, FIG. 29 illustrates an embodiment 2900 that employs the lower-part circuit arrangement of embodiment 2700. Note that, regardless of which embodiment one uses in a particular implementation, one may use various numbers of branches, as desired. Furthermore, by using appropriate current levels and resistance values, one may provide a wide variety of control voltages. For example, in one embodiment according to the circuit arrangement of FIG. 27, the resistors 2710A–2710C and resistors 2735A–2735C all have approximately the same value, say, R, where R denotes a constant. The current sources 2705A–2705C and current sources 2730A–2730C, on the other hand, provide currents that increase in value from each current source to the next by a prescribed amount, for example, I. In other words, $R_{1A} = R_{2A} = \ldots = R_{K1A} = R,$ $R_{1B} = R_{2B} = \ldots = R_{K2B} = R,$ and $I_{1A} = I,$ $I_{2A} = 2I,$ $\ldots$ $I_{K1A} = K_1 \cdot I,$ and $I_{1B} = I,$ $I_{2B} = 2I,$ $\ldots$ $I_{K2B} = K_2 \cdot I.$ As a further example, in another embodiment, the current sources 2705A–2705C and current sources 2730A–2730C provide approximately the current I, whereas the resistors 2710A–2710C and resistors 2735A–2735C have values that increase in value from each resistor to the next by a prescribed amount, say, R. Put another way, $I_{1A} = I_{2A} = \ldots = I_{K1A} = I,$ $I_{1B} = I_{2B} = \ldots = I_{K2B} = I,$ and $R_{1A} = R,$ $R_{2A} = 2R,$ $\ldots$ $R_{K1A} = K_1 \cdot R,$ and $R_{1B} = R,$ $R_{2B} = 2R,$ $\ldots$ $R_{K2B} = K_2 \cdot R.$ Note that one may apply a similar technique to the selection of current and resistance values in the embodiments 2800 and 2900 of FIGS. 28 and 29, respectively, as desired. Of course, one may use resistance and/or current values in the above embodiments that have other relationships to one another, rather than the examples given above.

One may make other modifications to the inventive concepts described here to realize a wide variety of embodiments according to the invention. For example, rather than a VCO circuitry, one may use a current-controlled oscillator circuitry. In that case, the control signal constitutes a current, rather than a voltage, signal. In other words, the master control signal is a current signal, but the current-controlled oscillator circuitry uses internal control voltages derived from the master control signal.

Figure 30:
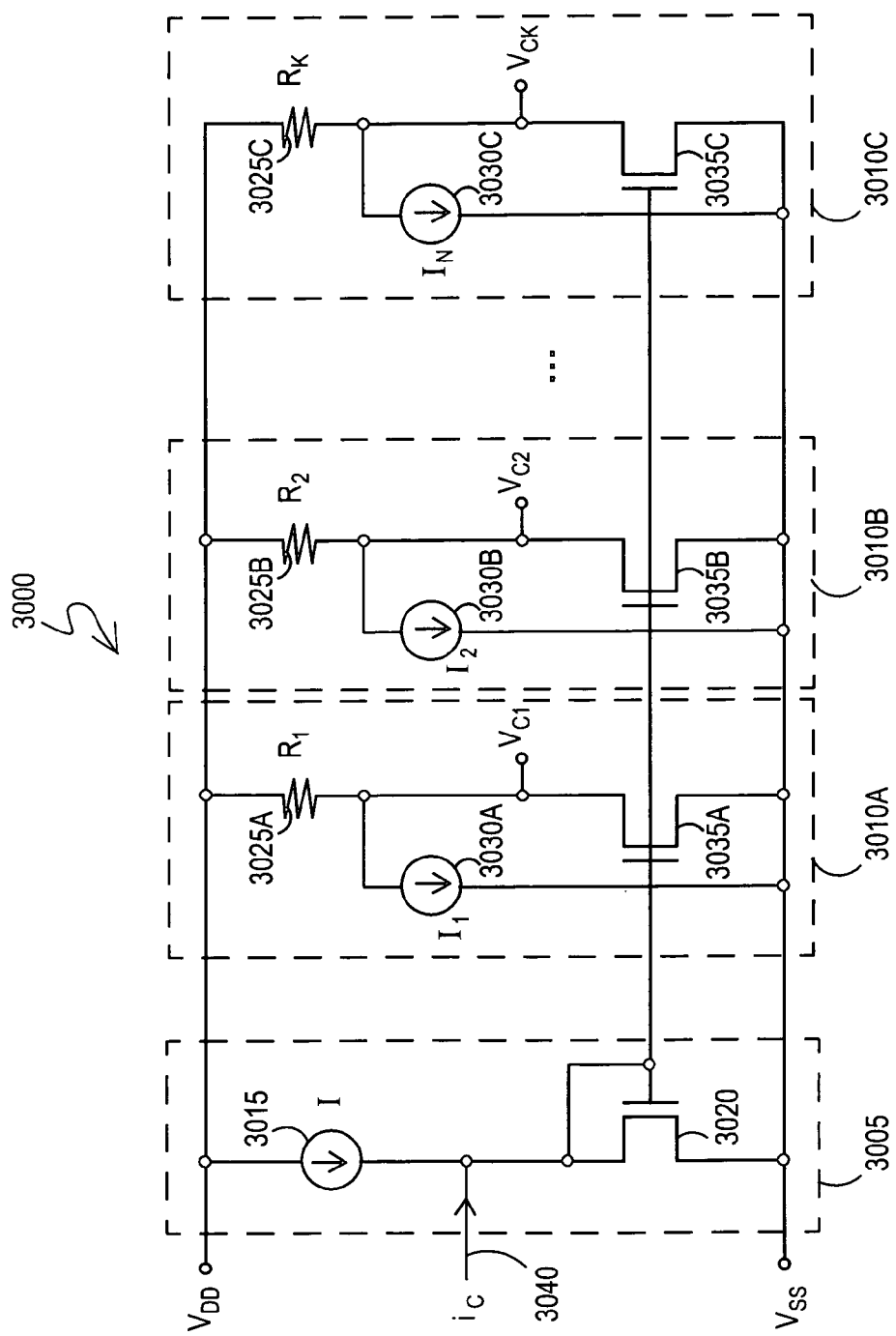
FIG. 30 shows a circuit arrangement for generating multiple control voltages for a current-driven multi-stage continuously variable capacitor according to the invention.

FIG. 30 shows an embodiment 3000 of a circuit arrangement for generating multiple control voltages for a multi-stage continuously variable capacitor from a control current 3040 ($i_c$). The embodiment 3000 includes a current source/mirror transistor 3005 and a plurality of voltage generator cells 3010A–3010C.

Current source/mirror transistor 3005 includes a constant current source 3015, which supplies a current with a value I. Constant current source 3015 couples to the supply voltage $V_{DD}$ and to transistor 3020, and provides its current I to the drain terminal of transistor 3020. Transistor 3020 is a diode-connected transistor, with its gate terminal coupled to its drain terminal. The source terminal of transistor 3020 couples to the reference or ground terminal $V_{SS}$. The control current 3040 ($i_c$) sums with the constant current I so that transistor 3020 conducts the resulting current $i_c + I$.

Each of the voltage generator cells 3010A–3010C includes a resistor, a constant current source, and a transistor. In voltage generator cell 3010A, resistor 3025A ($R_1$) couples to the supply voltage $V_{DD}$ and to the drain terminal of transistor 3035A. The source terminal of transistor 3035A couples to the reference or ground terminal $V_{SS}$. The gate terminal of transistor 3035A couples to the gate terminal of transistor 3020, thus forming a current mirror. Constant current source 3030A couples to the drain terminal of transistor 3035A and to reference or ground terminal $V_{SS}$.

Constant current source 3030A provides a current $I_1$ to the reference or ground terminal $V_{SS}$. The drain terminal of transistor 3035A provides control voltage $V_{C1}$. The flow of current $I_1$ from the drain of transistor 3035A provides the offset voltage for control voltage $V_{C1}$. The other voltage generator cells, e.g., voltage generator cells 3010B–3010C, have a similar structure and operate in a like manner as does voltage generator cell 3010A. Thus, voltage generator cell 3010B includes resistor 3025B ($R_2$), constant current source 3030B ($I_2$), and transistor 3035B, whereas voltage generator cell 3010C employs resistor 3025C ($R_K$), constant current source 3030C ($I_K$), and transistor 3035C.

One may adjust the control voltages and the offset voltages in embodiment 3000 by selecting appropriate values for resistors 3025A–3025C and the width-to-length ratio (W/L) of transistors 3035A–3035C and/or the current that constant current sources 3030A–3030C conduct. Resistors 3025A–3025C and the width-to-length ratio (W/L) of transistors 3035A–3035C vary inversely, but the vary together. In one exemplary embodiment of the invention, resistors 3025A–3025C may have a value, say, R, where R denotes a constant. Current sources 3030A–3030C, on the other hand, provide currents that increase in value from each current source to the next by a prescribed amount, say, I. In other words, $$R_1 = R_2 = \ldots R_K = R,$$

and $$I_1 = I,$$

$$I_2 = 2I,$$

$$\ldots$$

$$I_K = K_1 \cdot I.$$

As another exemplary embodiment, current sources 3030A–3030C may have a value, say, I, where I represents a constant current. In this embodiment, resistors 3025A–3025C, have resistance values that increase by a prescribed amount, say, R. Thus, $$I_1 = I_2 = \ldots = I_K = I.$$

Furthermore, $$R_1 = R,$$

$$R_2 = 2R,$$

$$\ldots$$

$$R_K = K_1 \cdot R,$$

and one scales the transistors 3035A–3035C such that the current-to-voltage gain of the voltage generator cells 3010A–3010C is constant. In other words, $$I_{D1} \cdot R_1 = I_{D2} \cdot R_2 = \ldots = I_{DK} \cdot R_K,$$

where $I_{D1}$ through $I_{DK}$ represent the drain currents of transistors 3035A–3035C, respectively.

Of course, one may use resistance and transistor sizes and/or current values in various embodiments that have other relationships to one another, rather than the examples given above. Furthermore, in addition to setting the values of the resistors 3025A–3025C and/or current sources 3030A–3030C, one may also prescribe the width-to-length ratio (W/L) of transistors 3035A–3035C. More specifically, one may alter the width-to-length ratios of transistors 3035A–3035C with respect to one another and/or with respect to transistor 3020 (also prescribing values for resistors 3025A–3025C and/or current sources 3030A–3030C), as desired, as persons of ordinary skill in the art who have the benefit of the description of the invention understand.

Another inventive concept concerns the provision of a plurality of frequencies via a single integrated VCO circuitry. Ordinarily, in conventional systems, one would provide a VCO circuitry for generating each of the desired frequencies. That arrangement, however, has certain disadvantages, as described above. The present invention contemplates a single integrated VCO circuitry that generates a plurality of desired signals.

Figure 31A:
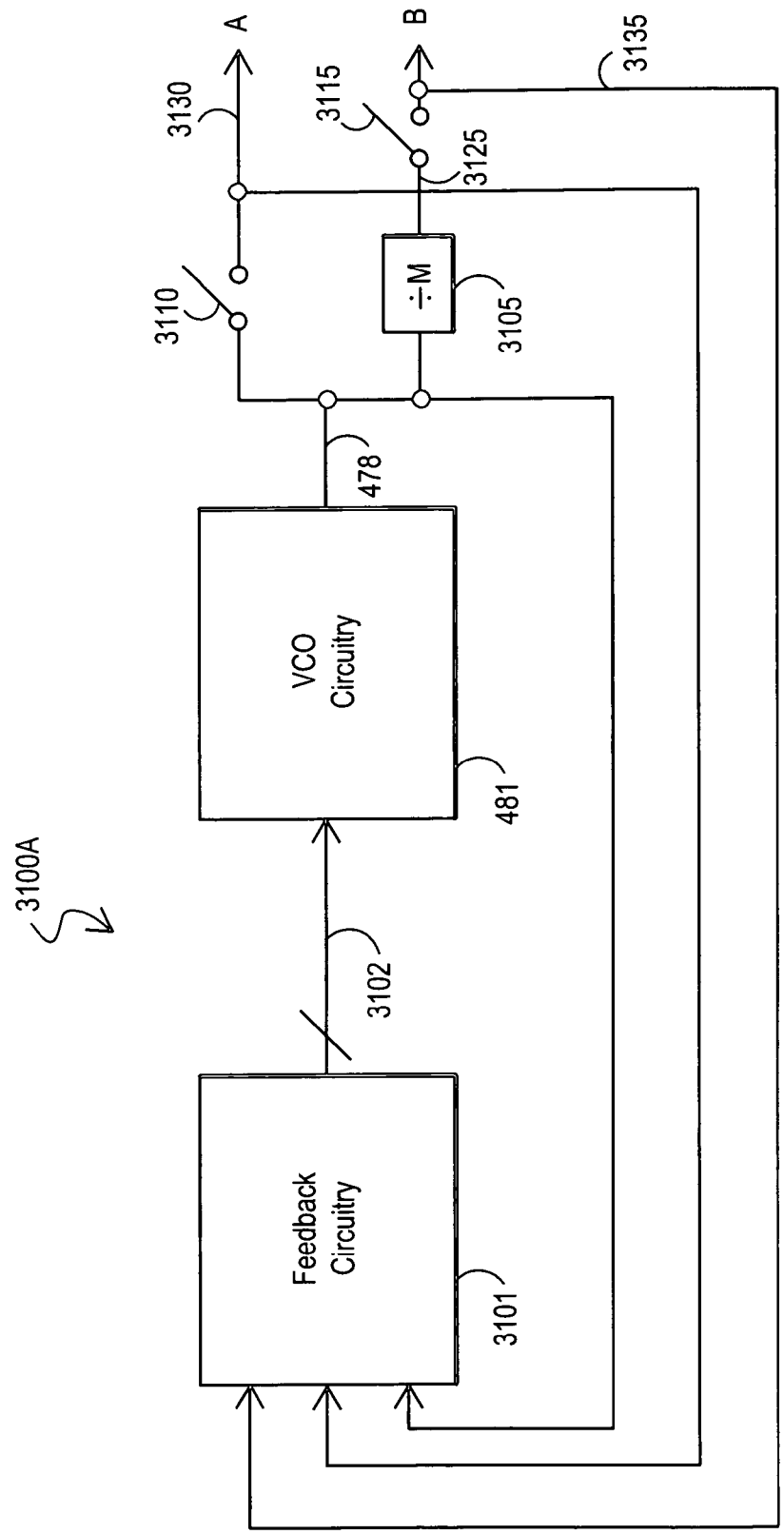
FIG. 31A depicts an exemplary embodiment of a multiple-output RF circuitry according to the invention that uses a single VCO circuitry.

FIG. 31A illustrates an exemplary embodiment 3100A of a multiple-output single-VCO circuit arrangement according to the invention. Embodiment 3100A uses a single VCO circuitry 481 to provide output signals A and B, each having a desired frequency. Thus, a single VCO circuitry 481 provides output signals that allow multi-band or multi-standard operation of RF circuitry that includes the circuit arrangement shown in FIG. 31A. For example, in one exemplary embodiment, output A may provide a signal appropriate for the DCS 1800 standard, whereas output B provides a signal for GSM 900 standard. Furthermore, one may use a single VCO circuitry to provide more than two outputs or outputs having other frequencies, as desired.

The embodiment 3100A includes VCO circuitry 481 and feedback circuitry 3101. Feedback circuitry 3101 provides feedback signals 3102 to the VCO circuitry 481. The feedback signal 3102 may constitute a variety of signals that control various aspects of the operation of the VCO circuitry 481. Embodiment 3100A further includes switch 3110, switch 3115, and divider circuitry 3105. Switch 3110 receives output signal 478 of the VCO circuitry 481, and provides switched output signal 3130 as output signal A of embodiment 3100A. Divider circuitry 3105 also receives output signal 478 of the VCO circuitry 481 and divides the frequency of output signal 478 to generate a divided signal 3125. Generally, divider circuitry 3105 divides the frequency of its input signal by M, where M may constitute a number. Switch 3115 receives the divided signal 3125, and provides switched output signal 3135 as output signal B of the embodiment 3100A.

Output A has the same frequency as output signal 478 of VCO circuitry 481, whereas the frequency of output signal B differs from the frequency of output signal 478 by a factor M. In other words, $$\omega_A = \omega_O, \quad \text{(Eq. 5A)}$$

and $$\omega_B = \frac{\omega_O}{M}, \quad \text{(Eq. 5B)}$$

where $\omega_O$ denotes the frequency of VCO output signal 478. By selecting various values of M, one may control the relationship between the frequencies of output signals A and B. By controlling switches 3110 and 3115, one may selectively provide switched output signals 3130 and 3135 (i.e., output signals A and B, respectively), as desired. For example, by closing switch 3110 and opening switch 3115, one may activate output signal 3130 (output A) and deactivate output signal 3135 (output B). Feedback circuitry 3101 receives output signal 478 of the VCO circuitry 481, switched output signal 3130, and switched output signal 3135. Activating switches 3110 and 3115 therefore also activates the feedback signals (e.g., switched output signals 3130 and 3135) that the feedback circuitry 3101 receives. Feedback circuitry 3101 uses the activated feedback signal to generate feedback signals 3102, which control the frequency of the output signal 478 of the VCO circuitry 481, as noted above.

One may control the operation of switch 3110 and switch 3115 in a variety of ways, as desired. For example, one may use control signals derived from prescribed choices received from a user. Baseband processor circuitry 120 (not shown explicitly in FIG. 31A) may receive the user's choices and provide appropriate control signals that ultimately result in controlling the state of switch 3110 and switch 3115. Furthermore, although embodiment 3100A shows two switches 3110 and 3115 and one divider circuitry 3105, one may use other numbers of switches and divider circuitries, as desired.

By providing appropriate numbers of switches and divider circuitries (or, generally, scaling circuitries whose output frequency may be higher or lower than their input frequency, as desired), one may provide a desired number of output signals, as persons of ordinary skill in the art who have the benefit of the description of the invention understand. For example, one may use a divider or scaling circuitry for each output signal, rather than directly supplying the output signal 478 of the VCO circuitry 481 as an output signal. Using such a circuit arrangement, one may provide output signals that have respective frequencies lower or higher than the frequency of the output signal 478 of the VCO circuitry 481, as desired. Similarly, one may use cascaded divider or scaling circuitries, as desired.

Furthermore, by controlling the division factor, M, for each divider circuitry, one may provide a plurality of output signals whose frequencies have prescribed relations to one another, as desired. One may also provide the additional output signals to feedback circuitry 3101, as desired. For example, one may use a switch that selects an output signal among the plurality of output signals and provides the selected output signal to feedback circuitry 3101. Also, rather than using feedback circuitry 3101 that uses a selected output signal from the plurality of output signals, one may use a feedback circuitry that uses more than one output signal in its operation, as desired.

As noted above, embodiment 3100A uses a single VCO circuitry 481 to provide a plurality of output signals with various frequencies. One may incorporate embodiment 3100A, including VCO circuitry 481, into a single partition or integrated circuit, such as partitions or circuit blocks 214, 407, 505, 610, 710, or 801 in FIGS. 2, 4, 5, 6, 7, and 8, respectively. As another embodiment, one may include other blocks of circuitry in the partition or integrated circuit, as desired. For example, one may include up-conversion circuitry, offset PLL circuitry, output buffer circuitry, and the like. The exact nature and type of circuitry depends on the type of transmit-path circuitry, as persons of ordinary skill in the art who have the benefit of the description of the invention understand.

Figure 31B:
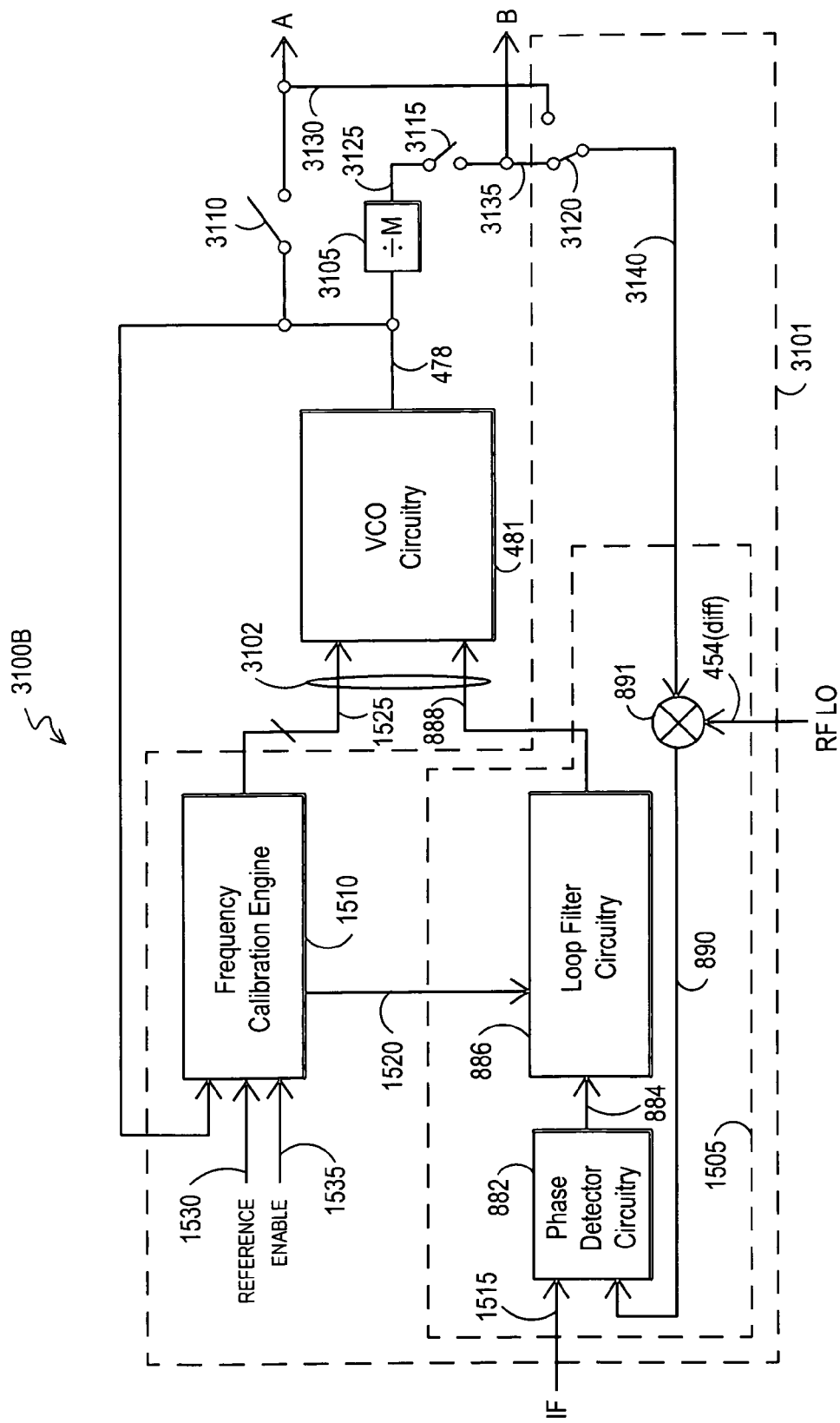
FIG. 31B illustrates another exemplary embodiment of a multiple-output single-VCO circuit arrangement according to the invention.

FIG. 31B shows another exemplary embodiment 3100B of a multiple-output single-VCO circuit arrangement according to the invention. Like embodiment 3100A in FIG. 31A, embodiment 3100B includes VCO circuitry 481, feedback circuitry 3101 (enclosed in dashed lines), switch 3110, divider circuitry 3105 (or, generally, scaling circuitry, as described above), and switch 3115. Generally, embodiment 3100B operates similarly to embodiment 3100A of FIG. 31A.

Referring to FIG. 31B, feedback circuitry 3101 may in part constitute the embodiment 1500 in FIG. 15 (except VCO circuitry 481). Thus, feedback circuitry 3101 includes frequency calibration circuitry 1510 and offset PLL circuitry 1505, where the offset PLL circuitry 1505 in turn includes offset mixer circuitry 891, phase detector circuitry 882, and loop filter circuitry 886. The various blocks of circuitry in feedback circuitry 3101 operate in a manner similar to embodiment 1500. Feedback circuitry 3101 also includes switch 3120. Switch 3120 constitutes a single-pole, double-throw switch that can select between switched output signal 3130 (output signal A) and switched output signal 3135 (output signal B), and provide a selected switched signal 3140. Accordingly, one input to the offset mixer circuitry 891 may constitute either switched output signal 3130 (output signal A) and switched output signal 3135 (output signal B), depending on the state of switch 3120. Another input to offset mixer circuitry 891 constitutes the RF LO signal 454.

Feedback circuitry 3101 provides feedback signals 3102 to VCO circuitry 481. Feedback signals 3102 include filtered offset PLL signal 888 and calibration signal 1525. VCO circuitry 481 uses feedback signals 3102 to provide output signals with desired frequencies, as described above. In exemplary embodiments, the VCO circuitry 481 has a two-phase calibration cycle that feedback signals 3102 control. Note that, because of the flexibility of the inventive concepts, one may modify the embodiment 3100B in a variety of ways, including in the manner described above in connection with FIG. 31A (e.g., providing more than two outputs, using more than one divider circuitry 3105 (or scaling circuitry, as desired), and the like).

Figure 32:
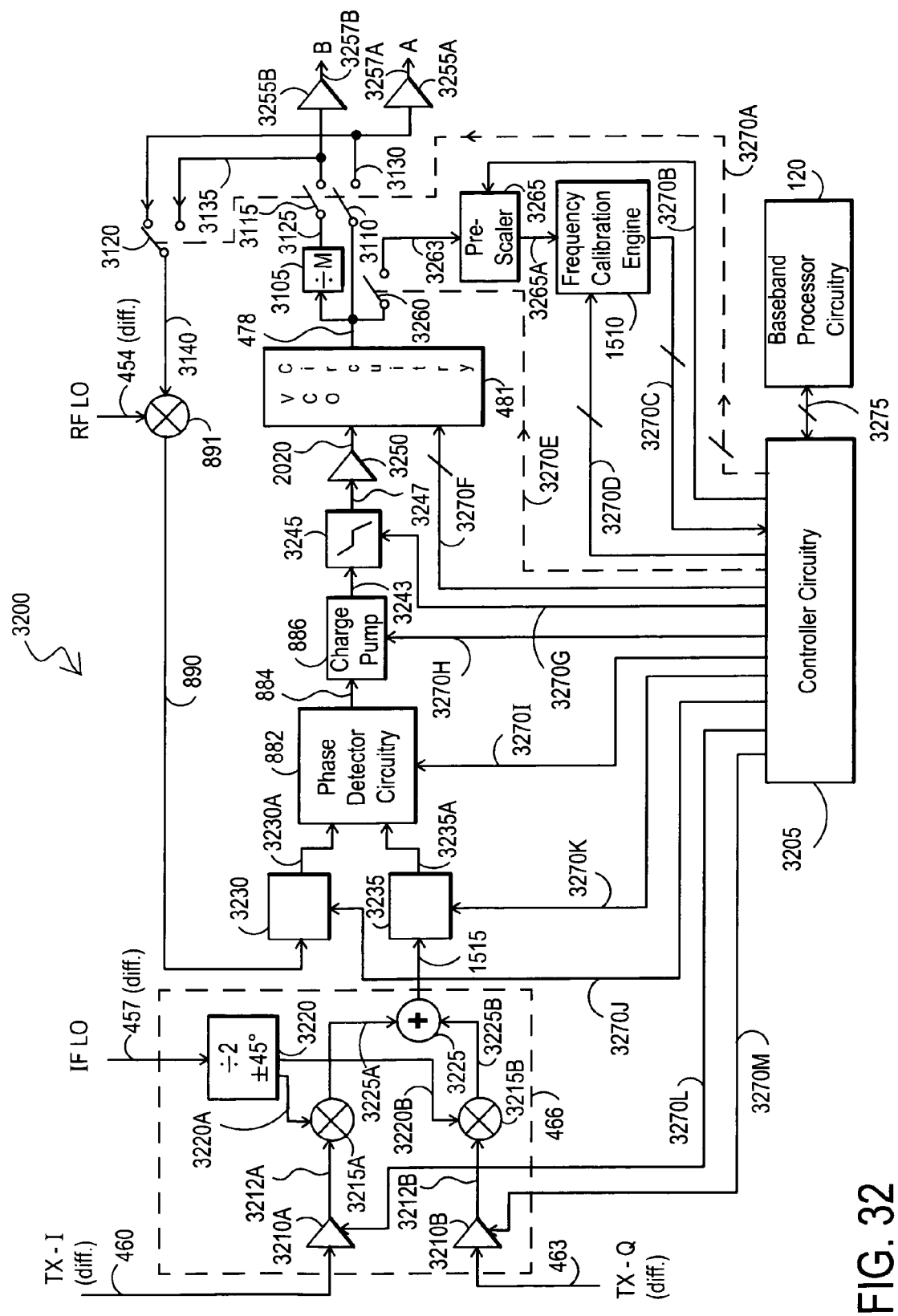
FIG. 32 shows an exemplary embodiment according to the invention for use in a transmitter circuitry.

FIG. 32 illustrates another exemplary embodiment 3200 according to the invention for use in a transmitter circuitry. Embodiment 3200 includes up-converter circuitry 466, feedback filter circuitry 3230, IF filter circuitry 3235, phase detector circuitry 882, charge pump circuitry 3240, loop filter circuitry 886, buffer circuitry 3250, VCO circuitry 481, offset mixer circuitry 891, divider circuitry 3105 (or, generally, scaling circuitry, as described above), switch 3110, switch 3115, output buffer circuitries 3255A–3255B, switch 3120, switch 3260, prescaler circuitry 3265, frequency calibration engine 1510, controller circuitry 3205, and baseband processor circuitry 120 or other circuitry to facilitate control of the operation of embodiment 3200 and/or provide analog in-phase transmit input signal 460 and analog quadrature transmit input signal 463.

The controller circuitry 3205 communicates with the baseband processor circuitry 120 via interface 3275. Interface 3275 may include a plurality of signals, such as data and control signals. Through interface 3275, baseband processor circuitry 120 may provide commands and data to the controller circuitry 3205. In exemplary embodiments, controller circuitry 3205 includes a plurality of registers that store values, such as control parameters, for various components and blocks in embodiment 3200. Controller circuitry 3205 uses the values in the registers to control the functionality and operation of those blocks via a set of signal lines 3270A–3270M. Through interface 3275, controller circuitry 3205 may provide status information and/or data to baseband processor circuitry 120.

In exemplary embodiments, controller circuitry 3205 and various other blocks of circuitry in embodiment 3200 use a reference or clock signal (not shown explicitly in FIG. 32). The reference or clock signal may constitute any suitable signal, such as switched reference signal 494. The choice of the clock or reference signal and its attributes (e.g., its frequency) depends on the design and performance specifications in a given implementation, as persons of ordinary skill in the art who have the benefit of the description of the invention understand.

Baseband up-converter circuitry 466 includes in-phase input amplifier 3210A, quadrature input amplifier 3210B, in-phase mixer circuitry 3215A, quadrature mixer circuitry 3215B, combiner circuitry 3225, and divider/shifter circuitry 3220. Divider/shifter circuitry 3220 receives IF LO signal 457, and shifts it by ±45° (i.e., ±π/4 radians) to generate in-phase IF LO signal 3220A and quadrature IF LO signal 3220B, respectively. Note that, rather than shifting by ±45°, one may use the original IF LO signal 457 and a version of it by shifting the IF LO signal 457 by 90° (i.e., π/2 radians), as desired. In exemplary embodiments, depending on the frequency of the IF LO signal 457, the divider/shifter circuitry 3220 may optionally divide by two the frequency of IF LO signal 457 before the shift operation. Note that, rather than dividing by two, one may provide a divider/ shifter circuitry 3220 that divides the frequency of the IF LO signal 457 by another number, as desired. The divider/shifter circuitry 3220 provides the in-phase IF LO signal 3220A as one input signal of the in-phase mixer circuitry 3215A. Likewise, the divider/shifter circuitry 3220 supplies the quadrature IF LO signal 3220B as one input of the quadrature mixer circuitry 3215B.

In-phase input amplifier 3210A and quadrature input amplifier 3210B receive analog in-phase transmit input signal 460 and analog quadrature transmit input signal 463, respectively, as input signals. In-phase input amplifier 3210A and quadrature input amplifier 3210B amplify the input signals to generate an amplified analog in-phase transmit signal 3212A and an amplified analog quadrature transmit signal 3212B. In-phase input amplifier 3210A provides the amplified analog in-phase transmit signal as an input to the in-phase mixer circuitry 3215A. Likewise, quadrature input amplifier 3210B supplies the amplified analog quadrature transmit signal 3212B as an input to the quadrature mixer circuitry 3215B. Controller 3205 controls the operation of the in-phase input amplifier 3210A and quadrature input amplifier 3210B via control signal 3270L and control signal 3270M, respectively.

In-phase mixer circuitry 3215A and quadrature mixer circuitry 3215B mix their respective input signals and produce, respectively, a mixed in-phase signal 3225A and a mixed quadrature signal 3225B. Combiner circuitry 3225 adds the mixed in-phase signal 3225A to the mixed quadrature signal 3225B to generate IF signal 1515. Combiner circuitry 3225 provides the IF signal 1515 to IF filter circuitry 3235.

Similar to embodiment 1500 in FIG. 15, the VCO circuitry 481 in embodiment 3200 has two feedback loops around it. The two feedback loops accomplish functions similar to the functions of the feedback loops shown in FIG. 15. Referring to FIG. 32, the first feedback loop includes VCO circuitry 481, switch 3260, prescaler circuitry 3265, frequency calibration engine 1510, and controller circuitry 3205. The second feedback loop includes VCO circuitry 481, the VCO multiple-output circuitry (i.e., switch 3110, switch 3115, switch 3120, and divider circuitry 3105) associated with the VCO circuitry 481, offset mixer circuitry 891, feedback filter circuitry 3230, phase detector circuitry 882, charge-pump circuitry 3240, loop filter circuitry 886, and buffer circuitry 3250.

The VCO circuitry 481 provides transmit VCO output signal 478 to the frequency calibration engine 1510 in the first feedback loop via switch 3260 and prescaler circuitry 3265. The first feedback loop uses the output signal 478 of VCO circuitry 481 during the calibration of VCO circuitry 481, similar to the calibration cycle described above in connection with embodiment 1500 (see FIG. 15), and as described below in more detail. In one embodiment of the invention, the frequency calibration engine 1510 includes a finite-state machine that, in conjunction with the controller circuitry 3205, performs the first phase or stage of the frequency calibration. More specifically, the frequency calibration engine 1510 compares the frequency of the VCO output signal 478 with the prescribed or desired frequency (e.g., as supplied by the reference or clock signal (not shown explicitly in FIG. 32)) and, together with the controller circuitry 3205, operates the first feedback loop so as to minimize the difference between those two values.

In one embodiment, the reference signal 220 (not shown explicitly in FIG. 32) and, hence, the switched reference signal 494 (not shown explicitly in FIG. 32) have a frequency of 13 MHz. A temperature-controlled crystal oscillator provides the 13 MHz signal. The frequency calibration engine 1510 divides that frequency (13 MHz) by 65 and uses the resulting signal as a clock or reference signal. In other words, the frequency calibration engine 1510 uses a reference or clock frequency of 200 kHz. The frequency calibration engine 1510 compares the reference or clock signal with a divided-down version of the VCO output signal 478 obtained via switch 3260 and prescaler circuitry 3265, as described above.

Note that, rather than using the frequency values described above, one may use other frequency values, as desired. Furthermore, one may use other types of circuitry (other than the temperature-controlled crystal oscillator) to provide the reference or clock signal, as desired. The choice of those frequencies and the type of circuitry for providing a reference or clock signal depends on design and performance specifications, as persons of ordinary skill in the art who have the benefit of the description of the invention understand.

Controller circuitry 3205 controls the state of switch 3260 via control signal 3270E. When switch 3260 is in the closed state, it couples output signal 478 of VCO circuitry 481 to prescaler circuitry 3265. Prescaler circuitry 3265 divides the frequency of output signal 478 by a prescribed value a to generate scaled signal 3265A. In other words, $$\omega_p = \frac{\omega_{VCO}}{\alpha},$$

where $\omega_p$, and $\omega_{VCO}$ represent the natural frequency of scaled signal 3265A and the natural frequency of output signal 478 of VCO circuitry 481, respectively. The scalar $\alpha$ may denote a real or integer number, as desired. Using the scaled signal 3265A allows the first feedback circuitry and, in particular, frequency calibration circuitry 1510, to operate at a lower frequency than the frequency of the output signal 478 of VCO circuitry 481. Note, however, that depending on the relative frequencies involved and depending on circuit design and implementation considerations, one may omit the prescaler circuitry 3265, as desired.

The prescaler circuitry 3265 provides the scaled signal 3265A to frequency calibration circuitry 1510. Frequency calibration circuitry 1510 operates in a manner similar to that described above. Frequency calibration circuitry 1510 provides calibration signal 3270C to controller circuitry 3205. Calibration signal 3270C performs a function similar to that of calibration signal 1525 (not shown in FIG. 32). Calibration signal 3270C may constitute a digital word (i.e., a plurality of digital signals), or a single digital signal, depending on the design and implementation of a particular embodiment according to the invention, as desired. Controller circuitry 3205 provides control signal 3270D to frequency-calibration circuitry 1510. Control signal 3270D may include reference signal 1530 (not shown in FIG. 32) and enable signal 1535 (not shown in FIG. 32).

Controller circuitry 3205 provides control signal 3270F to VCO circuitry 481. Control signal 3270F may be a digital word or a single digital signal, depending on the design and implementation of VCO circuitry 481, as desired. VCO circuitry 481 uses control signal 3270F during its calibration process. Controller circuitry 3205 derives the control signal 3270F from calibration signal 3270C under the control of a supervisory circuit, such as baseband processor circuitry 120. For example, controller circuitry 3205 may obtain control signal 3270F by gating calibration signal 3270C in response to commands from baseband processor circuitry 120. In exemplary embodiments, during normal operation, control signal 3270F constitutes the calibration signal 3270C, although the controller circuitry 3205 can bypass the feedback action described above and drive the control signal 3270F with any desired value(s).

Note that, rather than deriving control signal 3270F from calibration signal 3270C and supplying it to VCO circuitry 481, one may directly provide a calibration signal or signal, such as calibration signal 3270C, to VCO circuitry 481, as desired. Using controller circuitry 3205 to derive control signal 3270F from calibration signal 3270C, however, increases the flexibility of embodiment 3200 by allowing supervisory functions through a circuit such as the baseband processor circuitry 120.

The VCO circuitry 481 also provides transmit VCO output signal 478 to the offset mixer circuitry 891 in the second feedback loop via switches 3110, 3115, 3120 and divider circuitry 3105. Switches 3110, 3115, 3120 and divider circuitry 3105 perform functions similar to their counterparts in FIG. 31B, described above. When switch 3110 closes, it provides the output signal 478 of the VCO circuitry 481 as switched output signal 3130. Buffer circuitry 3255A buffers switched output signal 3130 and provides buffered output signal 3257A (output signal A).

Divider circuitry 3105 (or scaling circuitry, as desired) receives output signal 478 of the VCO circuitry 481 and divides the frequency of output signal 478 to generate divided signal 3125. As noted above, generally, divider circuitry 3105 divides the frequency of its input signal by M, where M may constitute a number, as desired (although one may generally use a scaling circuitry, as described above). Switch 3115 receives the divided signal 3125 and provides switched output signal 3135 to buffer circuitry 3255B. Buffer circuitry 3255B buffers switched output signal 3135 and provides output signal 3257B (output signal B). Buffered output signals 3257A–3257B may drive power amplifier circuitries, for example, as shown in FIG. 8. Note that, depending on the nature of the circuitry that outputs A and B drive, one may omit buffer circuitries 3255A–3255B, as desired.

As with embodiments 3100A and 3100B described above, output A has the same frequency as output signal 478 of VCO circuitry 481, whereas the frequency of output signal B differs from the frequency of output signal 478 by a factor M, as Equations 5A–5B provide. Thus, by selecting various values of M, one may control the relation between the frequencies of output signals A and B, as desired. Controller circuitry 3205 controls the state of switches 3110, 3115, and 3120 (i.e., whether they are open or closed). By controlling the state of switches 3110, 3115, and 3120, controller circuitry 3205 may selectively activate buffered output signals 3257A and 3257B (i.e., output signals A and B, respectively), as desired. In a similar manner to embodiment 3100B discussed above, the state of switch 3120 determines which of switched output signals 3130 and 3135 the offset mixer circuitry 891 and, generally, the second feedback loop, receives.

Note that, similar to embodiments 3100A and 3100B described above, although embodiment 3200A shows two switches 3110 and 3115 and one divider circuitry 3105, one may use other numbers of switches and divider circuitries (or scaling circuitries), as desired. For example, by providing appropriate numbers of switches and divider or scaling circuitries, one may generate or provide a desired number of output signals, as persons of ordinary skill in the art who have the benefit of the description of the invention understand. As another example, by controlling the division or scaling factor, M, for each divider circuitry, one may provide a plurality of output signals whose frequencies have prescribed relations to one another, as desired. In another embodiment, one may cascade a number of divider or scaling circuitries and tap the outputs of selected divider or scaling circuitries. Furthermore, one may also provide the additional output signals to the second feedback loop, as desired.

The offset mixer circuitry 891 mixes or multiplies the transmit VCO output signal 478 with the selected switched signal 3140 to generate the mixed signal 890. The offset mixer circuitry 891 provides the mixed signal 890 to feedback filter circuitry 3230. Feedback filter circuitry 3230 performs filtering (e.g., low-pass filtering) of the mixed signal 890 to generate filtered mixed signal 3230A. Similarly, IF filter circuitry 3235 performs filtering (e.g., low-pass filtering) on IF signal 1515 and provides as an output filtered IF signal 3235A. Controller circuitry 3205 controls the operation of feedback filter circuitry 3230 and IF filter circuitry 3235 via control signal 3270J and control signal 3270K, respectively. In an exemplary embodiment, control signal 3270J and control signal 3270K control the characteristics (e.g., bandwidth) of feedback filter circuitry 3230 and IF filter circuitry 3235, respectively.

The phase detector circuitry 882 receives filtered mixed signal 3230A and filtered IF signal 3235A. Depending on the relative phase of the filtered mixed signal 3230A and the filtered IF signal 3235A, the phase detector circuitry 882 provides offset PLL error signal 884 to charge-pump circuitry 3240. A control signal 3270H controls the operation of charge-pump circuitry 3240. Charge-pump circuitry 3240 may have a circuit arrangement as is known to persons of ordinary skill in the art. In response to the offset PLL error signal 884, charge-pump circuitry 3240 generates packets of charge that it supplies to loop filter circuitry 886 as output signal 3243. Loop filter circuitry 886 filters output signal 3243 and generates VCO control signal 3247. Buffer circuitry 3250 buffers VCO control signal 3247 to provide control signal 2020 to VCO circuitry 481. VCO circuitry 481 uses control signal 2020 to fine-tune its output frequency by adjusting the continuously variable capacitor 1710 (not shown explicitly in FIG. 32), as described above in detail. Controller circuitry 3205 controls the operation of loop filter circuitry 886 via a control signal 3270G.

In exemplary embodiments, the continuously variable capacitor 1710 within the VCO circuitry 481 constitutes a multi-element variable capacitor, such as shown in FIG. 25. In one embodiment, the VCO circuitry 481 includes a 16-element continuously variable capacitor 1710. VCO circuitry 481 includes circuitry (for example, as shown and described in connection with FIGS. 26–30) to generate appropriate control signals for each of the elements within the continuously variable capacitor 1710. Note, however, that one may use a single-element continuously variable capacitor 1710, depending on design and implementation considerations, as persons of ordinary skill in the art who have the benefit of the description of the invention understand.

Embodiment 3200 uses a two-phase or two-stage calibration cycle for the VCO 481, which operates similarly to the calibration cycle described above. In exemplary embodiments, the first and second stages in the calibration of the output frequency of the VCO circuitry 481 occur before a transmit burst, for example, a burst according to GSM standards, begins. Note that the user may specify (through the baseband processor circuitry 120) the desired output frequency of VCO circuitry 481 on a burst-by-burst basis such that the VCO circuitry 481 may produce a different output frequency in subsequent bursts. In that manner, the user may change the output frequency of VCO circuitry 481 to a different channel frequency in each burst, as desired.

The first phase of the calibration cycle of VCO circuitry 481 uses the frequency calibration engine 1510 in conjunction with controller circuitry 3205 and calibration signal 3270C, control signal 3270F, and control signal 3270G. During this phase, controller circuitry 3205 uses control signal 3270G to keep VCO control signal 3247 at a relatively constant level (in other words, control signal 3270G serves a similar purpose as does hold signal 1520). More specifically, controller circuitry 3205 uses control signal 3270G to cause loop filter circuitry 886 to hold its output signal (i.e., VCO control signal 3247) at a relatively constant level. As a consequence, the second feedback loop, i.e., the feedback loop that includes the phase detector circuitry 882, the loop filter circuitry 886, the VCO circuitry 481, and the mixer circuitry 891 is inactive and does not perform a feedback function. Put another way, during this phase of the calibration cycle, loop filter circuitry 886 does not cause an adjustment of the capacitance of the continuously variable capacitor 1710.

In exemplary embodiments, the control signal 3270G causes the capacitance of the continuously variable capacitor 1710 (not shown explicitly in FIG. 32) to have a value that falls approximately in the middle of its capacitance range. More specifically, during the first phase of the calibration cycle, the control signal 3270G causes the VCO control signal 3247 to have a relatively constant level. That level of the VCO control signal 3247 in turn causes the capacitance of the continuously variable capacitor 1710 to have a value roughly mid-way between its minimum and maximum values. That value of the capacitance of the continuously variable capacitor 1710 provides approximately equal ranges for adjustment of the capacitance of the continuously variable capacitor 1710 (during the second calibration phase) towards either the minimum value or maximum value of the capacitance.

The VCO circuitry 481 further uses control signal 3270F (derived from calibration signal 3270C) during the first phase of its calibration cycle. Using the control signal 3270F, controller circuitry 3205 coarsely adjusts the frequency of output signal 478 of VCO circuitry 481 to a known, desired, or prescribed frequency. As mentioned above, that frequency may constitute the frequency for a communication channel, for example, a frequency for a GSM channel specified by the user. Control signal 3270F, derived from calibration signal 3270C, controls the discretely variable capacitor 1705 (not shown explicitly in FIG. 32) within VCO circuitry 481. Controller circuitry 3205 coordinates this operation in conjunction with frequency calibration circuitry 1510 by using calibration signal 3270C. Once controller circuitry 3205, acting in conjunction with frequency calibration engine 1510, has finished the coarse adjustment of the output frequency of the VCO circuitry 481, the first phase ends and the second phase of the calibration cycle commences.

In the second phase, controller circuitry 3205 de-asserts the control signal 3270G, and the second feedback loop activates (i.e., performs its feedback action). Subsequently, the second feedback loop and, more particularly, control signal 2020, causes the fine-tuning of the output frequency of VCO circuitry 481. The fine-tuning of the output frequency of VCO circuitry 481 takes place by adjusting the capacitance value of the continuously variable capacitor 1710 (not shown explicitly in FIG. 32), as described above. During this phase, the loop filter circuitry 886 sets the level of control signal 2020 via VCO control signal 3247 and buffer circuitry 3250. Thus, in the second phase, VCO control signal 3247 and, hence, control signal 2020 may vary in order to cause the fine-tuning of the output frequency of the VCO circuitry 481. Put another way, feedback action within the second feedback loop causes VCO control signal 3247 and, consequently, control signal 2020, to vary in such a way as to further adjust or fine-tune the output frequency of the VCO circuitry 481 to a frequency substantially equal to a known, desired, or prescribed frequency.

As noted above, embodiment 3200 uses a single VCO circuitry to provide a plurality of signals with various frequencies. One may incorporate embodiment 3200, including VCO circuitry 481, into a single partition or integrated circuit, such as partitions or circuit blocks 214, 407, 505, 610, 710, or 801 in FIGS. 2, 4, 5, 6, 7, and 8, respectively. As another alternative, one may include embodiment 3200 in an RF transmitter circuitry, which may reside in a single partition or integrated circuit, as desired. The exact nature, type of circuitry, and circuit arrangement of the transmit-path circuitry depends on the type of desired or specified transmission function, as persons of ordinary skill in the art who have the benefit of the description of the invention understand.

One may employ the inventive concepts described here in a variety of RF apparatus, such as apparatus and circuitry suitable for wireless cellular communications. For instance, one may employ the inventive techniques in the RF apparatus described above in connection with partitioning and interfacing concepts. Some examples of the RF apparatus include transceiver circuitries shown in FIGS. 1–2 and 4–8. More particularly, one may incorporate embodiments 1500, 1900A, 3100A, 3100B, and 3200 (and their associated circuitries, as illustrated throughout the figures) in radio circuitry 110 in FIG. 1, in transmitter circuitry 216 in FIG. 2, in transmitter circuitry 465 in FIGS. 4–7, or transmitter circuitry 877 in FIG. 8, as desired.

Note that one may have to modify embodiments 1500, 1900A, 3100A, 3100B, and 3200 in order to incorporate them in a given radio circuitry. For example, to incorporate embodiment 3200 into transmitter circuitry 877 in FIG. 8, one would replace the circuitry within transmitter circuitry 877 with the circuitry within embodiment 3200. One would further provide a clock or reference signal to the circuitry within embodiment 3200 and couple the transmitter circuitry 877 to the baseband processor circuitry 120 via a suitable interface 3275. These modifications and other modifications not described in detail here fall within the knowledge of persons of ordinary skill in the art who have read the description of the invention.

Figure 33:
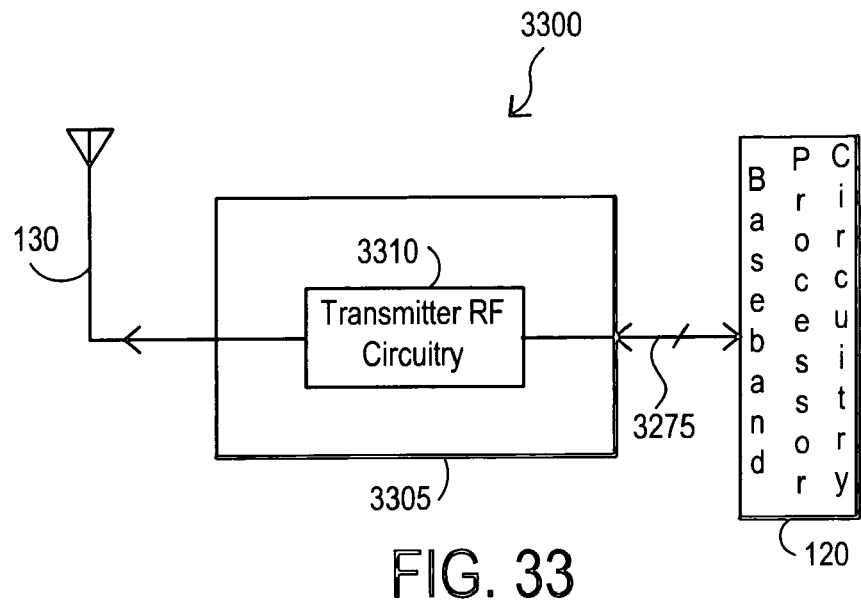
FIG. 33 depicts an embodiment according to the invention of an RF transmitter circuitry.
Figure 34:
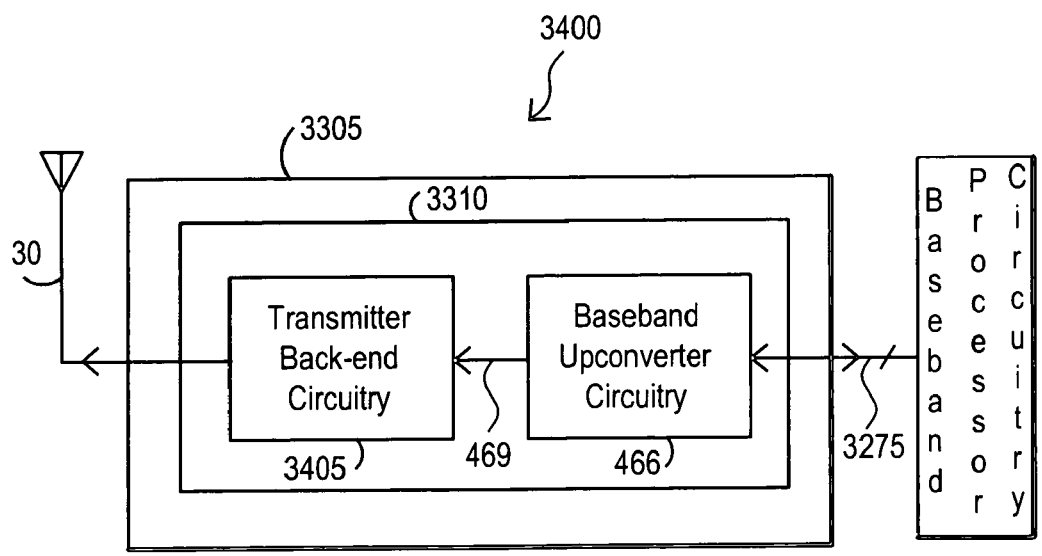
FIG. 34 illustrates an additional embodiment according to the invention of an RF transmitter circuitry.
Figure 35:
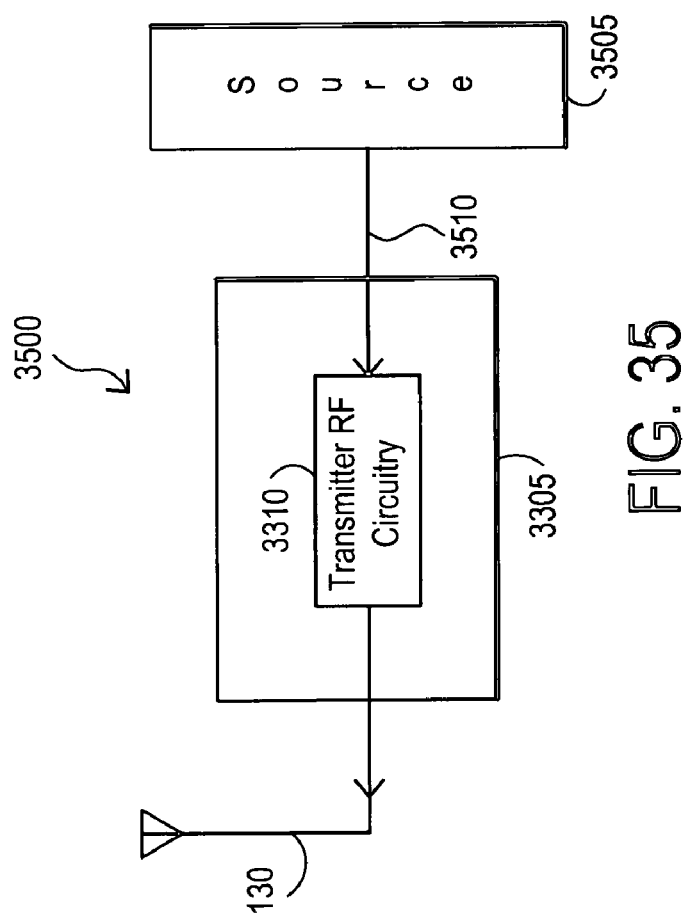
FIG. 35 shows another embodiment according to the invention of an RF transmitter circuitry.

Furthermore, one may incorporate the inventive concepts described here in a variety of RF transmitter apparatus, as desired. FIGS. 33–35 illustrate some examples of such apparatus. FIG. 33 depicts an embodiment 3300 according to the invention of an RF transmitter circuitry. The embodiment 3300 includes transmitter circuitry 3305, baseband processor circuitry 120, and antenna 130. Transmitter circuitry 3305 includes transmitter RF circuitry 3310. Baseband processor circuitry 120 communicates with transmitter circuitry 3305 via interface 3275. Through interface 3275, baseband processor circuitry 120 may provide data, command, and status signals to transmitter circuitry 3305. Also through interface 3275, transmitter circuitry 3305 may supply status or other information to baseband processor circuitry 120.

Transmitter RF circuitry 3310 may include any of the embodiments 1500, 1900A, 3100A, 3100B, and 3200, as desired. Transmitter RF circuitry 3310 may also contain other circuitry, depending on which embodiment one includes within transmitter RF circuitry 3310. As an example, if one includes embodiment 1500 within transmitter RF circuitry 3310, one may also include a suitable up-converter circuitry, as persons of ordinary skill in the art who have the benefit of the description of the invention understand.

Transmitter RF circuitry 3310 may also include other circuitry not explicitly shown in FIG. 33, for example, RF filter circuitry, antenna filter circuitry, and the like. Transmitter RF circuitry 3310 accepts data signals from baseband processor circuitry 120 through interface 3275 and modulates RF signals with the data signals to generate modulated RF signals. Transmitter RF circuitry 3310 provides the modulated RF signals to antenna 130. Antenna 130 propagates the modulated RF signals.

FIG. 34 illustrates an embodiment 3400 according to the invention of another RF transmitter circuitry. The embodiment 3400 includes transmitter circuitry 3305, baseband processor circuitry 120, and antenna 130. Transmitter circuitry 3305 includes transmitter RF circuitry 3310. Baseband processor circuitry 120 communicates with transmitter circuitry 3305 via interface 3275. Through interface 3275, baseband processor circuitry 120 may provide data, command, and status signals to transmitter circuitry 3305, whereas transmitter circuitry 3305 may supply status or other information to baseband processor circuitry 120.

Transmitter RF circuitry 3310 includes baseband up-converter circuitry 466 and transmitter back-end circuitry 3405. Transmitter RF circuitry 3310 may include other circuitry not explicitly shown in FIG. 34, such as RF filter circuitry, antenna filter circuitry, and the like. Transmitter RF circuitry 3310 accepts data signals from baseband processor circuitry 120 through interface 3275 and modulates RF signals to generate modulated RF signals. Baseband up-converter circuitry 466 mixes the data signals from the baseband processor circuitry 120 with an IF signal to generate up-converted IF signal 469, as described above in detail.

Transmitter back-end circuitry 3405 may include any of the embodiments 1500, 1900A, 3100A, and 3100B, as desired. Transmitter RF circuitry 3310 may also contain other circuitry, depending on which embodiment one includes within it. Transmitter back-end circuitry 3405 receives the up-converted IF signal 469 and uses an offset PLL (not shown explicitly in FIG. 34) and VCO circuitry (not shown explicitly in FIG. 34) to generate RF signals for transmission. Transmitter RF circuitry 3310 provides those RF signals to antenna 130. Antenna 130 propagates the RF signals.

FIG. 35 illustrates another embodiment 3500 according to the invention of an RF transmitter circuitry. The embodiment 3500 includes transmitter circuitry 3305, source 3505, and antenna 130. Transmitter circuitry 3305 includes transmitter RF circuitry 3310. Source 3505 communicates with transmitter circuitry 3305 via interface 3510. Source 3505 denotes any source of intelligence or message, such as voice, data, video, audio, images, text, and the like, as desired. Source 3505 may provide one or more intelligence signals to transmitter circuitry 3305 via interface 3510. The intelligence signal or signals may have an analog or digital format, as desired. The message or intelligence information or data may constitute a variety of signals, such as voice, audio, music, video, images, and the like, as desired. Note that, depending on the format, one may use interfacing and conversion circuitry, such as digital-to-analog converters, as persons of ordinary skill in the art who have the benefit of the description of the invention understand.

Transmitter RF circuitry 3310 may include any of the embodiments 1500, 1900A, 3100A, 3100B, and 3200, as desired. Transmitter RF circuitry 3310 may also contain other circuitry, depending on which embodiment one includes within transmitter RF circuitry 3310. Note that transmitter RF circuitry 3310 may also include other circuitry not explicitly shown in FIG. 35, for example, RF filter circuitry, antenna filter circuitry, and the like. Transmitter RF circuitry 3310 accepts intelligence signals from source 3505 through interface 3510 and modulates RF signals with the intelligence signals to generate modulated RF signals. Transmitter RF circuitry 3310 provides the modulated RF signals to antenna 130, which propagates those signals.

Note that, rather than or in addition to using the embodiments provided here, one may use many other embodiments of the various circuit blocks and arrangement of circuitry. As persons of ordinary skill in the art who have the benefit of the description of the invention understand, one may use a variety of implementations of the invention, depending on factors such as design and performance specifications. More particularly, one may implement the VCO circuitry 481, the discretely variable capacitor 1705, the continuously variable capacitor 1710, and other elements and blocks of circuitry relating to the inventive concepts in a variety of ways. U.S. patent application Ser. No. 09/708,339, mentioned above, provides additional embodiments and further details.

Referring to the figures, for example, FIGS. 15–17, 19, and 31–35, the various blocks shown depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and specifications for a given implementation, as persons of ordinary skill in the art who have the benefit of the description of the invention understand.

Further modifications and alternative embodiments of the invention will be apparent to persons skilled in the art in view of the description of the invention. Accordingly, this description teaches persons of ordinary skill in the art the manner of carrying out the invention and the embodiments described are to be construed as illustrative only.

The forms of the invention shown and described should be taken as exemplary embodiments. Persons of ordinary skill in the art may make various changes in the shape, size and arrangement of parts without departing from the scope of the invention described in this document. For example, persons skilled in the art may substitute equivalent elements for the elements illustrated and described here. Moreover, persons of ordinary skill in the art who have the benefit of the description of the invention may use certain features of the invention independently of the use of other features, without departing from the scope of the invention.

We claim:

1. A radio-frequency (RF) apparatus capable of transmitting radio-frequency signals, the radio-frequency apparatus comprising:
   transmitter path circuitry, including:
   a voltage-controlled oscillator circuitry configured to generate a first signal that has a first frequency;

a divider circuitry being responsive to the first signal, the divider circuitry configured to generate a second signal that has a second frequency,
wherein the second frequency equals the first frequency divided by a number;
a first switch coupled to the voltage-controlled oscillator circuitry, the first switch configured to generate a switched first signal by selectively supplying the first signal to a first output;
a second switch coupled to the divider circuitry, the second switch configured to generate a switched second signal by selectively supplying the second signal to a second output; and
a feedback circuitry coupled to the voltage-controlled oscillator circuitry, the feedback circuitry configured to adjust the first frequency in response to a feedback signal derived from the switched first and second signals, and wherein the feedback circuitry comprises a third switch coupled to the first and second switches, the third switch configured to selectively supply as the feedback signal one of the switched first and second signals.

2. The radio-frequency (RF) apparatus according to claim 1, wherein the transmitter path circuitry is configured to use the switched first and second signals for multi-band radio-frequency transmission.

3. The radio-frequency (RF) apparatus according to claim 2, further configured to transmit within the DCS 1800 standard.

4. The radio-frequency (RF) apparatus according to claim 2, further configured to transmit within the GSM 900 standard.

5. An integrated circuit, comprising:
a controlled oscillator configured to generate an oscillator output signal with an adjustable frequency;
a feedback circuit coupled to the controlled oscillator, the feedback circuit configured to receive the oscillator output signal, the feedback circuit further configured to adjust the frequency of the oscillator output signal;
a frequency converter coupled to the controlled oscillator, the frequency converter configured to generate a converter output signal at a frequency that is derived from the frequency of the oscillator output signal;
a first switch coupled to the controlled oscillator, the first switch configured to selectively provide the oscillator output signal as a first output signal;
a second switch coupled to the frequency converter, the second switch configured to selectively provide the converter output signal as a second output signal, wherein the frequency of the converter output signal equals a fraction of the frequency of the oscillator output signal; and
a feedback circuit comprising a third switch coupled to the first and second switches, the third switch configured to selectively supply as a feedback signal one of the first and second output signals.

6. The integrated circuit according to claim 5, wherein the feedback circuit further comprises a first feedback circuit and a second feedback circuit.

7. The integrated circuit according to claim 6, wherein the first feedback circuit is configured to coarsely adjust the frequency of the oscillator output signal.

8. The integrated circuit according to claim 7, wherein the second feedback circuit is configured to fine tune the frequency of the oscillator output signal.

9. The integrated circuit according to claim 8, wherein the second feedback circuit is further configured to fine tune the frequency of the oscillator output signal in response to the feedback signal.

10. The integrated circuit according to claim 9, wherein the first feedback circuit is further configured to coarsely adjust the frequency of the oscillator output signal in response to a reference signal.

11. The integrated circuit according to claim 10, wherein the second feedback circuit is further configured to fine tune the frequency of the oscillator output signal in response to a radio-frequency local oscillator signal and an intermediate-frequency signal.

12. The integrated circuit according to claim 11, further comprising receiver circuitry configured to receive a radio-frequency input signal.

13. The integrated circuit according to claim 12, wherein the receiver circuitry couples to signal processing circuitry within a second integrated circuit.

14. The integrated circuit according to claim 13, wherein the receiver circuitry comprises low intermediate-frequency receiver circuitry.

* * * * *